(12) United States Patent
Ise et al.

(10) Patent No.: US 7,947,383 B2
(45) Date of Patent: May 24, 2011

(54) ORGANIC ELECTROLUMINESCENT DEVICE

(75) Inventors: Toshihiro Ise, Minami-ashigara (JP);
Seiji Ichijima, Minami-ashigara (JP);
Takeshi Murakami, Minami-ashigara (JP); Satoshi Sano, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 1038 days.

(21) Appl. No.: 11/663,164

(22) PCT Filed: Sep. 20, 2005

(86) PCT No.: PCT/JP2005/017660
§ 371 (c)(1),
(2), (4) Date: Mar. 19, 2007

(87) PCT Pub. No.: WO2006/033440
PCT Pub. Date: Mar. 30, 2006

(65) Prior Publication Data
US 2008/0001530 A1  Jan. 3, 2008

(30) Foreign Application Priority Data

Sep. 22, 2004  (JP) .................................. 2004-275915
Feb. 18, 2005  (JP) .................................. 2005-041939
Jun. 2, 2005   (JP) .................................. 2005-162376

(51) Int. Cl.
H01L 51/54    (2006.01)
C09K 11/06    (2006.01)

(52) U.S. Cl. ........ 428/690; 428/917; 313/504; 313/506; 257/E51.044

(58) Field of Classification Search .................. None
See application file for complete search history.

(56) References Cited

U.S. PATENT DOCUMENTS

| 6,303,231 | B1 | 10/2001 | Sawada et al. | |
|---|---|---|---|---|
| 6,303,238 | B1 | 10/2001 | Thompson et al. | |
| 6,653,654 | B1 | 11/2003 | Che | |
| 7,566,505 | B2 * | 7/2009 | Ise et al. ........................ | 428/690 |
| 7,569,692 | B2 | 8/2009 | Nii et al. | |
| 7,579,093 | B2 * | 8/2009 | Sano et al. ..................... | 428/690 |
| 2002/0008233 | A1 | 1/2002 | Forrest et al. | |
| 2002/0013306 | A1 | 1/2002 | Lowe | |
| 2002/0068190 | A1 | 6/2002 | Tsuboyama et al. | |
| 2003/0203236 | A1 | 10/2003 | Thompson et al. | |
| 2003/0205707 | A1 | 11/2003 | Chi-Ming | |
| 2005/0170209 | A1 | 8/2005 | Lee et al. | |
| 2006/0073359 | A1 | 4/2006 | Ise et al. | |
| 2006/0134460 | A1 | 6/2006 | Kondakova et al. | |
| 2006/0134461 | A1 * | 6/2006 | Huo et al. ..................... | 428/690 |
| 2006/0182992 | A1 | 8/2006 | Nii et al. | |
| 2006/0264625 | A1 | 11/2006 | Nakayama et al. | |
| 2006/0286406 | A1 | 12/2006 | Igarashi et al. | |
| 2007/0082284 | A1 | 4/2007 | Stoessel et al. | |
| 2007/0103060 | A1 | 5/2007 | Itoh et al. | |
| 2008/0001530 | A1 | 1/2008 | Ise et al. | |
| 2008/0036373 | A1 | 2/2008 | Itoh et al. | |
| 2009/0128008 | A1 | 5/2009 | Ise et al. | |

FOREIGN PATENT DOCUMENTS

| EP | 0 969 532 | A2 | 1/2000 |
|---|---|---|---|
| JP | 5-9470 | A | 1/1993 |
| JP | 2000-048960 | A | 2/2000 |
| JP | 2000-503982 | A | 4/2000 |
| JP | 2001-338768 | A | 12/2001 |
| JP | 2002-175884 | A | 6/2002 |
| JP | 2002-305083 | A | 10/2002 |
| JP | 2002-363552 | A | 12/2002 |
| JP | 2003-123976 | A | 4/2003 |
| JP | 2003-123981 | A | 4/2003 |
| JP | 2003-520391 | A | 7/2003 |
| JP | 2004-331508 | A | 11/2004 |
| JP | 2005-220136 | A | 8/2005 |
| JP | 2005-310733 | A | 11/2005 |
| JP | 2006-093542 | A | 4/2006 |
| JP | 2006-120811 | A | 5/2006 |
| JP | 2006-190718 | | 7/2006 |

(Continued)

OTHER PUBLICATIONS

Japanese Office Action and Translation issued on Nov. 17, 2009 in corresponding Japanese Patent Application No. 2005-162376.
Yip J H K et al., Inorganic Chemistry, American Chemical Society, vol. 39, 2000, pp. 3537-3543 XP002324504.
Fritsky et al., Angewandte Chemie, International Edition, vol. 39, No. 18, p. 3255-3258 (2000).

(Continued)

*Primary Examiner* — Marie R. Yamnitzky
(74) *Attorney, Agent, or Firm* — Birch, Stewart, Kolasch & Birch, LLP

(57) ABSTRACT

An organic electroluminescent device having a pair of electrodes and at least one organic layer including a light-emitting layer interposed between the pair of electrodes, in which the organic layer contains at least one compound represented by formula (I):

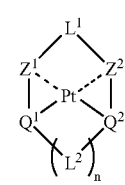

Formula (I)

wherein $Z^1$ and $Z^2$ each independently represent a nitrogen-containing heterocycle coordinated with the platinum through a nitrogen atom; $Q^1$ and $Q^2$ each independently represent a group bonded with the platinum through a carbon atom, an oxygen atom, a sulfur atom, a nitrogen atom or a phosphorous atom; $Q^1$ and $Q^2$ each represent a structure different from each other; $L^1$ and $L^2$ each independently represent a single bond or a linking group; and n represents 0 or 1.

11 Claims, No Drawings

FOREIGN PATENT DOCUMENTS

| | | |
|---|---|---|
| JP | 2006-256999 A | 9/2006 |
| JP | 2006-261623 A | 9/2006 |
| JP | 2006-332620 A | 12/2006 |
| JP | 2007-019462 A | 1/2007 |
| JP | 2007-073845 A | 3/2007 |
| JP | 2007-519614 A | 7/2007 |
| JP | 2008-037848 A | 2/2008 |
| JP | 4110173 | 4/2008 |
| JP | 2008-103535 A | 5/2008 |
| JP | 2008-524848 A | 7/2008 |
| KR | 10-2006-0115371 A | 11/2006 |
| WO | WO-00/57676 A1 | 9/2000 |
| WO | WO-03/093283 A1 | 11/2003 |
| WO | WO-2004/039914 A1 | 5/2004 |
| WO | WO-2004/108857 A1 | 12/2004 |
| WO | WO-2005/042444 A1 | 5/2005 |

OTHER PUBLICATIONS

Newkome et al., Organometallics, vol. 7, No. 12, p. 2537-2542 (1988).
Office Action dated Jun. 8, 2010 in corresponding JP 2010-008589 application with English translation.
Nature 395, pp. 151-154, Baldo et al. (1998).
Japanese Office Action and Translation issued in corresponding Japanese Application No. 2004-279153, (dated Nov. 11, 2009).
Chem. Eur. J. 9(6), pp. 1263-1272 (2003).
Korean Office Action and Translation issued on Jan. 19, 2011 in corresponding Korean Patent Application No. 2007-7006569.

\* cited by examiner

ORGANIC ELECTROLUMINESCENT DEVICE

TECHNICAL FIELD

The present invention relates to an organic electroluminescent device (hereinafter, referred to also as "organic EL device," "light-emitting device," or "device").

BACKGROUND ART

Energetic studies and developments are being made as to organic electroluminescent devices (organic EL devices), because highly luminescent emission is obtained from these devices with low-voltage driving. Generally, the organic EL devices are constituted of an organic layer including a light-emitting layer, and a pair of electrodes between which the organic layer is sandwiched, and, in such devices, electrons injected from the cathode are recombined, in the light-emitting layer, with holes injected from the anode, to produce excitons, whose energy is utilized to emit light.

Improvement in the efficiency of devices has been recently made by using a phosphorescence-emitting material. Iridium complexes, platinum complexes, and the like are such a phosphorescence-emitting material (see, for example, U.S. Pat. No. 6,303,238 and WO 00/57676). However, devices having both high efficiency and high durability have not been developed. There has been a need for development of phosphorescent materials capable of satisfying both.

Also, use of a platinum complex having a quadridentate ligand as a phosphorescent material is known (see U.S. Pat. No. 6,653,654). However, the ligand is limited to a ligand having a bipyridyl or phenanthroline skeleton, and also the wavelength of luminescent color is longer than that of yellow. Therefore, there is a strong need for development of a complex that emits light of a shorter wavelength (from green to blue).

DISCLOSURE OF INVENTION

According to the present invention, there are provided the following means:

(1) An organic electroluminescent device having a pair of electrodes and at least one organic layer including a light-emitting layer interposed between the pair of electrodes, wherein the organic layer contains at least one compound represented by formula (I):

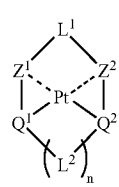

Formula (I)

wherein $Z^1$ and $Z^2$ each independently represent a nitrogen-containing heterocycle coordinated with the platinum through a nitrogen atom; $Q^1$ and $Q^2$ each independently represent a group bonded with the platinum through a carbon atom, an oxygen atom, a sulfur atom, a nitrogen atom or a phosphorous atom; $Q^1$ and $Q^2$ each represent a structure different from each other; $L^1$ and $L^2$ each independently represent a single bond or a linking group; and n represents 0 or 1.

(2) The organic electroluminescent device according to the above item (1), wherein the compound represented by formula (I) is a compound represented by formula (II):

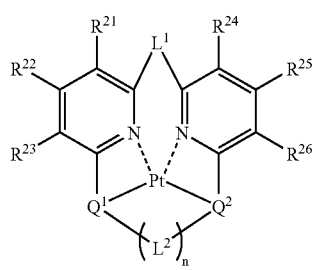

Formula (II)

wherein $Q^1$ and $Q^2$ each independently represent a group bonded with the platinum through a carbon atom, an oxygen atom, a sulfur atom, a nitrogen atom or a phosphorous atom; $Q^1$ and $Q^2$ each represent a structure different from each other; $R^{21}$, $R^{22}$, $R^{23}$, $R^{24}$, $R^{25}$ and $R^{26}$ each independently represent a hydrogen atom or a substituent; $L^1$ and $L^2$ each independently represent a single bond or a linking group; and n represents 0 or 1.

(3) The organic electroluminescent device according to the above item (1), wherein the compound represented by formula (I) is a compound represented by formula (III):

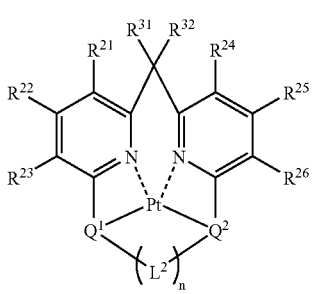

Formula (III)

wherein $Q^1$ and $Q^2$ each independently represent a group bonded with the platinum through a carbon atom, an oxygen atom, a sulfur atom, a nitrogen atom or a phosphorous atom; $Q^1$ and $Q^2$ each represent a structure different from each other; $R^{21}$, $R^{22}$, $R^{23}$, $R^{24}$, $R^{25}$, $R^{26}$, $R^{31}$ and $R^{32}$ each independently represent a hydrogen atom or a substituent; $L^2$ represents a single bond or a linking group; and n represents 0 or 1.

(4) The organic electroluminescent device according to any one of the above items (1) to (3), wherein the above $Q^1$ and $Q^2$ each independently are a group represented by a formula selected from the group consisting of formulae (A1), (B1), (C1), (D1), (E1), (F1) and (G1):

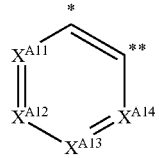

Formula (A1)

wherein, in formula (A1), $X^{A11}$, $X^{A12}$, $X^{A13}$ and $X^{A14}$ each independently represent a substituted or unsubstituted carbon atom or a nitrogen atom; a mark "*" represents a linking site with $Z^1$ or $Z^2$ in formula (I) or the pyridine ring in formula (II) or (III); and a mark "**" represents a bonding site with the platinum;

Formula (B1)

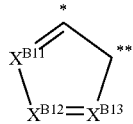

wherein, in formula (B1), $X^{B11}$, $X^{B12}$ and $X^{B13}$ each independently represent a substituted or unsubstituted carbon atom or a nitrogen atom; a mark "*" represents a linking site with $Z^1$ or $Z^2$ in formula (I) or the pyridine ring in formula (II) or (III); and a mark "**" represents a bonding site with the platinum;

Formula (C1)

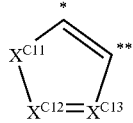

wherein, in formula (C1), $X^{C11}$ represents a substituted or unsubstituted carbon, nitrogen, oxygen or sulfur atom; $X^{C12}$ and $X^{C13}$ each independently represent a substituted or unsubstituted carbon atom or a nitrogen atom; a mark "*" represents a linking site with $Z^1$ or $Z^2$ in formula (I) or the pyridine ring in formula (II) or (III); and a mark "**" represents a bonding site with the platinum;

Formula (D1)

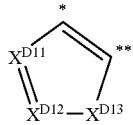

wherein, in formula (D1), $X^{D11}$ and $X^{D12}$ each independently represent a substituted or unsubstituted carbon atom or a nitrogen atom; $X^{D13}$ represents a substituted or unsubstituted carbon, nitrogen, oxygen or sulfur atom; a mark "*" represents a linking site with $Z^1$ or $Z^2$ in formula (I) or the pyridine ring in formula (II) or (III); and a mark "**" represents a bonding site with the platinum;

Formula (E1)

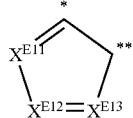

wherein, in formula (E1), $X^{E11}$ and $X^{E13}$ each independently represent a substituted or unsubstituted carbon atom or a nitrogen atom; $X^{E12}$ represents a substituted or unsubstituted carbon, nitrogen, oxygen or sulfur atom; a mark "*" represents a linking site with $Z^1$ or $Z^2$ in formula (I) or the pyridine ring in formula (II) or (III); and a mark "**" represents a bonding site with the platinum;

Formula (F1)

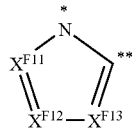

wherein, in formula (F1), $X^{F11}$, $X^{F12}$ and $X^{F13}$ each independently represent a substituted or unsubstituted carbon atom or a nitrogen atom; a mark "*" represents a linking site with $Z^1$ or $Z^2$ in formula (I) or the pyridine ring in formula (II) or (III); and a mark "**" represents a bonding site with the platinum; and Formula (G1)

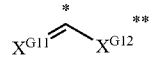

wherein, in formula (G1), $X^{G11}$ represents an oxygen atom or a sulfur atom; $X^{G12}$ represents an oxygen atom or a sulfur atom; a mark "*" represents a linking site with $Z^1$ or $Z^2$ in formula (I) or the pyridine ring in formula (II) or (III); and a mark "**" represents a bonding site with the platinum.

(5) The organic electroluminescent device according to the above item (1), wherein the compound represented by formula (I) is a compound represented by formula (IV):

Formula (IV)

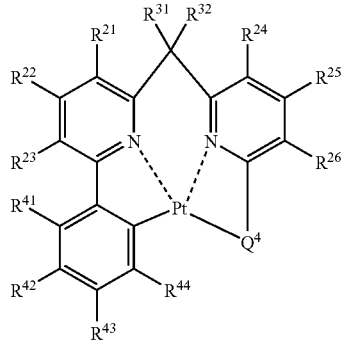

wherein $Q^4$ represents a group bonded with the platinum through a carbon atom, an oxygen atom, a sulfur atom, a nitrogen atom or a phosphorous atom, but does not represent a substituted or unsubstituted phenyl group; $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent; and $R^{44}$ may be linked with $Q^4$, if possible.

(6) The organic electroluminescent device according to the above item (1), wherein the compound represented by formula (I) is a compound represented by formula (V):

Formula (V)

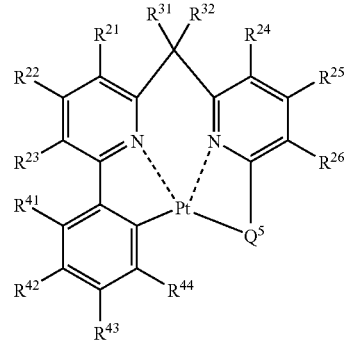

wherein $Q^5$ represents a heterocyclic group bonded with the platinum through a carbon atom or a nitrogen atom; $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent; and $R^{44}$ may be linked with $Q^5$, if possible.

(7) The organic electroluminescent device according to the above item (1), wherein the compound represented by formula (I) is a compound represented by formula (VI):

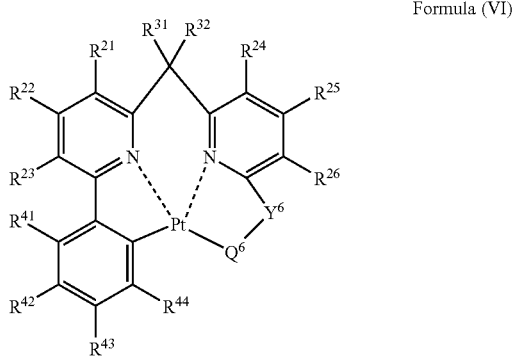

Formula (VI)

wherein $Q^6$ represents a group bonded with the platinum through a carbon atom, an oxygen atom, a sulfur atom, a nitrogen atom or a phosphorous atom; $Y^6$ represents a carbon atom which may be unsubstituted or may have a substituent, an oxygen atom, a nitrogen atom which may be unsubstituted or may have a substituent, or a sulfur atom; $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent; and $R^{44}$ may be linked with $Q^6$, if possible.

(8) The organic electroluminescent device according to the above item (1), wherein the compound represented by formula (I) is a compound represented by formula (VII):

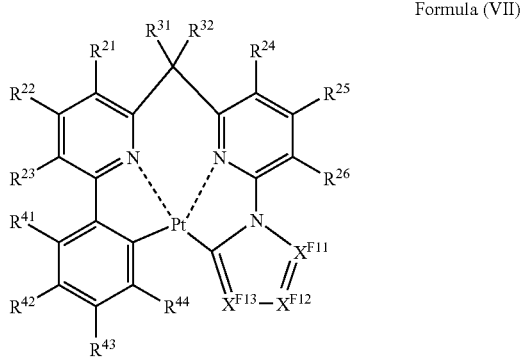

Formula (VII)

wherein $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent; and $X^{F11}$, $X^{F12}$ and $X^{F13}$ each independently represent a substituted or unsubstituted carbon atom or a nitrogen atom.

(9) The organic electroluminescent device according to the above item (1), wherein the compound represented by formula (I) is a compound represented by formula (VIII):

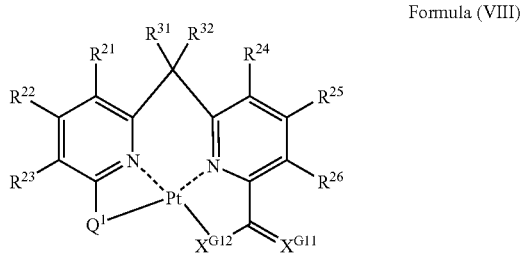

Formula (VIII)

wherein $R^{21}$, $R^{22}$, $R^{23}$, $R^{24}$, $R^{25}$, $R^{26}$, $R^{31}$ and $R^{32}$ each independently represent a hydrogen atom or a substituent; $X^{G11}$ represents an oxygen atom or a sulfur atom; $X^{G12}$ represents an oxygen atom or a sulfur atom; and $Q^1$ represents a group bonded with the platinum through a carbon atom, an oxygen atom, a sulfur atom, a nitrogen atom or a phosphorous atom.

(10) The organic electroluminescent device according to any one of the above items (1) to (9), wherein at least one of the compound represented by any one of formulae (I) to (VIII) is contained in the light-emitting layer.

(11) The organic electroluminescent device according to any one of the above items (1) to (10), wherein at least one of the compound represented by any one of formulae (I) to (VIII) and at least one host material are contained in the light-emitting layer.

The present invention provides an organic EL device in which a platinum complex having a cyclic or non-cyclic quadridentate ligand and having a specific structure is contained in an organic layer.

According to the present invention, it is possible to provide a light-emitting device having high luminance, high luminous efficiency and high durability. Further, according to the present invention, it is possible to provide a metal complex compound preferable to provide the light-emitting device.

The light-emitting device of the present invention has high luminance and high external quantum efficiency, and it is excellent in durability.

Other and further features and advantages of the invention will appear more fully from the following description.

BEST MODE FOR CARRYING OUT INVENTION

The organic EL device of the present invention will be described in detail hereinbelow.

The organic EL device of the present invention comprises a pair of electrodes and at least one organic layer including a light-emitting layer interposed between the pair of electrodes. The organic EL device of the present invention comprises, in the organic layer, an asymmetric complex having a specific structure, among platinum complexes each having a quadridentate ligand. Besides the light-emitting layer, a hole-injecting layer, a hole-transporting layer, an electron-injecting layer, an electron-transporting layer, a hole-blocking layer, an electron-blocking layer, an exciton-blocking layer, a protective layer and the like may be appropriately disposed in the organic EL device of the present invention. Also, each of these layers may be provided with other functions.

The platinum complexes represented by formulae (I) to (VIII) that can be used in the present invention are not limited in their functions, and may be contained in any layer when the organic layer is constituted of plural layers. The platinum complex is preferably contained in the light-emitting layer, more preferably contained as a light-emitting material in the light-emitting layer, and particularly preferably contained together with at least one host material in the light-emitting layer.

When the platinum complex for use in the present invention is contained as a light-emitting material in the light-emitting layer, the content of the platinum complex used in the present invention is preferably 0.1 mass % or more and 50 mass % or less, more preferably 0.2 mass % or more and 30 mass % or less, still more preferably 0.3 mass % or more and 20 mass % or less, and most preferably 0.5 mass % or more and 10 mass % or less, based on the whole mass of the said layer.

The host material is a compound that serves to inject and carry charges primarily in the light-emitting layer, and does not itself substantially emit light. The term "the host material does not substantially emit light" in this specification means that the amount of light emitted from the compound which does not substantially emit light is preferably 5% or less, more preferably 3% or less, and still more preferably 1% or less, based on the total amount of light emitted from the whole device.

Although no particular limitation is imposed on the concentration of the host material in the light-emitting layer, the host material is preferably a major component in the light-emitting layer (that is, the host material is a component contained in the largest amount). The amount of the host material is preferably 50 mass % or more and 99.9 mass % or less, still more preferably 70 mass % or more and 99.8 mass % or less, particularly preferably 80 mass % or more and 99.7 mass % or less, and most preferably 90 mass % or more and 99.5 mass % or less.

The glass transition point of the host material is preferably 100° C. or more and 500° C. or less, more preferably 110° C. or more and 300° C. or less, and still more preferably 120° C. or more and 250° C. or less.

In the present invention, the fluorescent wavelength of the host material put in a film state and contained in the light-emitting layer is preferably 400 nm or more and 650 nm or less, more preferably 420 nm or more and 600 nm or less, and most preferably 440 nm or more and 550 nm or less.

As the host material that can be used in the present invention, compounds as described in paragraph Nos. [0113] to [0161] of JP-A-2002-100476 ("JP-A" means unexamined published Japanese patent application), and compounds as described in paragraph Nos. [0087] to [0098] of JP-A-2004-214179 may be preferably used. However, the present invention is not limited to these compounds.

The platinum complex represented by formula (I) will be explained.

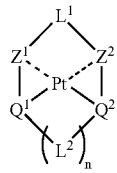

Formula (I)

In formula (I), $Z^1$ and $Z^2$ each independently represent a nitrogen-containing heterocycle coordinated with the platinum through a nitrogen atom. $Q^1$ and $Q^2$ each independently represent a group bonded with the platinum through a carbon atom, an oxygen atom, a sulfur atom, a nitrogen atom or a phosphorous atom, and $Q^1$ and $Q^2$ each represent a structure different from each other. $L^1$ and $L^2$ each independently represent a single bond or a linking group. n represents 0 or 1.

$Z^1$ and $Z^2$ each represent a nitrogen-containing heterocycle coordinated with the platinum through a nitrogen atom. Examples of $Z^1$ or $Z^2$ include a tertiary amino group, an imino group and a nitrogen-containing heterocyclic group (e.g., pyridine, pyrazine, pyrimidine, pyridazine, triazine, pyrazole, imidazole, oxazole, thiazole, triazole, oxadiazole, thiadiazole, and benzo-condensed or pyrido-condensed rings of these). These groups may have a substituent. As the substituent, those given as examples of the substituent of $Q^1$ or $Q^2$, which will be explained later, can be applied. $Z^1$ and $Z^2$ each are preferably a nitrogen-containing heterocyclic group, more preferably pyridine, pyrazine, pyrimidine, pyrazole or triazole, still more preferably pyridine, pyrazine or pyrimidine, and particularly preferably pyridine. $Z^1$ and $Z^2$ may be the same or different from each other.

$Q^1$ and $Q^2$ each represent a group bonded with the platinum through a carbon atom, an oxygen atom, a sulfur atom, a nitrogen atom or a phosphorous atom, and $Q^1$ and $Q^2$ each represent a structure different from each other.

Examples of $Q^1$ or $Q^2$ bonded with the platinum through a carbon atom include an imino group, an aromatic hydrocarbon group (e.g., a phenyl group and a naphthyl group), an aromatic heterocyclic group (e.g., pyridine, pyrazine, pyrimidine, pyridazine, triazine, triazole, imidazole, pyrazole, thiophene and furan) and condensed rings containing these groups. These groups may be further substituted.

Examples of $Q^1$ or $Q^2$ bonded with the platinum through a nitrogen atom include a nitrogen-containing heterocyclic group (e.g., pyrrole, pyrazole, imidazole and triazole) and an amino group (e.g., an alkylamino group, an arylamino group, an acylamino group, an alkoxycarbonylamino group, an aryloxycarbonylamino group and a sulfonylamino group). These groups may be further substituted.

Examples of $Q^1$ or $Q^2$ bonded with the platinum through an oxygen atom include an oxy group, a carbonyloxy group, an alkoxy group, an aryloxy group, a heterocyclic oxy group, an acyloxy group and a silyloxy group.

Examples of $Q^1$ or $Q^2$ bonded with the platinum through a sulfur atom include a thio group, an alkylthio group, an arylthio group, a heterocyclic thio group and a carbonylthio group.

Examples of $Q^1$ or $Q^2$ bonded with the platinum through a phosphorous atom include a diarylphosphine group.

The group represented by $Q^1$ or $Q^2$ is preferably an aromatic hydrocarbon group bonded with the platinum through carbon, an aromatic heterocyclic group bonded with the platinum through carbon, a nitrogen-containing heterocyclic group bonded with the platinum through nitrogen, an aryloxy group or a carbonyloxy group, more preferably an aromatic hydrocarbon group bonded with the platinum through carbon, an aryloxy group or a carbonyloxy group, and still more preferably an aromatic hydrocarbon group bonded with the platinum through carbon or a carbonyloxy group. $Q^1$ and $Q^2$ may have a substituent selected from the substituents A shown below, if possible.

(Substituents A)

Examples of the substituents A include an alkyl group (preferably an alkyl group having 1 to 30 carbon atoms, more preferably 1 to 20 carbon atoms, and particularly preferably 1 to 10 carbon atoms, e.g., methyl, ethyl, isopropyl, tert-butyl, n-octyl, n-decyl, n-hexadecyl, cyclopropyl, cyclopentyl, and cyclohexyl), an alkenyl group (preferably an alkenyl group having 2 to 30 carbon atoms, more preferably 2 to 20 carbon atoms, and particularly preferably 2 to 10 carbon atoms, e.g., vinyl, allyl, 2-butenyl, and 3-pentenyl), an alkynyl group (preferably an alkynyl group having 2 to 30 carbon atoms, more preferably 2 to 20 carbon atoms, and particularly preferably 2 to 10 carbon atoms, e.g., propargyl, and 3-pentynyl), an aryl group (preferably an aryl group having 6 to 30 carbon atoms, more preferably 6 to 20 carbon atoms, and particularly preferably 6 to 12 carbon atoms, e.g., phenyl, p-methylphenyl, naphthyl, and anthranyl), an amino group (preferably an amino group having 0 to 30 carbon atoms, more preferably 0 to 20 carbon atoms, and particularly preferably 0 to 10 carbon atoms, e.g., amino, methylamino, dimethylamino, diethylamino, dibenzylamino, diphenylamino, and ditolylamino), an alkoxy group (preferably an alkoxy group having 1 to 30 carbon atoms, more preferably 1 to 20 carbon atoms, and particularly preferably 1 to 10 carbon atoms, e.g., methoxy, ethoxy, butoxy and 2-ethylhexyloxy), an aryloxy group (preferably an aryloxy having 6 to 30 carbon atoms, more preferably 6 to 20 carbon atoms, and particularly preferably 6 to 12 carbon atoms, e.g., phenyloxy, 1-naphthyloxy, and 2-naphthyloxy), a heterocyclic oxy group (a heterocyclic oxy group having preferably 1 to 30 carbon atoms, more preferably 1 to 20 carbon atoms, and particularly preferably 1 to 12 carbon atoms, e.g., pyridyloxy, pyrazyloxy, pyrimidyloxy, and quinolyloxy), an acyl group (preferably an acyl group having 1 to 30 carbon atoms, more preferably 1 to 20 carbon atoms, and particularly preferably 1 to 12 carbon atoms, e.g., acetyl, benzoyl, formyl, and pivaloyl), an alkoxycarbonyl group (preferably an alkoxycarbonyl group having 2 to 30 carbon atoms, more preferably 2 to 20 carbon atoms, and particularly preferably 2 to 12 carbon atoms, e.g., methoxycarbonyl and ethoxycarbonyl), an aryloxycarbonyl group (preferably aryloxycarbonyl group having 7 to 30 carbon atoms, more preferably 7 to 20 carbon atoms, and particularly preferably 7 to 12 carbon atoms, e.g., phenyloxycarbonyl), an acyloxy group having 2 to 30 carbon atoms, more preferably 2 to 20 carbon atoms, and particularly preferably 2 to 10 carbon atoms, e.g., acetoxy, and benzoyloxy), an acylamino group (preferably an acylamino group having 2 to 30 carbon atoms, more preferably 2 to 20 carbon atoms, and particularly preferably 2 to 10 carbon atoms, e.g., acetylamino, and benzoylamino), an alkoxycarbonylamino group (preferably an alkoxycarbonylamino group having 2 to 30 carbon atoms, more preferably 2 to 20 carbon atoms, and particularly preferably 2 to 12 carbon atoms, e.g., methoxycarbonylamino), an aryloxycarbonylamino group (preferably an aryloxycarbonylamino group having 7 to 30 carbon atoms, more preferably 7 to 20 carbon atoms, and particularly preferably 7 to 12 carbon atoms, e.g., phenyloxycarbonylamino), a sulfonylamino group (preferably a sulfonylamino group having 1 to 30 carbon atoms, more preferably 1 to 20 carbon atoms, and particularly preferably 1 to 12 carbon atoms, e.g., methanesulfonylamino, and benzenesulfonylamino), a sulfamoyl group (preferably a sulfamoyl group having 0 to 30 carbon atoms, more preferably 0 to 20 carbon atoms, and particularly preferably 0 to 12 carbon atoms, e.g., sulfamoyl, methylsulfamoyl, dimethylsulfamoyl, and phenylsulfamoyl), a carbamoyl group (preferably a carbamoyl group having 1 to 30 carbon atoms, more preferably 1 to 20 carbon atoms, and particularly preferably 1 to 12 carbon atoms, e.g., carbamoyl, methylcarbamoyl, diethylcarbamoyl, and phenylcarbamoyl), an alkylthio group (preferably an alkylthio group having 1 to 30 carbon atoms, more preferably 1 to 20 carbon atoms, and particularly preferably 1 to 12 carbon atoms, e.g., methylthio, and ethylthio), an arylthio group (preferably an arylthio group having 6 to 30 carbon atoms, more preferably 6 to 20 carbon atoms, and particularly preferably 6 to 12 carbon atoms, e.g., phenylthio), a heterocyclic thio group (preferably a heterocyclic thio group having 1 to 30 carbon atoms, more preferably 1 to 20 carbon atoms, and particularly preferably 1 to 12 carbon atoms, e.g., pyridylthio, 2-benzimidazolylthio, 2-benzoxazolylthio and 2-benzthiazolylthio), a sulfonyl group (preferably a sulfonyl group having 1 to 30 carbon atoms, more preferably 1 to 20 carbon atoms, and particularly preferably 1 to 12 carbon atoms, e.g., mesyl, and tosyl), a sulfinyl group (preferably a sulfinyl group having 1 to 30 carbon atoms, more preferably 1 to 20 carbon atoms, and particularly preferably 1 to 12 carbon atoms, e.g., methanesulfinyl, and benzenesulfinyl), a ureido group (preferably a ureido group having 1 to 30 carbon atoms, more preferably 1 to 20 carbon atoms, and particularly preferably 1 to 12 carbon atoms, e.g., ureido, methylureido, and phenylureido), a phosphoric acid amido group (preferably a phosphoric acid amido group having 1 to 30 carbon atoms, more preferably 1 to 20 carbon atoms, and particularly preferably 1 to 12 carbon atoms, e.g., diethylphosphoric acid amido, and phenylphosphoric acid amido), a hydroxy group, a mercapto group, a halogen atom (e.g., fluorine, chlorine, bromine, and iodine atoms), a cyano group, a sulfo group, a carboxyl group, a nitro group, a hydroxamic acid group, a sulfino group, a hydrazino group, an imino group, a heterocyclic group (preferably a heterocyclic group having 1 to 30 carbon atoms, and more preferably 1 to 12 carbon atoms; as hetero atoms, e.g., nitrogen, oxygen, and sulfur atoms, and specifically, e.g., imidazolyl, pyridyl, quinolyl, furyl, thienyl, piperidyl, morpholino, benzoxazolyl, benzimidazolyl, benzthiazolyl, carbazolyl, and azevinyl), a silyl group (preferably a silyl group having 3 to 40 carbon atoms, more preferably 3 to 30 carbon atoms, and particularly preferably 3 to 24 carbon atoms, e.g., trimethylsilyl, and triphenylsilyl) and a silyloxy group (preferably a silyloxy group having 3 to 40 carbon atoms, more preferably 3 to 30 carbon atoms, and particularly preferably 3 to 24 carbon atoms, e.g., trimethylsilyloxy, and triphenylsilyloxy).

These substituents shown in the above substituents A may further be substituted. The substituent is preferably an alkyl group, an aryl group, a heterocyclic group, a halogen atom or a silyl group, more preferably an alkyl group, an aryl group, a heterocyclic group or a halogen atom, and further preferably an allyl group, an aryl group, an aromatic heterocyclic group or a fluorine atom.

$L^1$ and $L^2$ each represent a single bond or a linking group. n represents 0 or 1. Herein, in the case where n=0, $Q^1$ and $Q^2$ are not connected with each other to form a ring. The linking group is preferably, though not limited to, a linking group comprising a carbon atom, a nitrogen atom, an oxygen atom, a sulfur atom or a silicone atom. Specific examples of the linking group are shown below. However, the present invention is not limited to these examples. In the following examples, Ph represents a phenyl group.

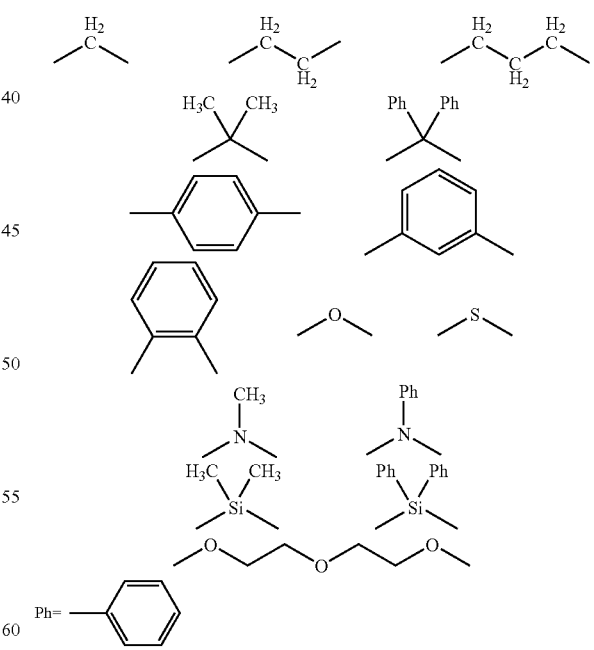

These linking groups may further have a substituent, if possible. As the substituent that can be introduced to the linking group, those given as the examples of the substituents of $Q^1$ and $Q^2$ can be applied.

$L^1$ and $L^2$ each are preferably a dimethylmethylene group or diphenylmethylene group.

The platinum complex represented by formula (I) is preferably a platinum complex represented by formula (II).

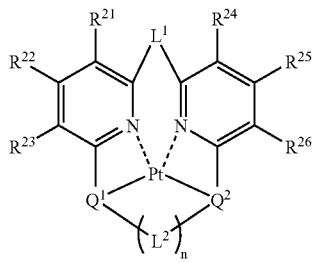

Formula (II)

In formula (II), $Q^1$ and $Q^2$ each independently represent a group bonded with the platinum through a carbon atom, an oxygen atom, a sulfur atom, a nitrogen atom or a phosphorous atom, and $Q^1$ and $Q^2$ each represent a structure different from each other. $R^{21}$, $R^{22}$, $R^{23}$, $R^{24}$, $R^{25}$ and $R^{26}$ each independently represent a hydrogen atom or a substituent. $L^1$ and $L^2$ each independently represent a single bond or a linking group. n represents 0 or 1.

The formula (II) will be explained.

$Q^1$, $Q^2$, $L^1$, $L^2$ and n have the same meanings as those of $Q^1$, $Q^2$, $L^1$, $L^2$ and n in formula (I), respectively, with the same preferable ranges. $R^{21}$ to $R^{26}$ each represent a hydrogen atom or a substituent. As the substituent which can be introduced to these, those given as the examples of the substituents that can be introduced to $Q^1$ and $Q^2$ can be applied. $R^{21}$ to $R^{26}$ each are preferably a hydrogen atom, an alkyl group, an aryl group, an aromatic heterocyclic group, a dialkylamino group, an alkyloxy group or a halogen atom, more preferably a hydrogen atom, an alkyl group, an aryl group or a fluorine atom, and still more preferably a hydrogen atom or an alkyl group.

The platinum complex represented by formula (I) or (II) is preferably a platinum complex represented by formula (III).

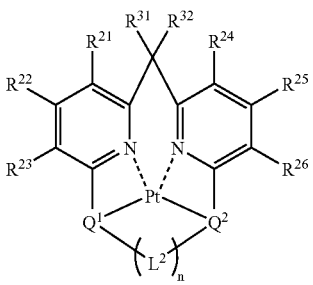

Formula (III)

In formula (III), $Q^1$ and $Q^2$ each independently represent a group bonded with the platinum through a carbon atom, an oxygen atom, a sulfur atom, a nitrogen atom or a phosphorous atom, and $Q^1$ and $Q^2$ each represent a structure different from each other. $R^{21}$, $R^{22}$, $R^{23}$, $R^{24}$, $R^{25}$, $R^{26}$, $R^{31}$ and $R^{32}$ each independently represent a hydrogen atom or a substituent. $L^2$ represents a single bond or a linking group. n represents 0 or 1.

The formula (III) will be explained.

$Q^1$, $Q^2$, $L^2$, n, $R^{21}$, $R^{22}$, $R^{23}$, $R^{24}$, $R^{25}$ and $R^{26}$ have the same meanings as those of $Q^1$, $Q^2$, $L^2$, n, $R^{21}$, $R^{22}$, $R^{23}$, $R^{24}$, $R^{25}$ and $R^{26}$ in formula (II), respectively, with the same preferable ranges. $R^{31}$ and $R^{32}$ each represent a hydrogen atom or a substituent. As the substituent, those given as the examples of the substituents of $Q^1$ and $Q^2$ may be applied. $R^{31}$ and $R^{32}$ each are preferably an alkyl group, an aryl group or a fluorine atom, more preferably an alkyl group or an aryl group, and still preferably an alkyl group.

It is preferable that $Q^1$ and $Q^2$ in formulae (I) to (III) each independently are a group represented by a formula selected from the group consisting of the following formulae (A1), (B1), (C1), (D1), (E1), (F1) and (G1). $Q^1$ and $Q^2$ may be groups selected from the same formula. However, $Q^1$ and $Q^2$ do not take the same structure.

Then, the formulae (A1), (B1), (C1), (D1), (E1), (F1) and (G1) will be explained in detail.

The formula (A1) will be explained.

In formula (A1), the carbon atom with the mark "*" is a carbon atom bonded with $Z^1$ or $Z^2$ in formula (I) or the pyridine ring in formula (II) or (III) by a single bond. The carbon atom with the mark "**" is a carbon atom bonded to the platinum. $X^{A11}$, $X^{A12}$, $X^{A13}$ and $X^{A14}$ each independently represent a substituted or unsubstituted carbon atom or a nitrogen atom. As the substituent when $X^{A11}$, $X^{A12}$, $X^{A13}$ and $X^{A14}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. When $X^{A14}$ is a substituted carbon atom, the substituent may be bonded with $Q^2$ in the case that formula (A1) is $Q^1$, or the substituent may be bonded with $Q^1$ in the case that formula (A1) is $Q^2$, to form a ring as the whole ligand.

Specific examples of the ring represented by formula (A1) include a benzene ring, a pyridine ring, a pyrazine ring, a pyrimidine ring, a pyridazine ring, and a triazine ring. The ring is preferably a benzene ring, a pyridine ring, or a pyrazine ring; more preferably a benzene ring or a pyridine ring; and further preferably a benzene ring.

The formula (B1) will be explained.

In formula (B1), the carbon atom with the mark "*" is a carbon atom bonded with $Z^1$ or $Z^2$ in formula (I) or the pyridine ring in formula (II) or (III) by a single bond. The nitrogen atom with the mark "**" is a nitrogen atom bonded to the platinum. $X^{B11}$, $X^{B12}$ and $X^{B13}$ each independently represent a substituted or unsubstituted carbon atom or a nitrogen atom. As the substituent when $X^{B11}$, $X^{B12}$ and $X^{B13}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. When $X^{B13}$ is a substituted carbon atom, the substituent may be bonded with $Q^2$ in the case that formula (B1) is $Q^1$, or the substituent may be bonded with $Q^1$ in the case that formula (B1) is $Q^2$, to form a ring as the whole ligand.

Specific examples of the ring represented by formula (B1) include a pyrrole ring, a pyrazole ring, an imidazole ring, a triazole ring, and a tetrazole ring. The ring is preferably a pyrrole ring, a pyrazole ring, an imidazole ring, or a triazole ring; more preferably a pyrazole ring, an imidazole ring, or a triazole ring; further preferably a pyrazole ring or an imidazole ring; and particularly preferably a pyrazole ring.

The formula (C1) will be explained.

In formula (C1), the carbon atom with the mark "*" is a carbon atom bonded with $Z^1$ or $Z^2$ in formula (I) or the pyridine ring in formula (II) or (III) by a single bond. The carbon atom with the mark "**" is a carbon atom bonded to the platinum. $X^{C11}$ represents a substituted or unsubstituted carbon, nitrogen, oxygen or sulfur atom. $X^{C12}$ and $X^{C13}$ each independently represent a substituted or unsubstituted carbon atom or a nitrogen atom. As the substituent when $X^{C11}$ is a substituted carbon atom, those given as the above substituents A can be applied. The substituent is preferably an alkyl group, an aryl group, a heterocyclic group, a halogen atom or a silyl group, and more preferably an alkyl group or an aryl group. As the substituent when $X^{C11}$ is a substituted nitrogen atom, those given as the following substituents B can be applied.
(Substituents B)

Examples of the substituents B include an alkyl group (preferably having 1 to 20 carbon atoms, still preferably 1 to 12 carbon atoms, and particularly preferably 1 to 8 carbon atoms, such as methyl, ethyl, isopropyl, tert-butyl, n-octyl, n-decyl, n-hexadecyl, cyclopropyl, cyclopentyl or cyclohexyl), an alkenyl group (preferably having 2 to 20 carbon atoms, still preferably 2 to 12 carbon atoms, and particularly preferably 2 to 8 carbon atoms, such as vinyl, allyl, 2-butenyl or 3-pentenyl), an alkynyl group (preferably having 2 to 20 carbon atoms, still preferably 2 to 12 carbon atoms, and particularly preferably 2 to 8 carbon atoms, such as propargyl or 3-pentynyl), an aryl group (preferably having 6 to 30 carbon atoms, still preferably 6 to 20 carbon atoms, and particularly preferably 6 to 12 carbon atoms, such as phenyl, p-methylphenyl or naphthyl), a substituted carbonyl group (preferably having 1 to 20 carbon atoms, still preferably 1 to 16 carbon atoms, and particularly preferably 1 to 12 carbon atoms, such as acetyl, benzoyl, methoxycarbonyl, phenyloxycarbonyl, dimethylaminocarbonyl or phenylaminocarbonyl), a substituted sulfonyl group (preferably having 1 to 20 carbon atoms, still preferably 1 to 16 carbon atoms, and particularly preferably 1 to 12 carbon atoms, such as mesyl or tosyl), and a heterocyclic group (including an aliphatic one and an aromatic one, preferably having 1 to 50 carbon atoms, still preferably 1 to 30 carbon atoms, and particularly preferably 2 to 12 carbon atoms, and containing at least one of oxygen, sulfur, and nitrogen, such as imidazolyl, pyridyl, furyl, piperidyl, morpholino, benzoxazolyl or triazolyl).

When $X^{C11}$ is a substituted nitrogen atom, the substituent is preferably an alkyl group, an aryl group or a heterocyclic group, more preferably an alkyl group or an aryl group, and still more preferably an aryl group. As the substituent when $X^{C12}$ and $X^{C13}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. When $X^{C13}$ is a substituted carbon atom, the substituent may be bonded with $Q^2$ in the case that formula (C1) is $Q^1$, or the substituent may be bonded with $Q^1$ in the case that formula (C1) is $Q^2$, to form a ring as the whole ligand.

Examples of the ring represented by formula (C1) include a furan ring, pyrrole ring, thiophene ring, cyclopentadiene ring, pyrazole ring, imidazole ring, oxazole ring, thiazole ring and triazole ring. The ring is preferably a pyrrole ring, pyrazole ring or imidazole ring, more preferably a pyrazole ring or imidazole ring, and still more preferably a pyrazole ring.

The formula (D1) will be explained.

In formula (D1), the carbon atom with the mark "*" is a carbon atom bonded with $Z^1$ or $Z^2$ in formula (I) or the pyridine ring in formula (II) or (III) by a single bond. The carbon atom with the mark "**" is a carbon atom bonded to the platinum. $X^{D11}$ and $X^{D12}$ each independently represent a substituted or unsubstituted carbon atom or a nitrogen atom. $X^{D13}$ represents a substituted or unsubstituted carbon, nitrogen, oxygen or sulfur atom. As the substituent when $X^{D13}$ is a substituted carbon atom, those given as the above substituents A can be applied. The substituent is preferably an alkyl group, an aryl group, a heterocyclic group, a halogen atom or a silyl group, and more preferably an alkyl group or an aryl group. As the substituent when $X^{D13}$ is a substituted nitrogen atom, those given as the above substituents B can be applied. The substituent is preferably an alkyl group, an aryl group or a heterocyclic group, more preferably an alkyl group or an aryl group, and still more preferably an aryl group. As the substituent when $X^{D11}$ and $X^{D12}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. The substituent of $X^{D13}$ may be combined with $Q^2$ in the case that formula (D1) is $Q^1$, or the substituent of $X^{D13}$ may be combined with $Q^1$ in the case that formula (D1) is $Q^2$, to form a ring as the whole ligand.

Examples of the ring represented by formula (D1) include a furan ring, pyrrole ring, thiophene ring, cyclopentadiene ring, pyrazole ring, imidazole ring, oxazole ring, thiazole ring and triazole ring. The ring is preferably a pyrrole ring, pyrazole ring or imidazole ring, more preferably a pyrazole ring or imidazole ring, and still more preferably a pyrazole ring.

The formula (E1) will be explained.

In formula (E1), the carbon atom with the mark "*" is a carbon atom bonded with $Z^1$ or $Z^2$ in formula (I) or the pyridine ring in formula (II) or (III) by a single bond. The carbon atom with the mark "**" is a carbon atom bonded to the platinum. $X^{E11}$ and $X^{E13}$ each independently represent a substituted or unsubstituted carbon atom or a nitrogen atom. $X^{E12}$ represents a substituted or unsubstituted carbon, nitrogen, oxygen or sulfur atom. As the substituent when $X^{E12}$ is a substituted carbon atom, those given as the above substituents A can be applied. The substituent is preferably an alkyl group, an aryl group, a heterocyclic group, a halogen atom or a silyl group, and more preferably an alkyl group or an aryl group. As the substituent when $X^{E12}$ is a substituted nitrogen atom, those given as the above substituents B can be applied. The substituent is preferably an alkyl group, an aryl group or a heterocyclic group, more preferably an alkyl group or an aryl group, and still more preferably an aryl group. As the substituent when $X^{E11}$ and $X^{E13}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. When $X^{E13}$ is a substituted carbon atom, the substituent may be combined with $Q^2$ in the case that formula (E1) is $Q^1$, or the substituent may be combined with $Q^1$ in the case that formula (E1) is $Q^2$, to form a ring as the whole ligand.

Examples of the ring represented by formula (E1) include a furan ring, pyrrole ring, thiophene ring, cyclopentadiene ring, pyrazole ring, imidazole ring, oxazole ring, thiazole ring and triazole ring. The ring is preferably a pyrrole ring, pyrazole ring or imidazole ring, more preferably a pyrazole ring or imidazole ring, and still more preferably a pyrazole ring.

The formula (F1) will be explained.

In formula (F1), the nitrogen atom with the mark "*" is a nitrogen atom bonded with $Z^1$ or $Z^2$ in formula (I) or the pyridine ring in formula (II) or (III) by a single bond. The carbon atom with the mark "**" is a carbon atom bonded to the platinum. $X^{F11}$, $X^{F12}$ and $X^{F13}$ each independently represent a substituted or unsubstituted carbon atom or a nitrogen atom. As the substituent when $X^{F11}$, $X^{F12}$ and $X^{F13}$ each represent a substituted carbon atom, those given as the above substituents A can be applied. The substituent is preferably an aryl group, a fluorine atom or a cyano group, and more preferably an alkyl group, a perfluoroalkyl group, a fluorine atom or a cyano group. The substituents may be bonded with each other to form a condensed ring. When $X^{F13}$ is a substituted carbon atom, the substituent may be bonded with $Q^2$ in the case that formula (F1) is $Q^1$, or the substituent may be bonded with $Q^1$ in the case that formula (F1) is $Q^2$, to form a ring as the whole ligand.

Specific examples of the ring represented by formula (F1) include a pyrrole ring, a pyrazole ring, an imidazole ring, a triazole ring, and a tetrazole ring. The ring is preferably a pyrrole ring, a pyrazole ring, an imidazole ring, or a triazole ring; more preferably a pyrazole ring, an imidazole ring, or a triazole ring; further preferably a pyrazole ring or an imidazole ring; and particularly preferably a pyrazole ring.

The formula (G1) will be explained.

In formula (G1), the carbon atom with the mark "*" is a carbon atom bonded with $Z^1$ or $Z^2$ in formula (I) or the pyridine ring in formula (II) or (III) by a single bond. $X^{G12}$ with the mark "**" represents an oxygen atom or a sulfur atom, and it is bonded with the platinum. $X^{G12}$ is preferably an oxygen atom. $X^{G11}$ represents an oxygen atom or a sulfur atom. $X^{G11}$ is preferably an oxygen atom.

The combination of $Q^1/Q^2$ is preferably formula (A1)/formula (A1), formula (A1)/formula (F1), formula (A1)/formula (G1) or formula (F1)/formula (G1).

Among the platinum complexes represented by formula (III), a platinum complex represented by formula (IV) is a preferable embodiment.

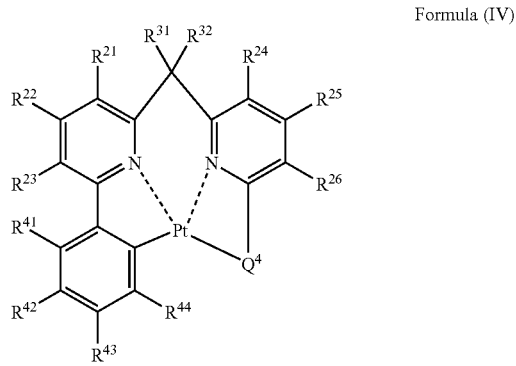

Formula (IV)

In formula (IV), $Q^4$ represents a group bonded with the platinum through a carbon atom, an oxygen atom, a sulfur atom, a nitrogen atom or a phosphorous atom, but does not represent a substituted or unsubstituted phenyl group. $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent. $R^{44}$ may be linked with $Q^4$, if possible.

The formula (IV) will be explained.

$Q^4$ represents a group bonded with the platinum through a carbon atom, an oxygen atom, a sulfur atom, a nitrogen atom or a phosphorous atom, but does not represent a substituted or unsubstituted phenyl group.

Examples of $Q^4$ bonded with the platinum through a carbon atom include an aromatic hydrocarbon group (e.g., a phenyl group and a naphthyl group), an aromatic heterocyclic group (e.g., pyridine, pyrazine, pyrimidine, pyridazine, triazine, triazole, imidazole, pyrazole, thiophene and furan) and condensed rings containing these groups. These groups may be further substituted.

Examples of $Q^4$ bonded with the platinum through a nitrogen atom include a nitrogen-containing heterocyclic group (e.g., pyrrole, pyrazole, imidazole and triazole) and an amino group (e.g., an alkylamino group, an arylamino group, an acylamino group, an alkoxycarbonylamino group, an aryloxycarbonylamino group and a sulfonylamino group). These groups may be further substituted.

Examples of $Q^4$ bonded with the platinum through an oxygen atom include an oxy group, a carbonyloxy group, an alkoxy group, an aryloxy group, a heterocyclic oxy group, an acyloxy group and a silyloxy group.

Examples of $Q^4$ bonded with the platinum through a sulfur atom include a thio group, an alkylthio group, an arylthio group, a heterocyclic thio group and a carbonylthio group.

Examples of $Q^4$ bonded with the platinum through a phosphorous atom include a diarylphosphine group.

$Q^4$ is preferably an aromatic hydrocarbon group bonded with the platinum through carbon, an aromatic heterocyclic group bonded with the platinum through carbon, a nitrogen-containing heterocyclic group bonded with the platinum through nitrogen, an aryloxy group or a carbonyloxy group, more preferably an aromatic hydrocarbon group bonded with the platinum through carbon, an aryloxy group or a carbonyloxy group, and still more preferably an aromatic hydrocarbon group bonded with the platinum through carbon or a carbonyloxy group.

$R^{21}$, $R^{22}$, $R^{23}$, $R^{24}$, $R^{25}$, $R^{26}$, $R^{31}$ and $R^{32}$ have the same meanings as those of $R^{21}$, $R^{22}$, $R^{23}$, $R^{24}$, $R^{25}$, $R^{26}$, $R^{31}$ and $R^{32}$ in formula (III), respectively, with the same preferable ranges. $R^{41}$, $R^{42}$, $R^{43}$ and $R^{44}$ each represent a hydrogen atom or a substituent. As the substituent, those given as the examples of the substituents of $Q^1$ and $Q^2$ can be applied. $R^{41}$, $R^{42}$, $R^{43}$ and $R^{44}$ each are preferably a hydrogen atom, an alkyl group, an aryl group, a fluorine atom or a cyano group, and more preferably a hydrogen atom, an alkyl group, a perfluoroalkyl group, a fluorine atom or a cyano group. Also, $R^{44}$ may be combined with $Q^4$ to form a cyclic ligand, if possible.

Among the platinum complexes represented by formula (IV), a platinum complex represented by formula (V) is a preferable embodiment.

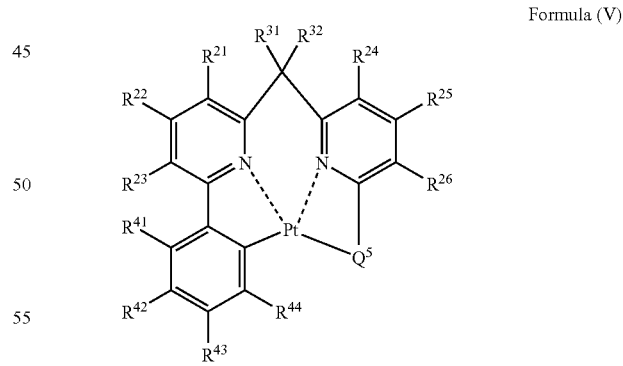

Formula (V)

In formula (V), $Q^5$ represents a heterocyclic group bonded with the platinum through a carbon atom or a nitrogen atom. $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent. $R^{44}$ may be linked with $Q^5$, if possible.

The formula (V) will be explained.

$R^{21}$, $R^{22}$, $R^{23}$, $R^{24}$, $R^{25}$, $R^{26}$, $R^{31}$ and $R^{32}$ have the same meanings as those of $R^{21}$, $R^{22}$, $R^{23}$, $R^{24}$, $R^{25}$, $R^{26}$, $R^{31}$ and $R^{32}$ in formula (III), respectively, with the same preferable ranges. $R^{41}$, $R^{42}$, $R^{43}$ and $R^{44}$ each have the same meanings as those of $R^{41}$, $R^{42}$, $R^{43}$ and $R^{44}$ in formula (IV), respectively, with the same preferable ranges. $Q^5$ represents a heterocyclic group bonded with the platinum through a carbon atom or a nitrogen atom. Examples of $Q^5$ bonded with the platinum through a carbon atom include pyridine, pyrimidine, pyridazine, pyrazine, triazole, pyrazole, imidazole, thiophene, furan, and benzo-condensed or pyrido-condensed rings of these. Examples of $Q^5$ bonded with the platinum through a nitrogen atom include pyrrol, imidazole, pyrazole, triazole, and benzo-condensed or pyrido-condensed rings of these. $Q^5$ may have a substituent. As the substituent, those given as the examples of the substituents of $Q^1$ and $Q^2$ can be applied.

Among the platinum complexes represented by formula (IV), a platinum complex represented by formula (VI) is a preferable embodiment.

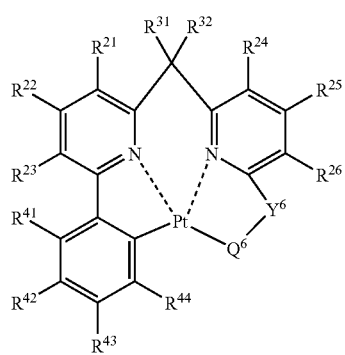

Formula (VI)

In formula (VI), $Q^6$ represents a group bonded with the platinum through a carbon atom, an oxygen atom, a sulfur atom, a nitrogen atom or a phosphorous atom. $Y^6$ represents a carbon atom which may be unsubstituted or may have a substituent, an oxygen atom, a nitrogen atom which may be unsubstituted or may have a substituent, or a sulfur atom. $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent. The substituent has the same meaning as the substituents A which $Q^1$ and $Q^2$ may have, with the same preferable range. $R^{44}$ may be linked with $Q^6$, if possible.

The formula (VI) will be explained.

$R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ have the same meanings as those of $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ in formula (IV), respectively, with the same preferable ranges.

$Q^6$ has the same meaning as $Q^1$ in formula (I), with the same preferable range.

$Y^6$ represents an unsubstituted or substituted carbon atom, an oxygen atom, an unsubstituted or substituted nitrogen atom or a sulfur atom. The unsubstituted carbon atom and the unsubstituted nitrogen atom mean a carbon atom having only hydrogen atoms and a nitrogen atom having only a hydrogen atom, respectively. As the substituent that the carbon atom can have, those given as examples of the substituents of $Q^1$ and $Q^2$ can be applied, and an aliphatic hydrocarbon group, an aromatic hydrocarbon group, a heterocyclic group, a halogen group and an alkoxy group are preferable.

Preferable examples of the aliphatic hydrocarbon group that the carbon atom can have include an alkyl group (preferably an alkyl group having 1 to 20 carbon atoms, more preferably 1 to 12 carbon atoms, and particularly preferably 1 to 8 carbon atoms, for example, methyl, ethyl, isopropyl, tert-butyl, n-octyl, n-decyl, n-hexadecyl, cyclopropyl, cyclopentyl and cyclohexyl), an alkenyl group (preferably an alkenyl group having 2 to 20 carbon atoms, more preferably 2 to 12 carbon atoms, and particularly preferably 2 to 8 carbon atoms, for example, vinyl, allyl, 2-butenyl and 3-pentenyl), and an alkynyl group (preferably an alkynyl group having 2 to 20 carbon atoms, more preferably 2 to 12 carbon atoms, and particularly preferably 2 to 8 carbon atoms, for example, propargyl and 3-pentynyl). Among these, an alkyl group is more preferable.

The aromatic hydrocarbon group that the carbon atom can have is preferably an aromatic hydrocarbon group having 6 to 30 carbon atoms, more preferably 6 to 20 carbon atoms, and particularly preferably 6 to 12 carbon atoms; and examples thereof include phenyl, 2-methylphenyl, 3-methylphenyl, 4-methylphenyl, 4-methoxyphenyl, 3-trifluoromethylphenyl, 2-phenylphenyl, pentafluorophenyl, 1-naphthyl and 2-naphthyl. Among these groups, phenyl, 2-methylphenyl and 2-phenylphenyl are preferable.

The heterocyclic group that the carbon atom can have is preferably a monocyclic or condensed-ring heterocyclic group (preferably having 1 to 20 carbon atoms, more preferably 1 to 12 carbon atoms, and still more preferably 2 to 10 carbon atoms), and more preferably an aromatic heterocyclic group containing at least one of a nitrogen atom, an oxygen atom, a sulfur atom and a selenium atom. Specific examples of the heterocyclic group that the carbon atom can have include pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadiazole, quinoline, isoquinoline, phthalazine, naphthylidine, quinoxaline, quinazoline, cinnoline, pteridine, acridine, phenanthroline, phenazine, tetrazole, benzimidazole, benzoxazole, benzothiazole, benzotriazole, tetrazaindene and carbazole. Among these, furan, thiophene, pyridine, pyrazine, pyrimidine, pyridazine, triazine, quinoline, phthalazine, naphthylidine, quinoxaline and quinazoline are preferable, and furan, thiophene, pyridine and quinoline are more preferable.

The halogen group that the carbon atom can have is preferably a fluorine atom.

The alkoxy group that the carbon atom can have is preferably an alkoxy group having 1 to 20 carbon atoms, more preferably 1 to 12 carbon atoms, and particularly preferably 1 to 8 carbon atoms. Examples of the alkoxy group include a methoxy group and an ethoxy group.

Examples of the substituent that the nitrogen atom can have include an alkyl group (preferably an alkyl group having 1 to 30 carbon atoms, more preferably 1 to 20 carbon atoms, and particularly preferably 1 to 10 carbon atoms, for example, methyl, ethyl, isopropyl, tert-butyl, n-octyl, n-decyl, n-hexadecyl, cyclopropyl, cyclopentyl and cyclohexyl), an alkenyl group (preferably an alkenyl group having 2 to 30 carbon atoms, more preferably 2 to 20 carbon atoms, and particularly preferably 2 to 10 carbon atoms, for example, vinyl, allyl, 2-butenyl and 3-pentenyl), an alkynyl group (preferably an alkynyl group having 2 to 30 carbon atoms, more preferably 2 to 20 carbon atoms, and particularly preferably 2 to 10 carbon atoms, for example, propargyl and 3-pentynyl), an aromatic hydrocarbon group (preferably an aromatic hydrocarbon group having 6 to 30 carbon atoms, more preferably 6 to 20 carbon atoms, and particularly preferably 6 to 12 carbon atoms, for example, phenyl, p-methylphenyl, naphthyl and anthranyl), an acyl group (preferably an acyl group having 1 to 30 carbon atoms, more preferably 1 to 20 carbon atoms, and particularly preferably 1 to 12 carbon atoms, for example, acetyl, benzoyl, formyl and pivaloyl), an alkoxycarbonyl group (preferably an alkoxycarbonyl group having 2 to 30 carbon atoms, more preferably 2 to 20 carbon atoms, and particularly preferably 2 to 12 carbon atoms, for example, methoxycarbonyl and ethoxycarbonyl), an aryloxycarbonyl group (preferably an aryloxycarbonyl group having 7 to 30 carbon atoms, more preferably 7 to 20 carbon atoms, and particularly preferably 7 to 12 carbon atoms, for example, phenyloxycarbonyl), a sulfonyl group (preferably a sulfonyl group having 1 to 30 carbon atoms, more preferably 1 to 20 carbon atoms, and particularly preferably 1 to 12 carbon atoms, for example, mesyl and tosyl), a sulfinyl group (preferably a sulfinyl group having 1 to 30 carbon atoms, more preferably 1 to 20 carbon atoms, and particularly preferably 1 to 12 carbon atoms, for example, methanesulfinyl and benzenesulfinyl), a cyano group, a sulfo group, and a heterocyclic group (preferably a heterocyclic group having 1 to 30 carbon atoms, and more preferably 1 to 12 carbon atoms; as hetero atoms, e.g., nitrogen, oxygen, and sulfur, and specifically, e.g., imidazolyl, pyridyl, quinolyl, furyl, thienyl, piperidyl, morpholino, benzoxazolyl, benzimidazolyl, benzthiazolyl, carbazolyl group and azepinyl group). Among groups, an aliphatic hydrocarbon group, an aromatic hydrocarbon group and a heterocyclic group are preferable.

The aliphatic hydrocarbon group, aromatic hydrocarbon group and heterocyclic group that the nitrogen atom can have are preferably the same as those given as the preferable examples of the aliphatic hydrocarbon group, aromatic hydrocarbon group and heterocyclic group that the carbon atom can have.

$Y^6$ is preferably an unsubstituted or substituted carbon atom, an oxygen atom or an unsubstituted or substituted nitrogen atom, more preferably a substituted carbon atom, an oxygen atom or a substituted nitrogen atom, and still more preferably a substituted carbon atom.

The platinum complex represented by formula (V) is preferably a platinum complex represented by formula (VII).

Formula (VII)

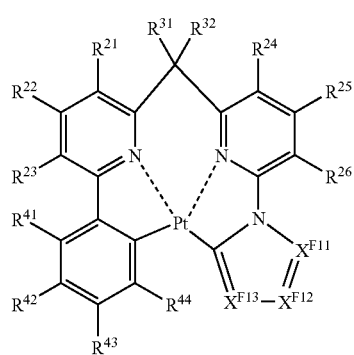

In formula (VII), $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent. $X^{F11}$, $X^{F12}$ and $X^{F13}$ each independently represent a substituted or unsubstituted carbon atom or a nitrogen atom.

The formula (VII) will be explained.
$R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ have the same meanings as those of $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ in formula (V), respectively, with the same preferable ranges. $X^{F11}$, $X^{F12}$ and $X^{F13}$ have the same meanings as those of $X^{F11}$, $X^{F12}$ and $X^{F13}$ in formula (F1), respectively, with the same preferable ranges.

Among the platinum complexes represented by any one of formulae (I) to (III), a metal complex represented by formula (VIII) is a preferable embodiment.

Formula (VIII)

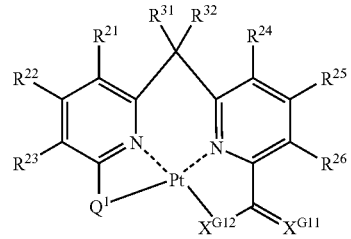

In formula (VIII), $R^{21}$, $R^{22}$, $R^{23}$, $R^{24}$, $R^{25}$, $R^{26}$, $R^{31}$ and $R^{32}$ each independently represent a hydrogen atom or a substituent. $X^{G11}$ represents an oxygen atom or a sulfur atom. $X^{G12}$ represents an oxygen atom or a sulfur atom. $Q^1$ represents a group bonded with the platinum through a carbon atom, an oxygen atom, a sulfur atom, a nitrogen atom or a phosphorous atom The formula (VIII) will be explained.

$R^{21}$, $R^{22}$, $R^{23}$, $R^{24}$, $R^{25}$, $R^{26}$, $R^{31}$ and $R^{32}$ have the same meanings as those of $R^{21}$, $R^{22}$, $R^{23}$, $R^{24}$, $R^{25}$, $R^{26}$, $R^{31}$ and $R^{32}$ in formula (III), respectively, with the same preferable ranges. $X^{G11}$ and $X^{G12}$ have the same meanings as those of $X^{G11}$ and $X^{G12}$ in formula (G1), respectively, with the same preferable ranges. $Q^1$ has the same meaning as $Q^1$ in formula (I), with the same preferable range.

The following illustrates specific examples of the compounds represented by any one of formulae (I) to (VIII). In the present invention, however, the compounds are not limited to these.

1

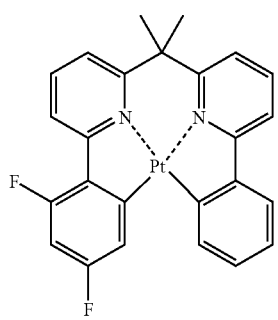

2

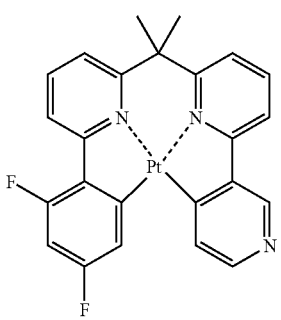

3
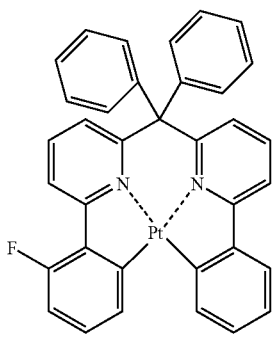
4
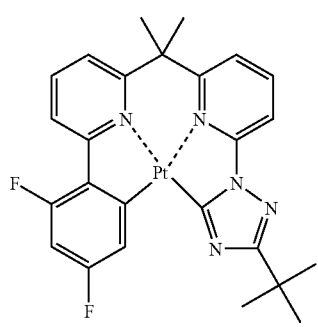
5
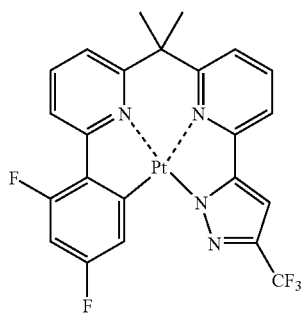
6
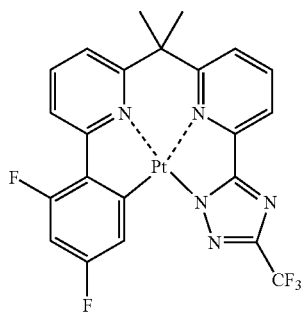
7
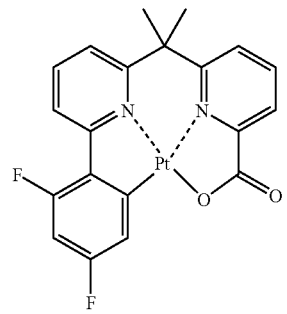
8
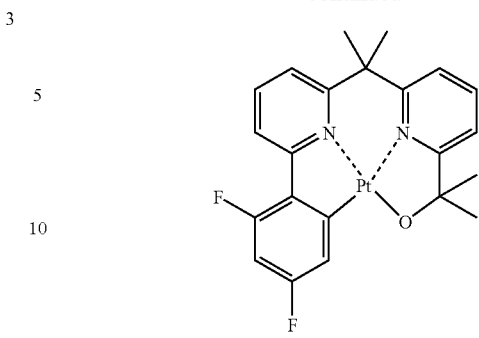
9
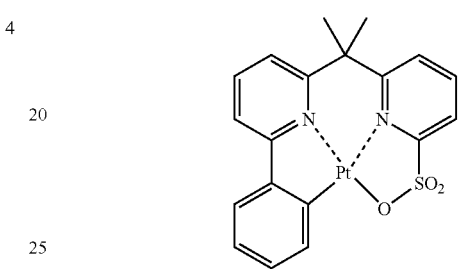
10
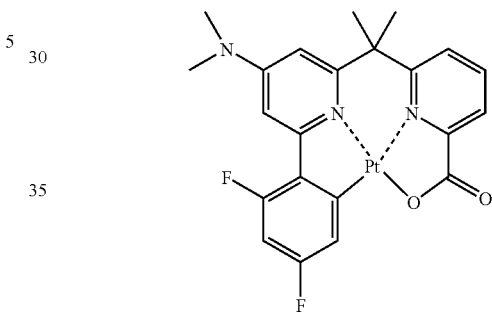
11
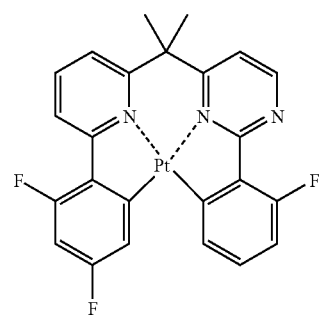
12
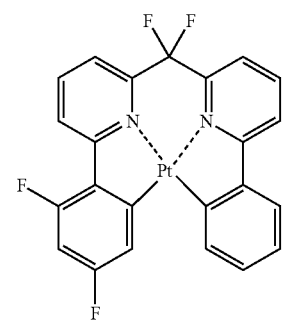

-continued
13
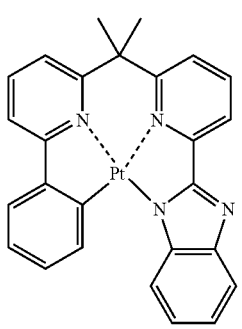
14
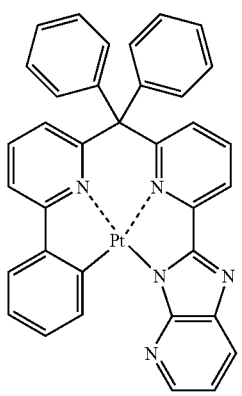
15
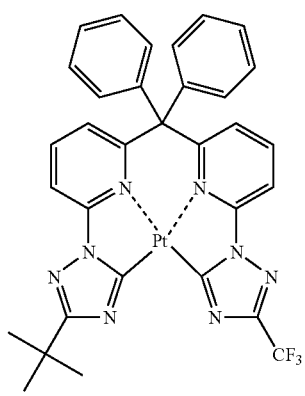
16
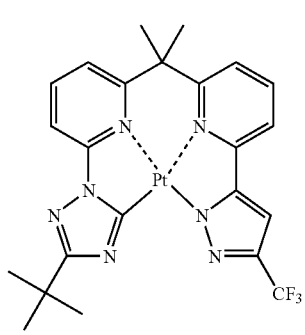
-continued
17
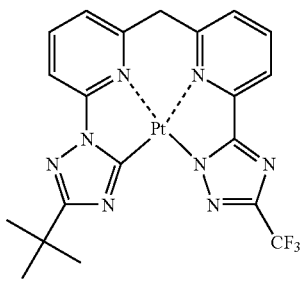
18
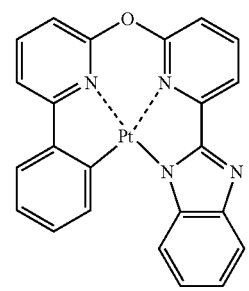
19
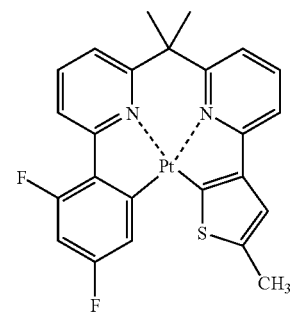
20
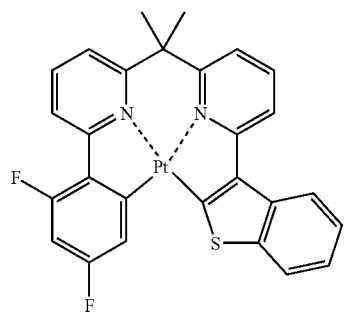
21
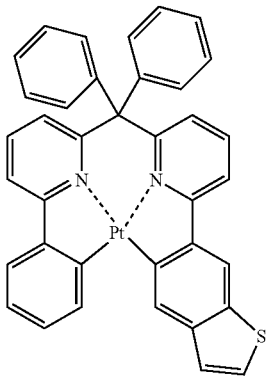

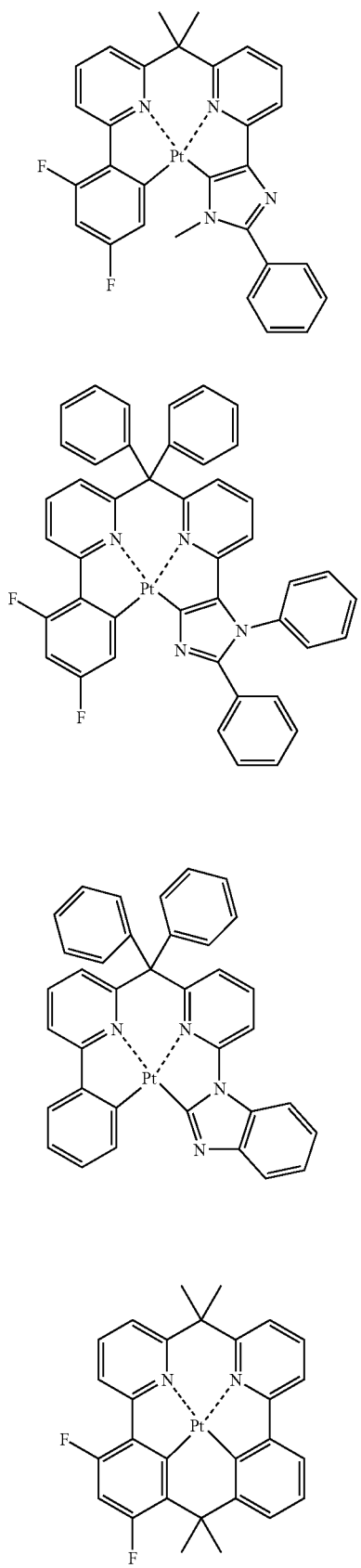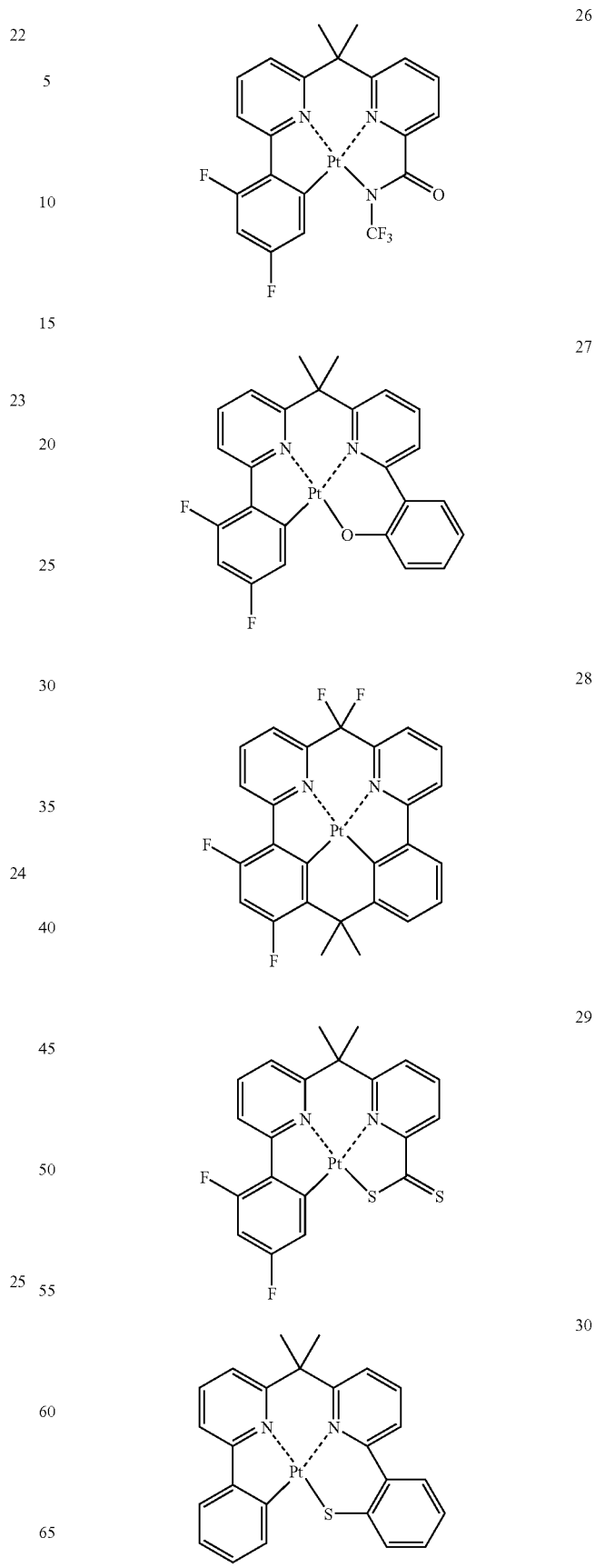

31 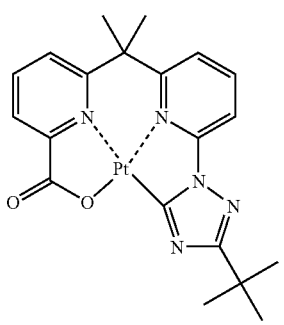
32 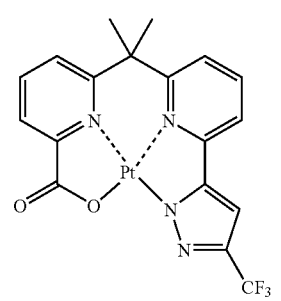
33 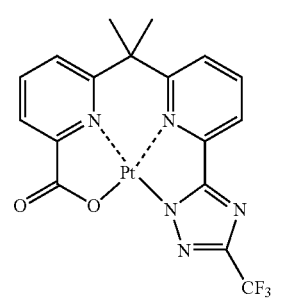
34 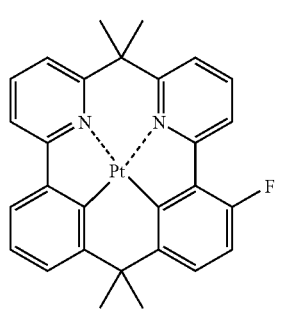
35 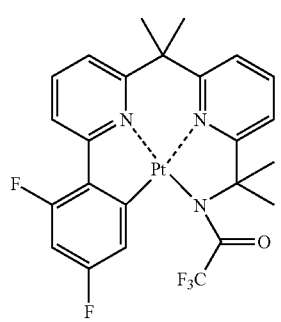
36 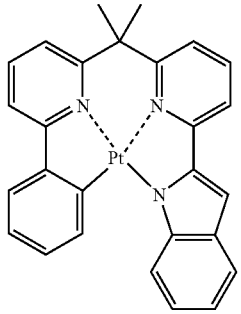
37 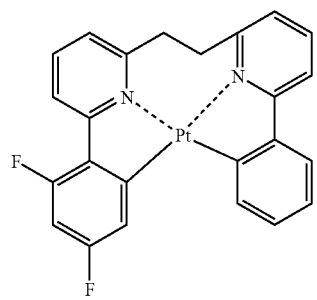
38 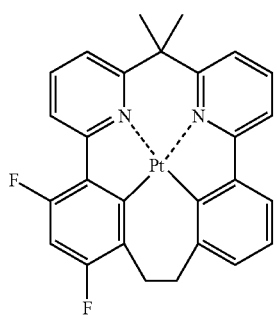
39 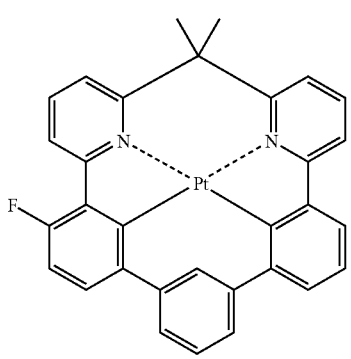
40 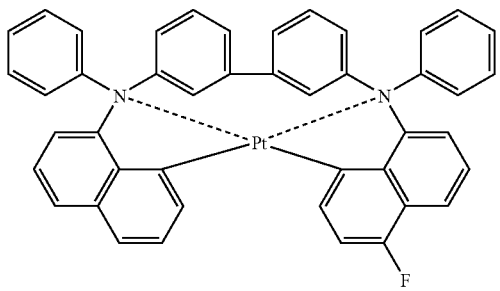

-continued
41
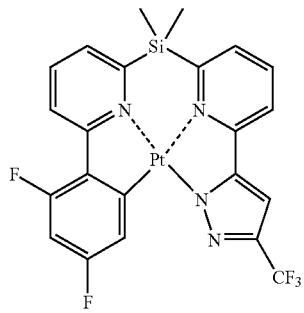
42
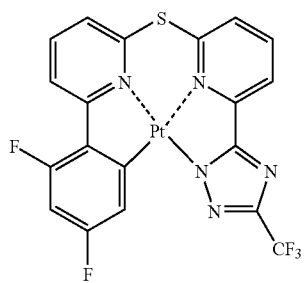
43
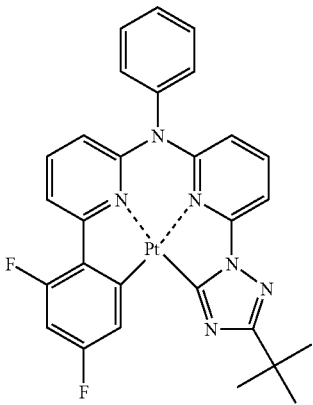
44
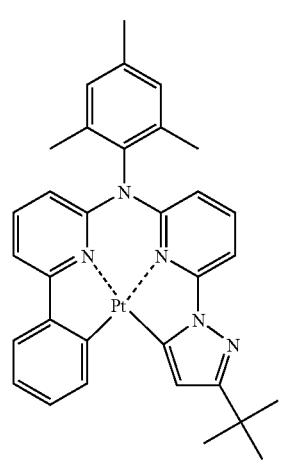
-continued
45
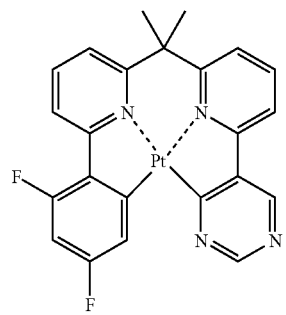
46
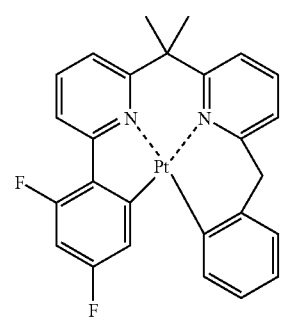
47
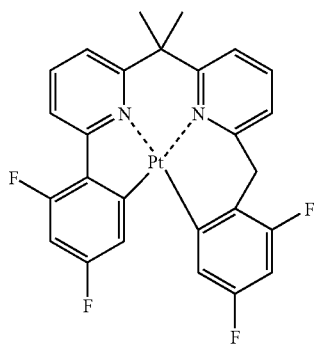
48
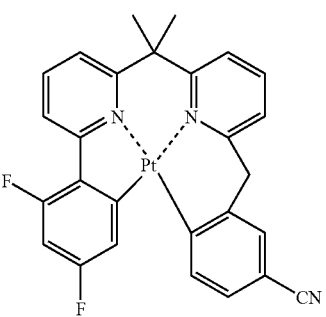
49
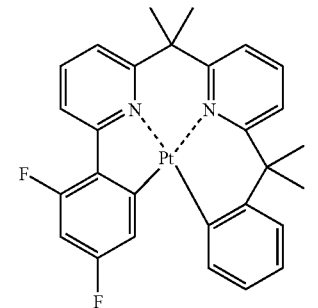

50
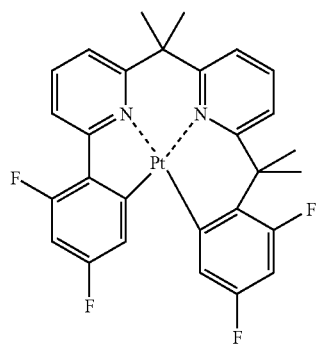
51
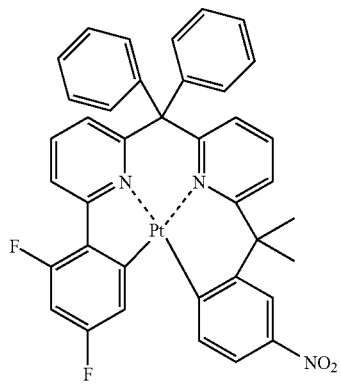
52
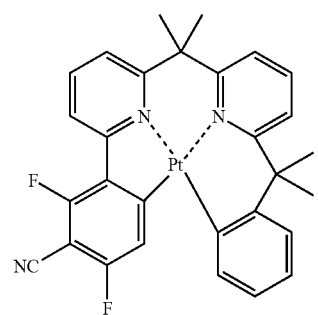
53
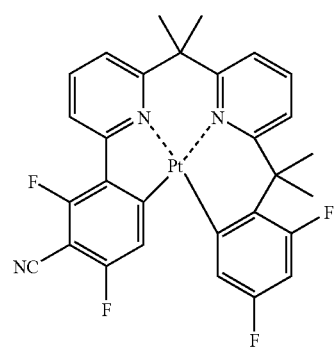
54
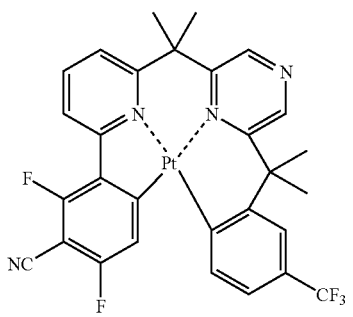
55
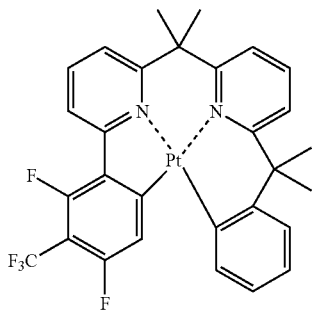
56
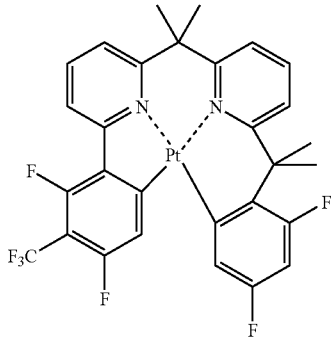
57
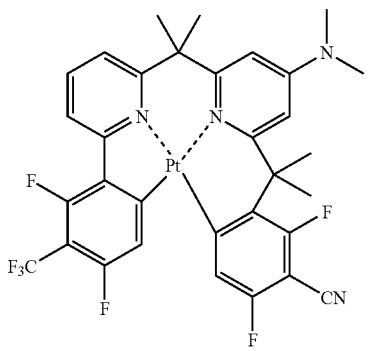
58
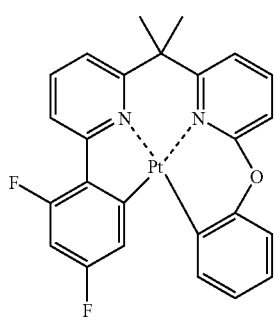

59
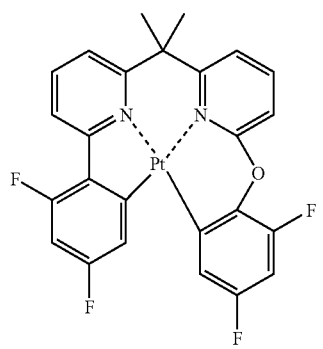
60
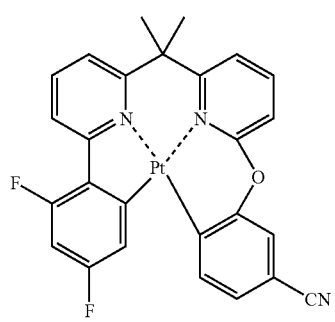
61
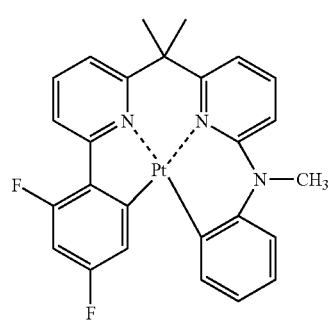
62
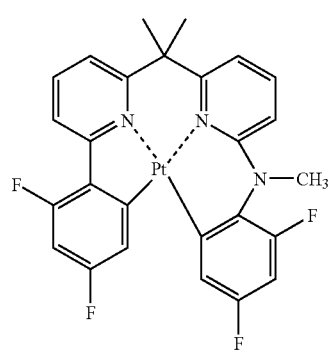
63
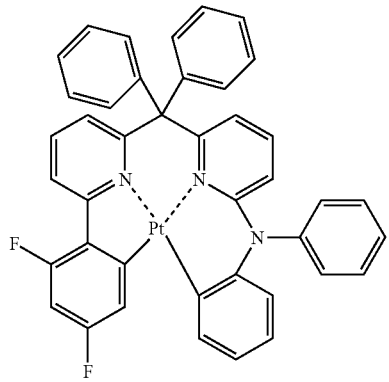
64
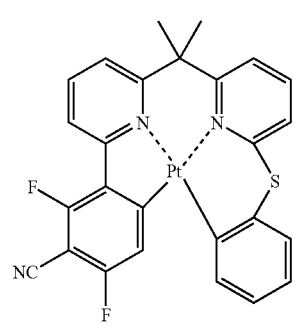
65
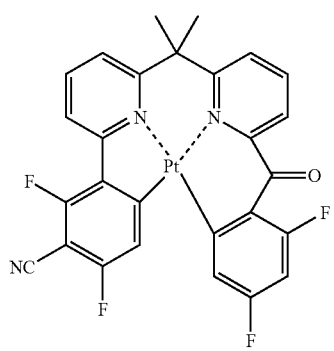
66
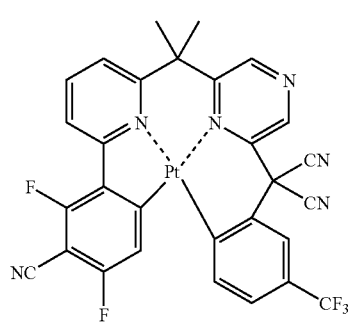

35
-continued
67
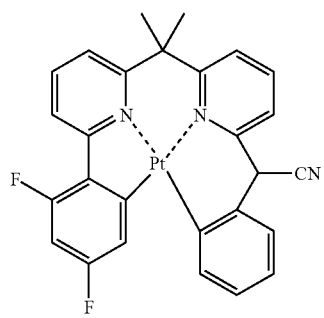
68
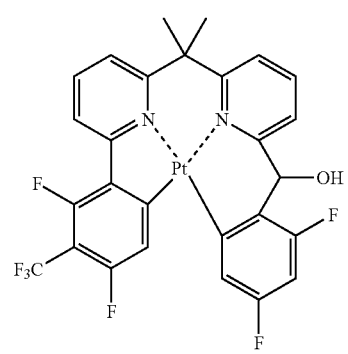
69
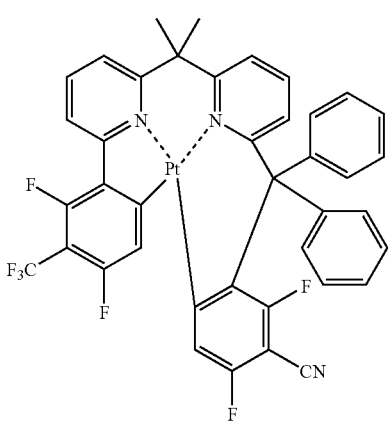
70
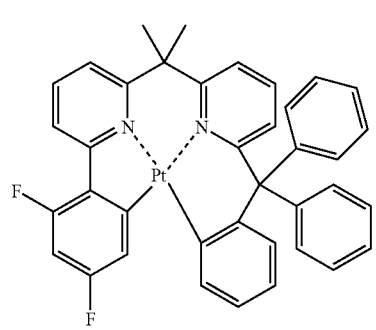
36
-continued
71
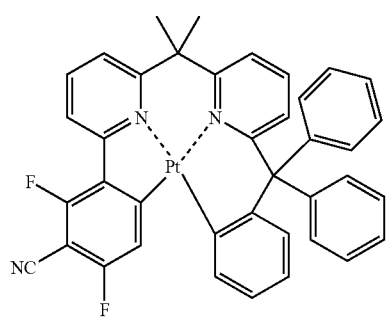
72
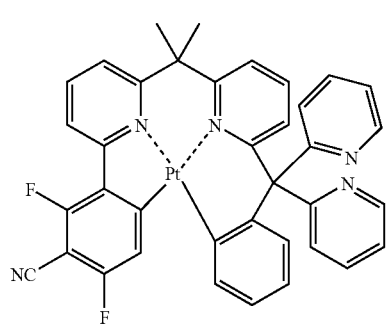
73
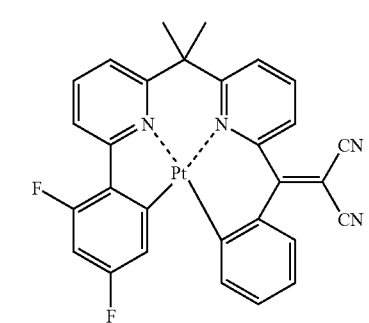
74
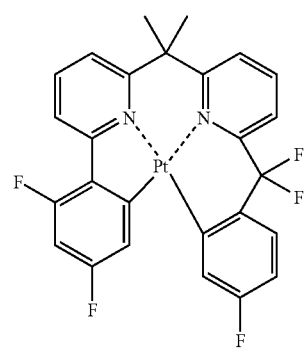

75
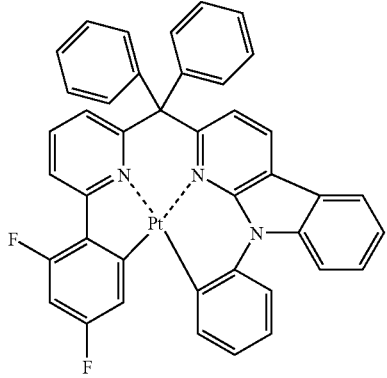
76
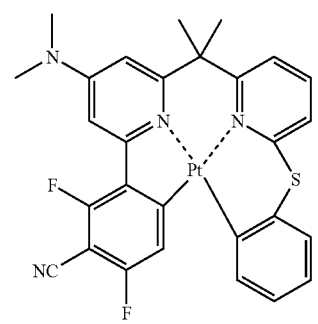
77
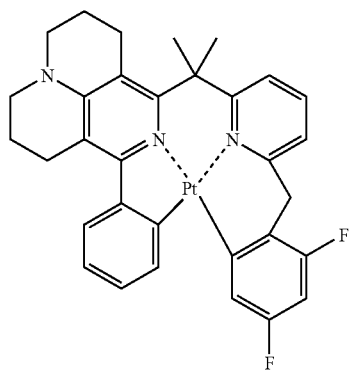
78
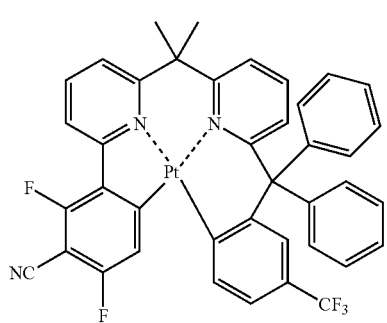
79
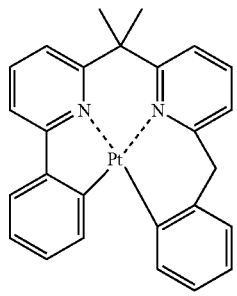
80
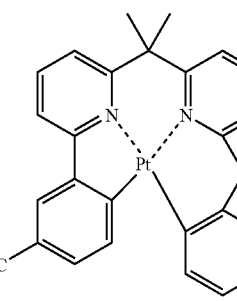
81
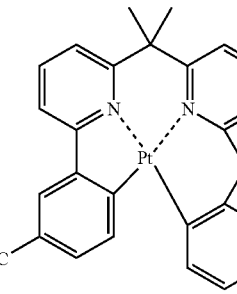
82
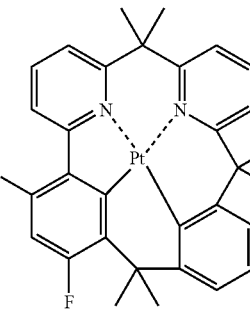
83
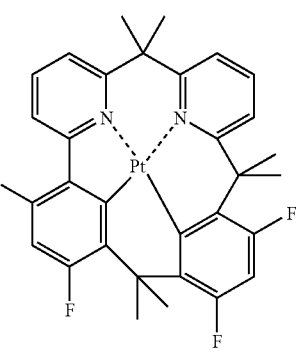

84
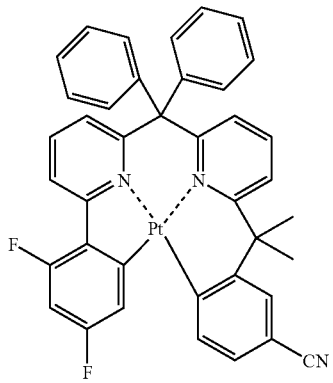
85
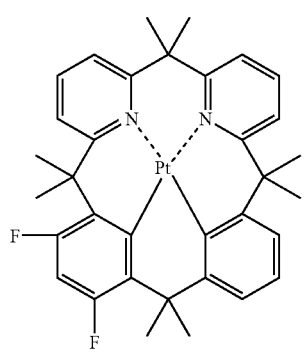
86
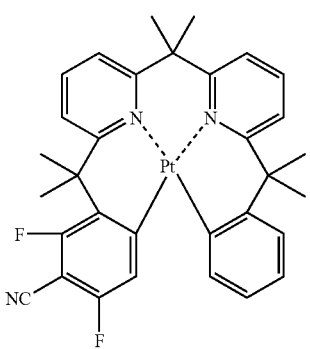
87
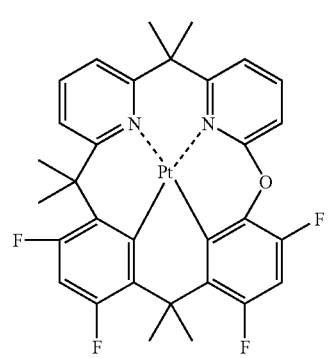
88
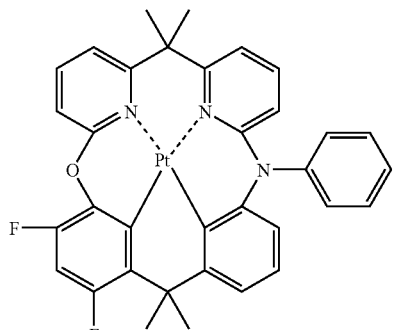
89
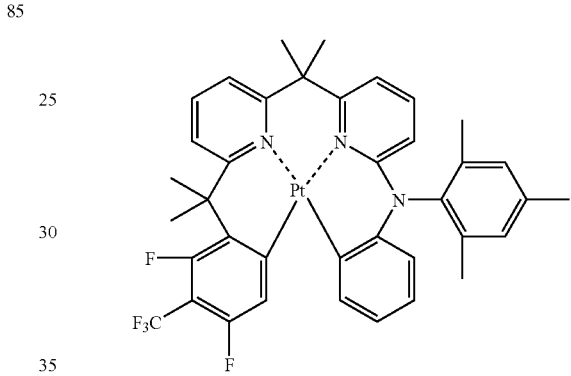
90
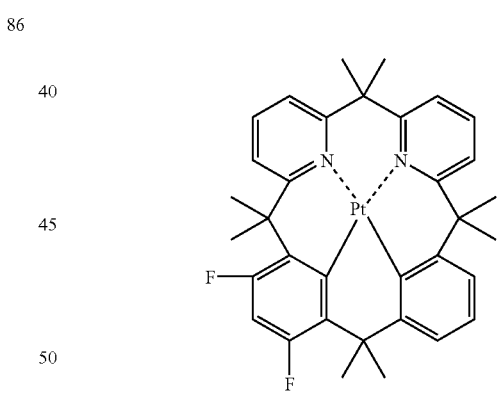
91
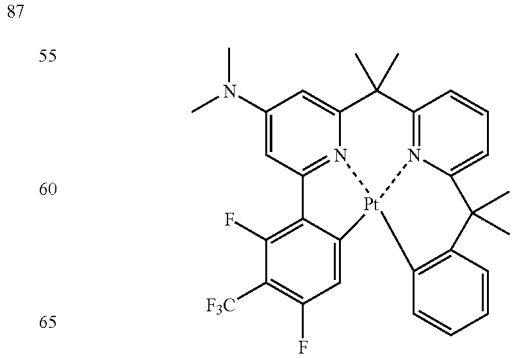

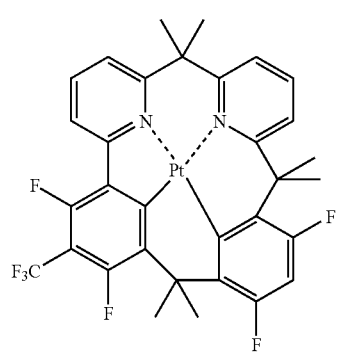 92
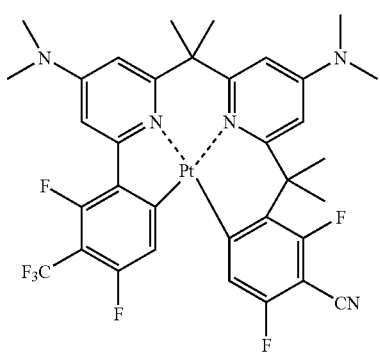 93
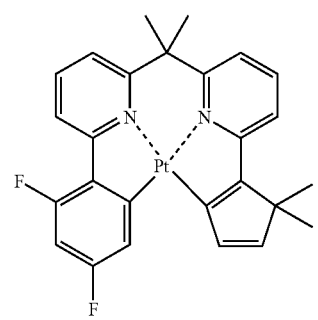 94
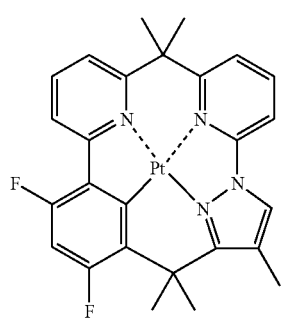 95
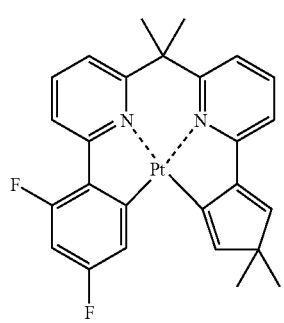 96
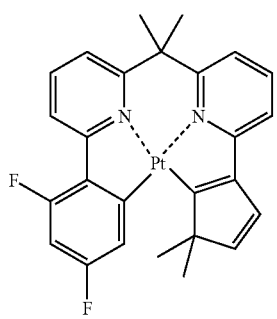 97
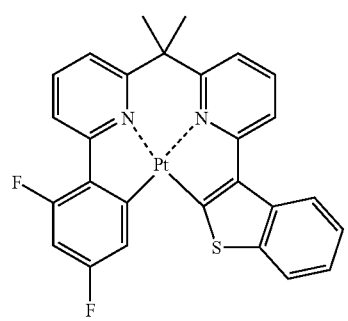 98
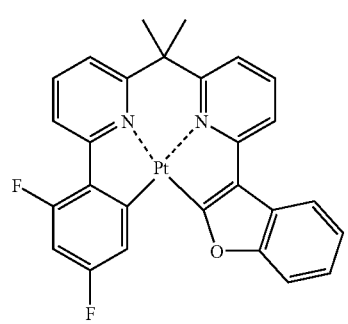 99
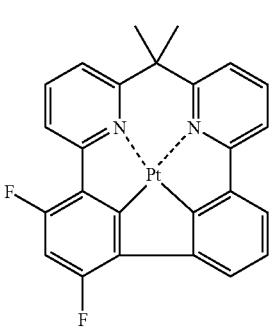 100
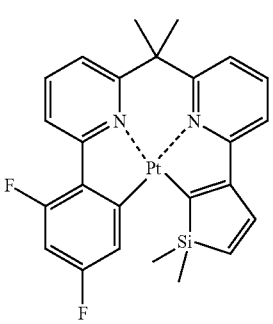 101

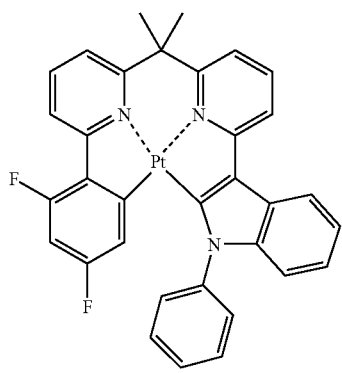 102
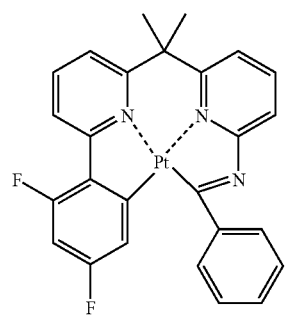 103
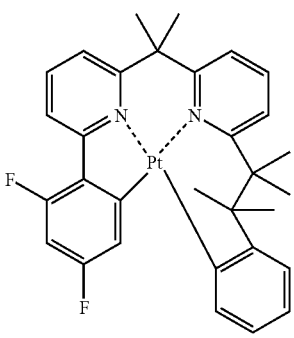 104
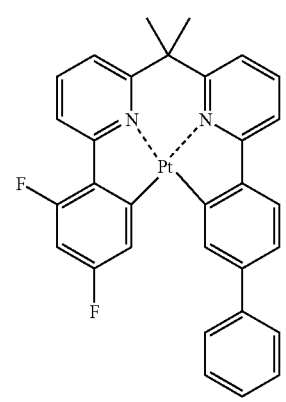 105
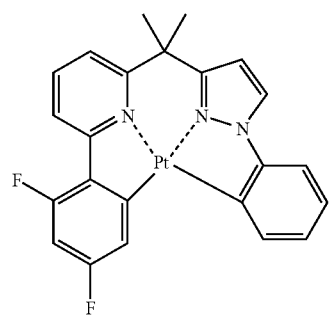 106
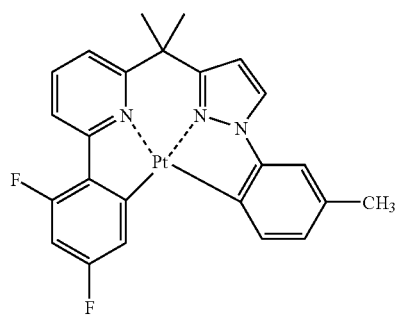 107
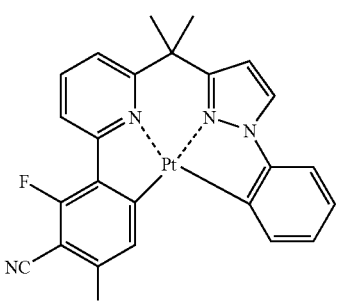 108
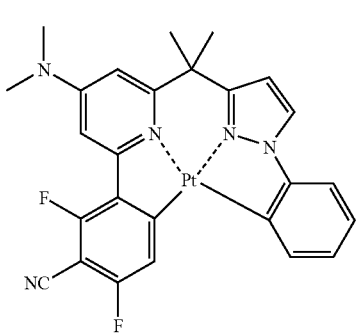 109
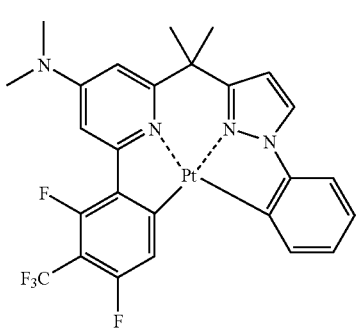 110

111
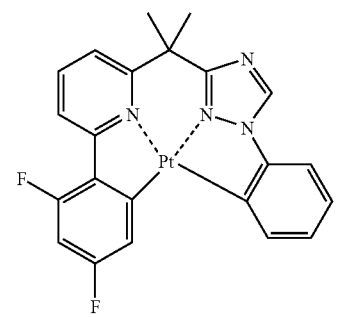
112
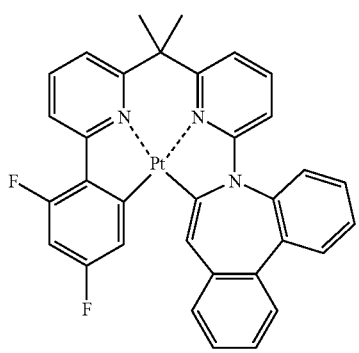
113
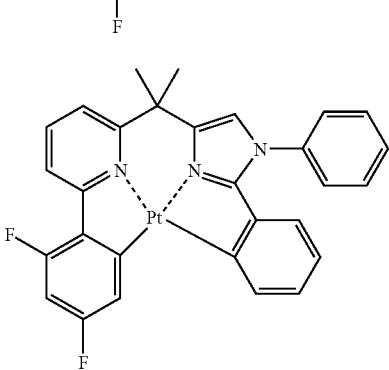
114
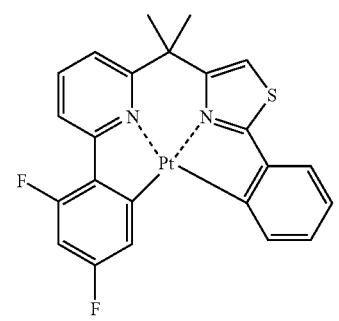
115
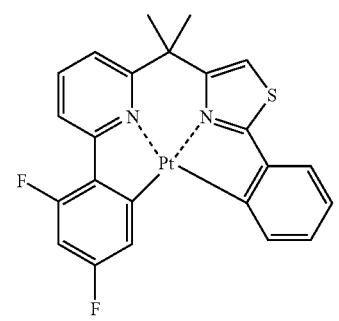
116
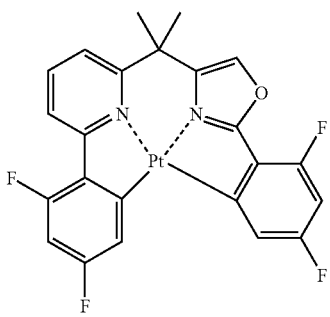
117
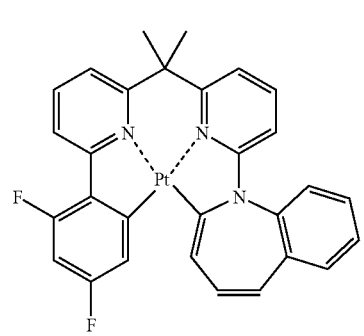
118
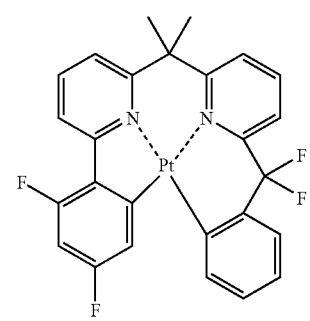
119
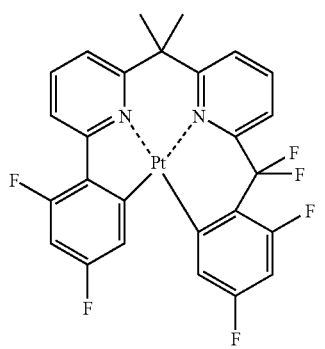
120
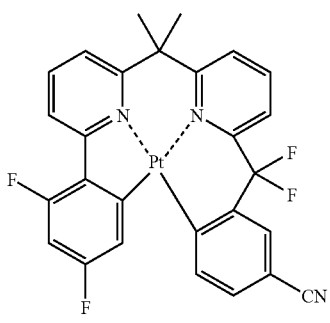

121
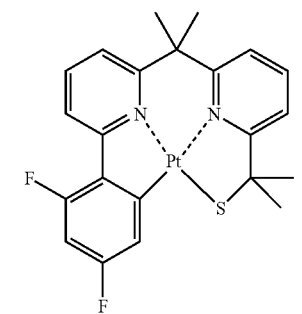
122
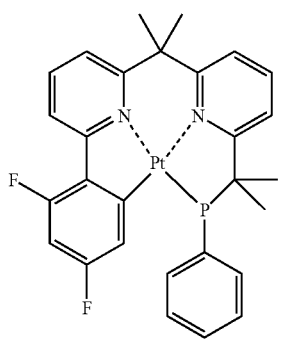
123
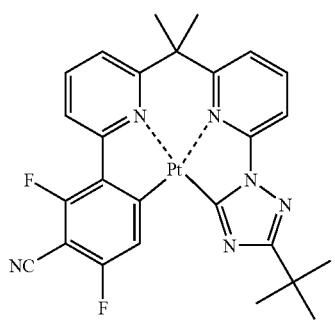
124
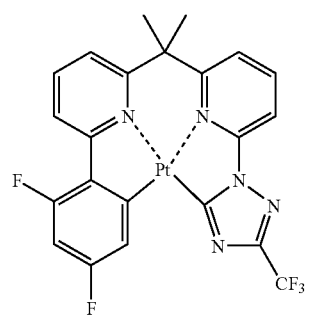
125
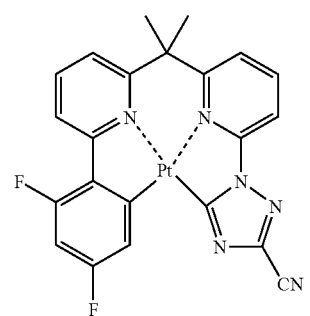
126
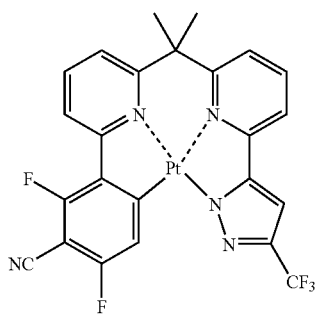
127
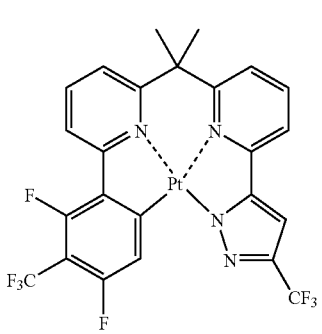
128
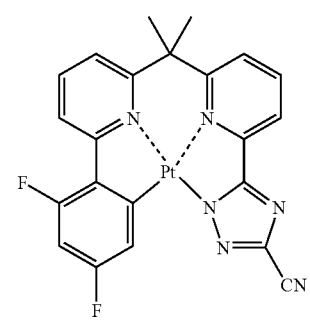
129
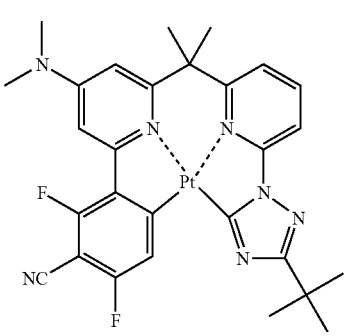
130
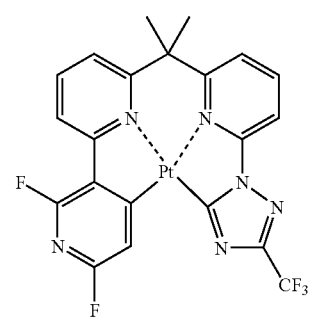

131
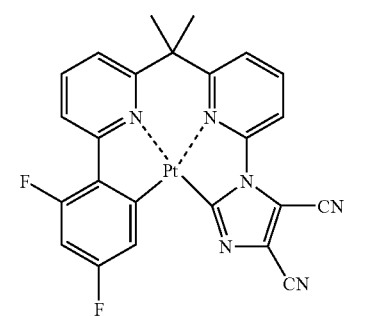
132
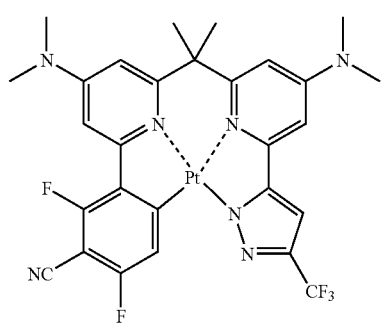
133
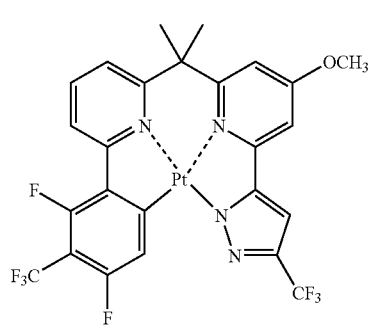
134
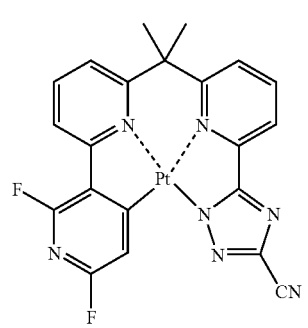
135
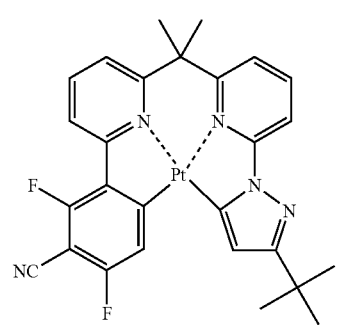
136
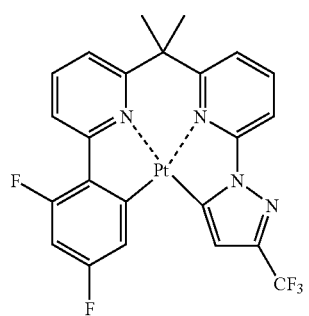
137
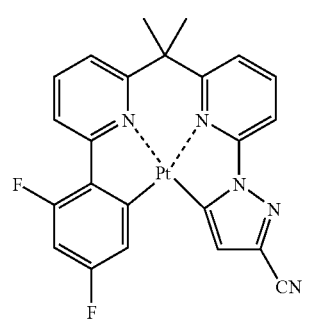
138
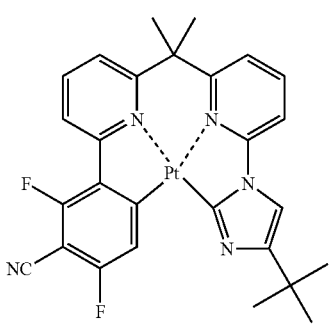
139
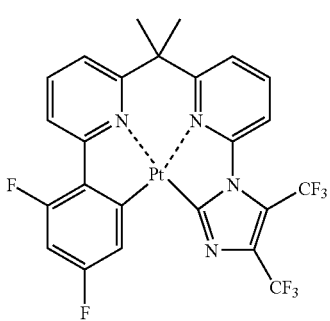
140
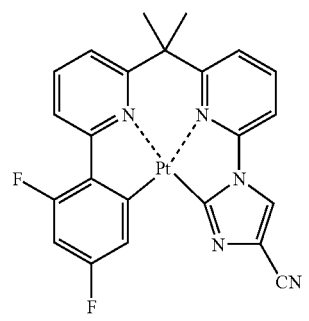

141 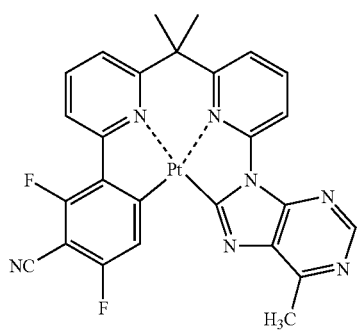
142 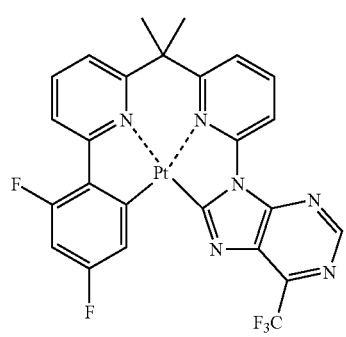
143 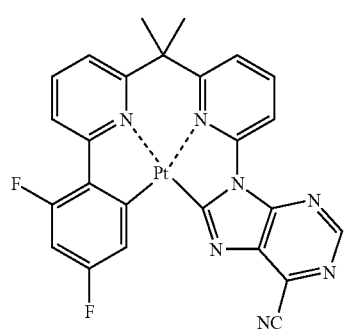
144 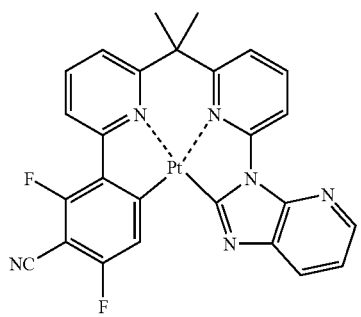
145 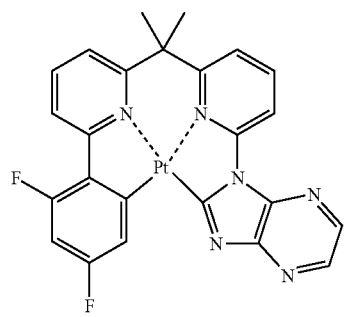
146 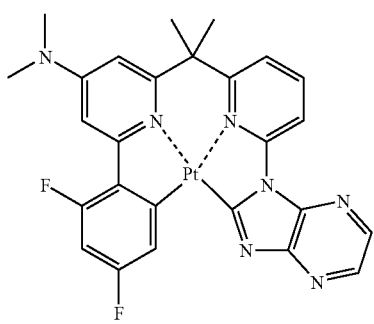
147 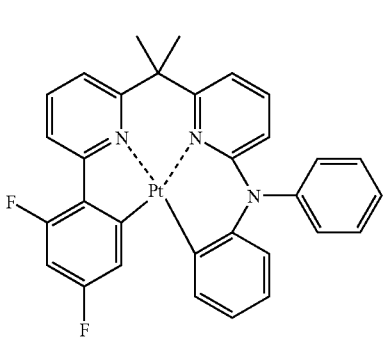
148 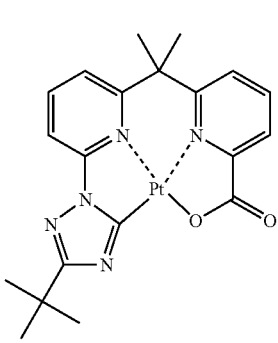
149 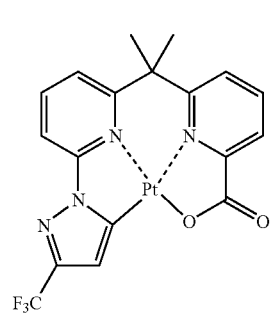
150 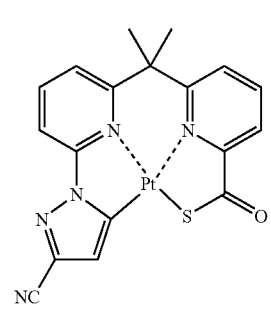

151 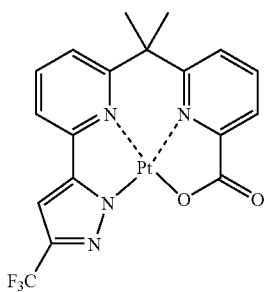
152 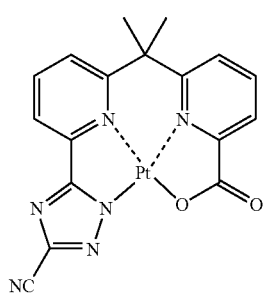
153 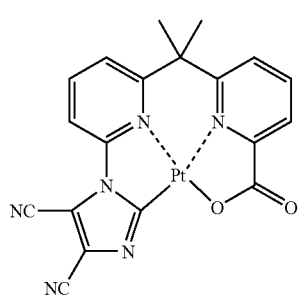
154 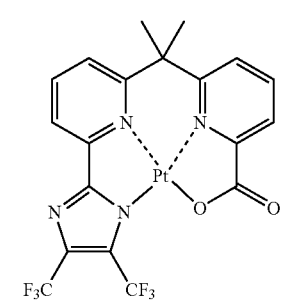
155 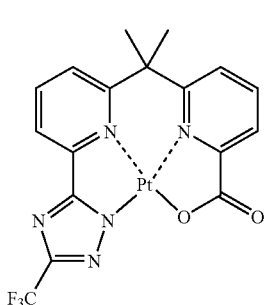
156 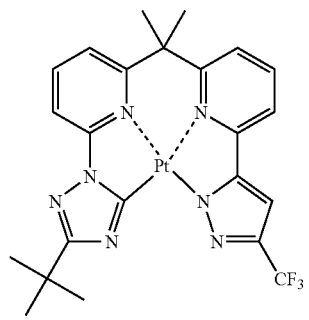
157 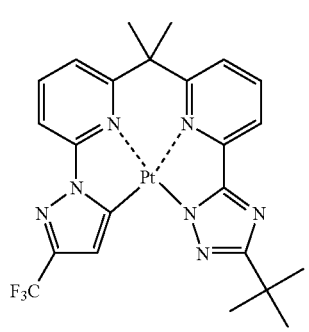
158 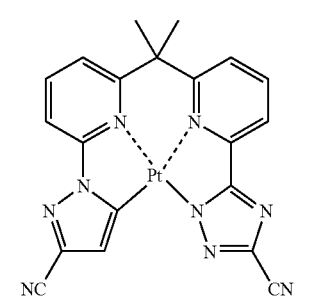
159 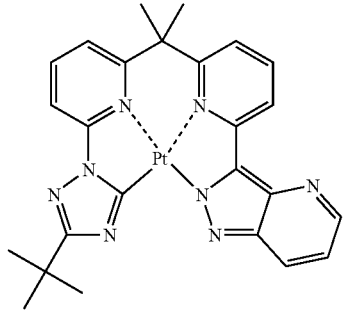
160 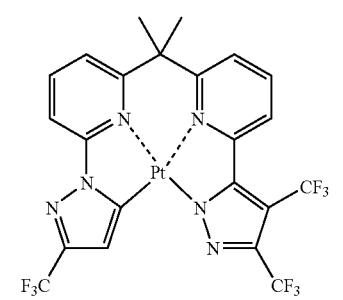

161 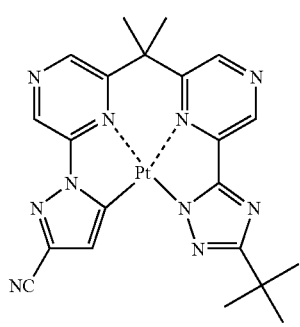
162 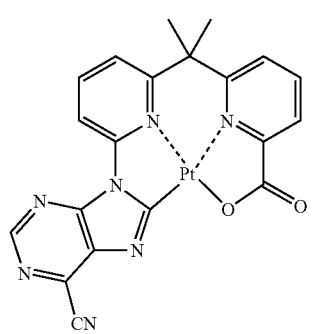
163 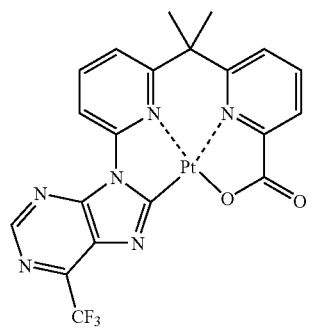
164 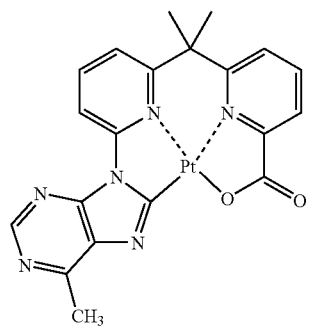
165 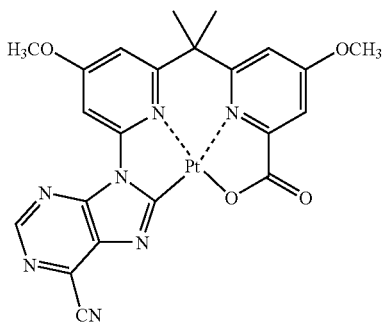
166 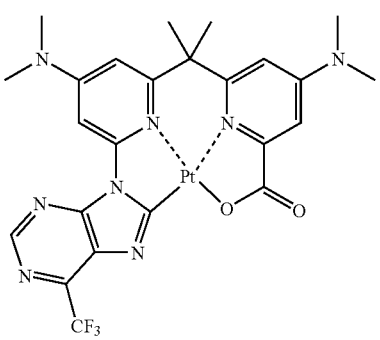
167 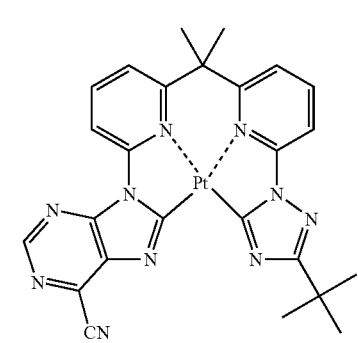
168 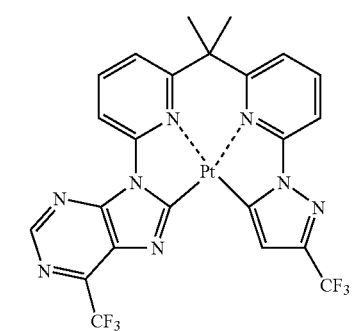
169 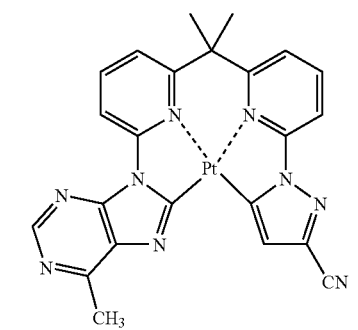
170 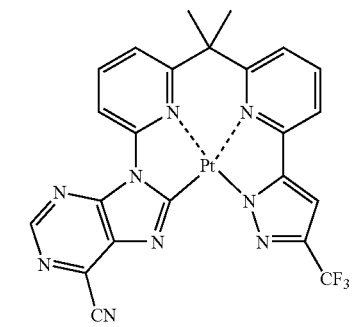

| | |
|---|---|
| 171 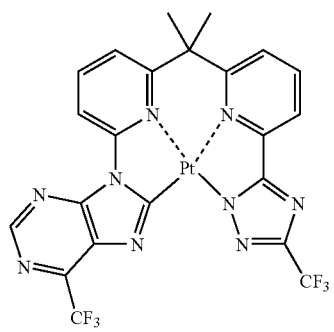 | 176 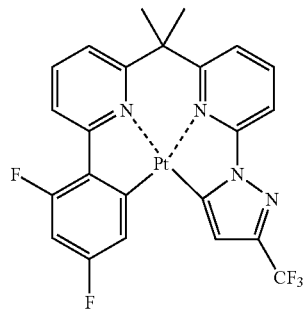 |
| 172 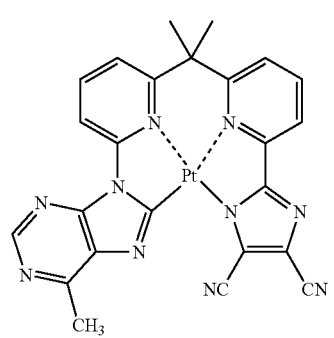 | 177 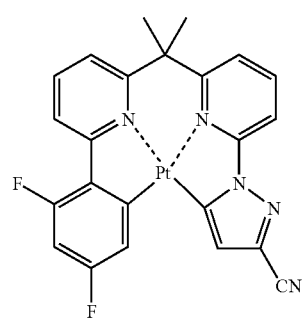 |
| 173 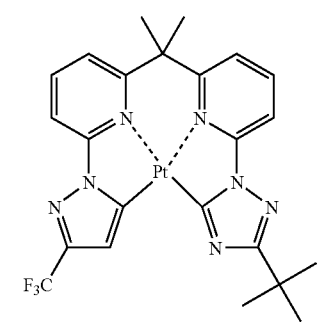 | 178 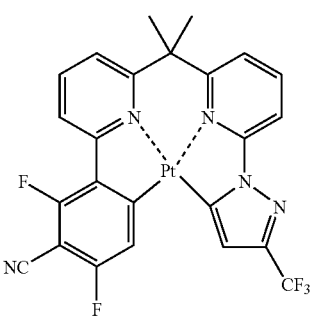 |
| 174 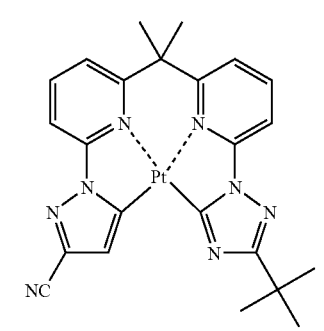 | 179 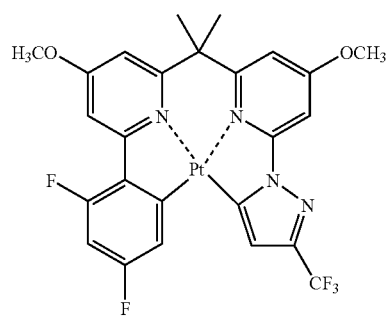 |
| 175 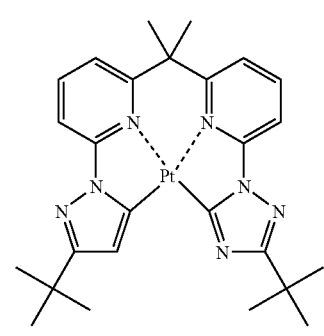 | 180 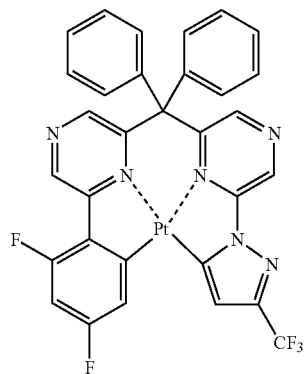 |

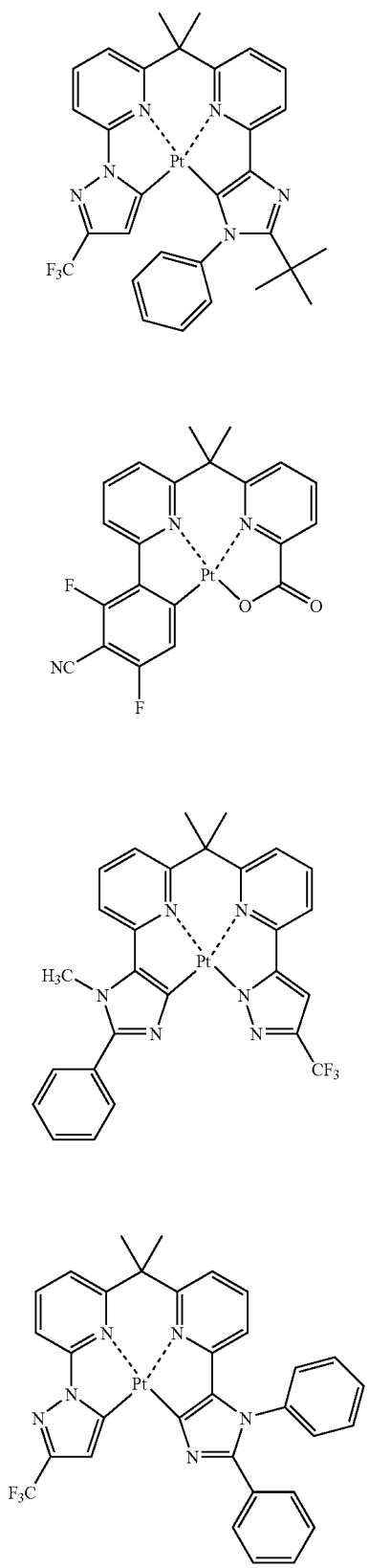
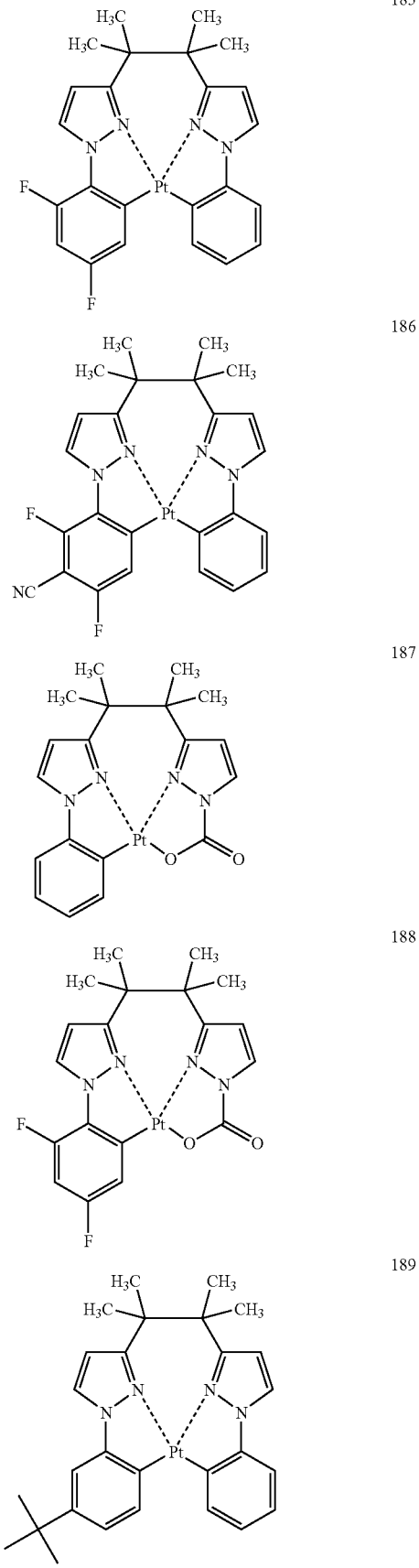

190 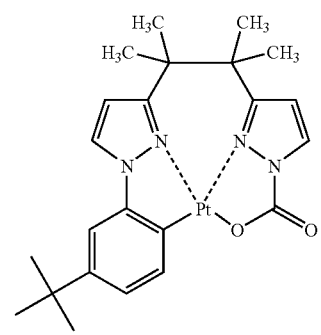
191 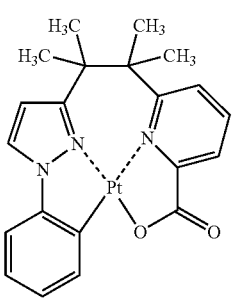
192 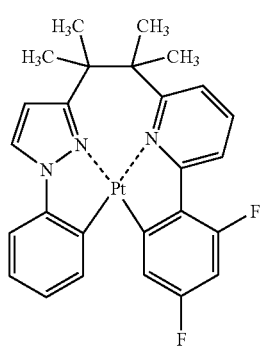
193 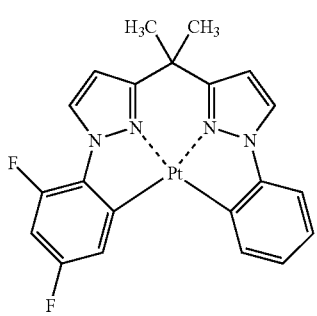
194 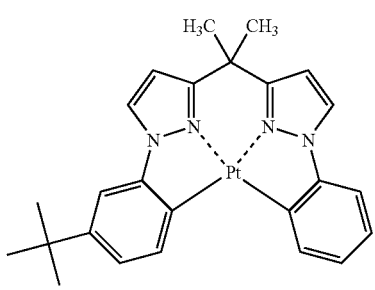
195 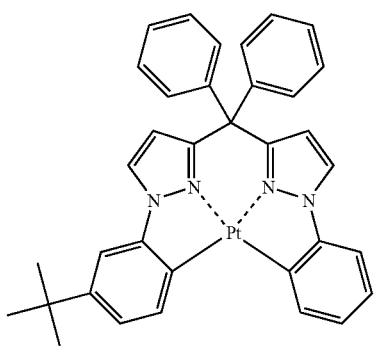
196 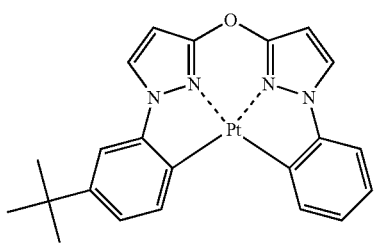
197 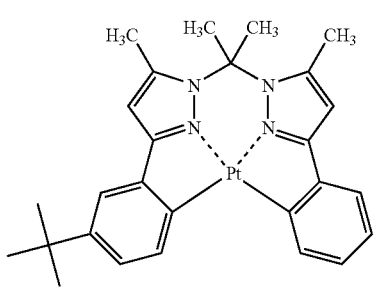
198 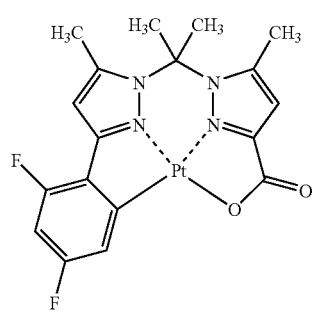
199 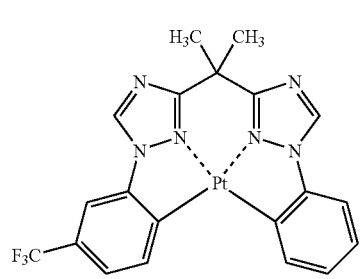

200 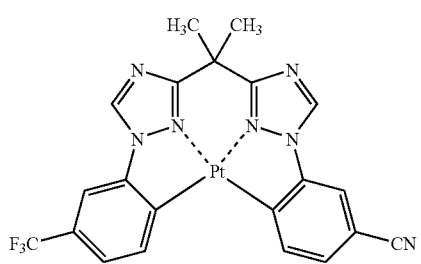
201 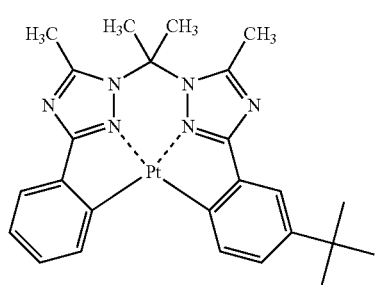
202 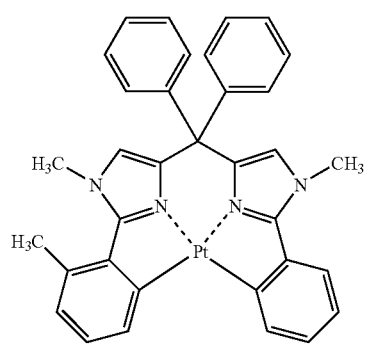
203 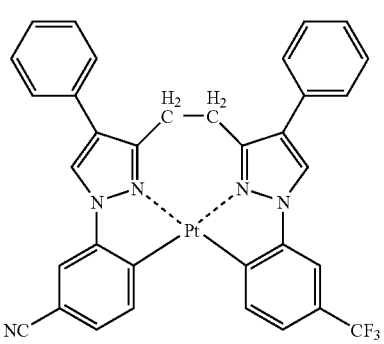
204 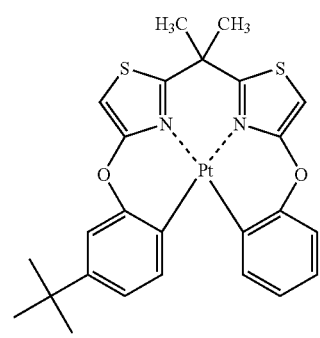
205 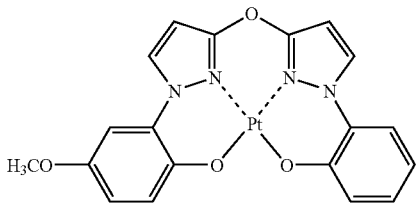
206 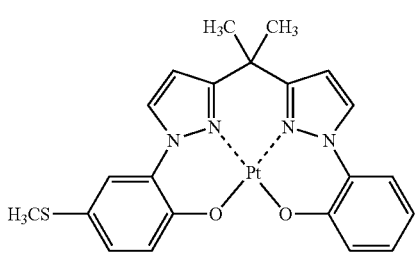
207 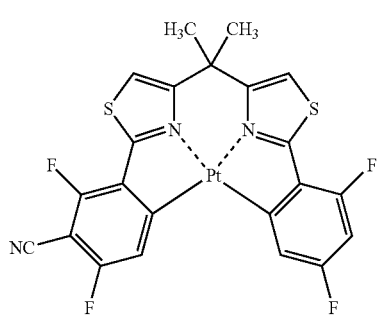
208 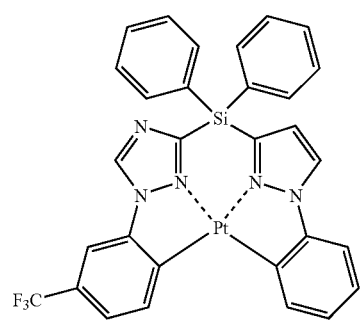
209 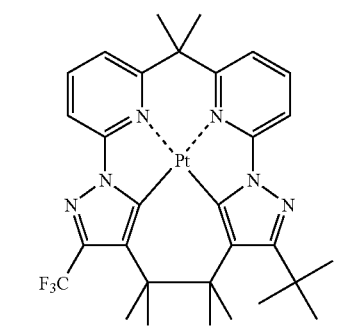

-continued
210
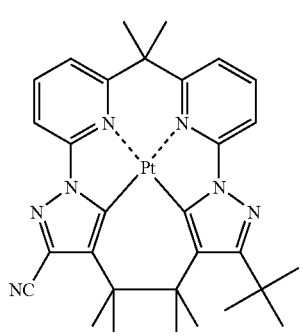
211
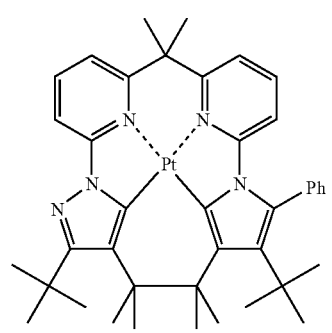
212
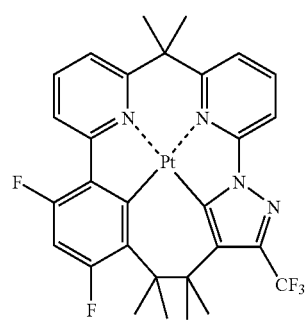
213
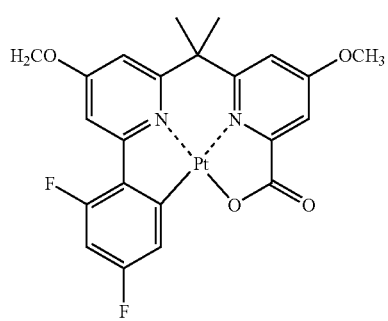
214
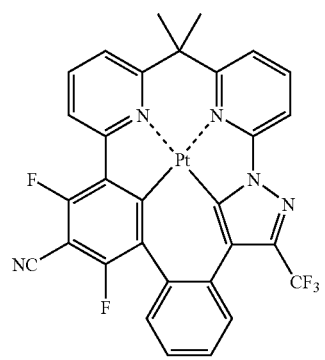
-continued
215
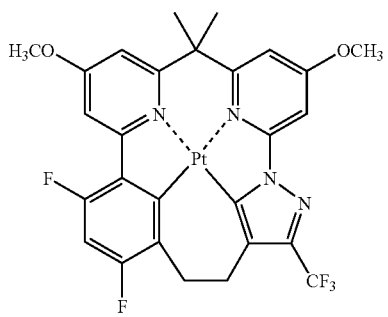
216
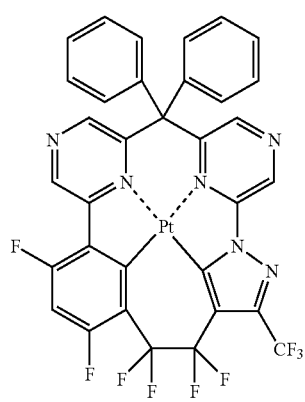
217
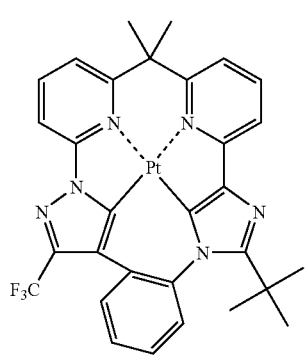
218
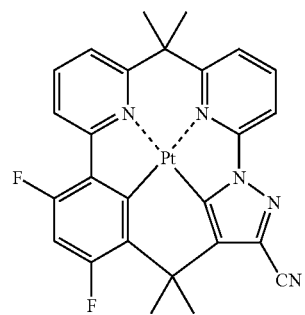

219 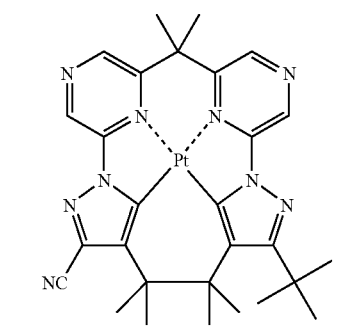
220 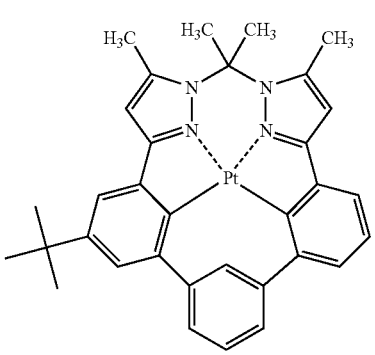
221 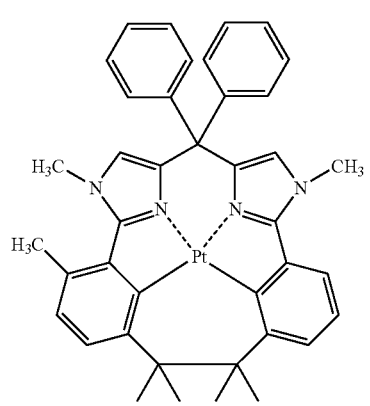
223 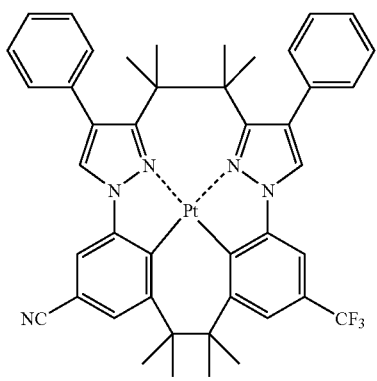
224 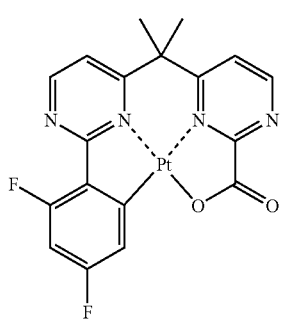
225 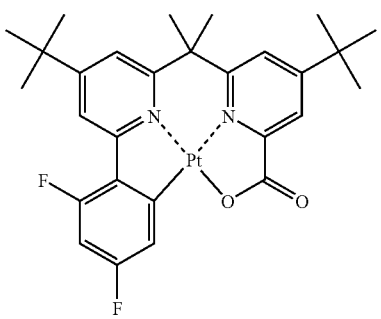

227 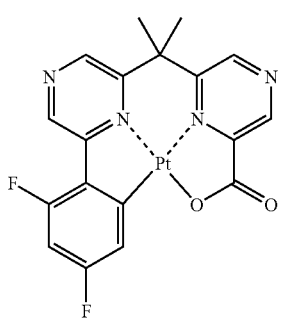
228 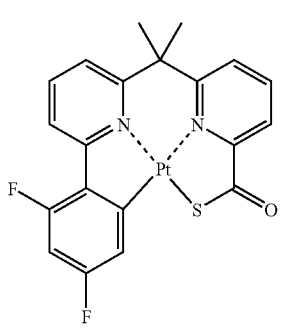
229
230
231 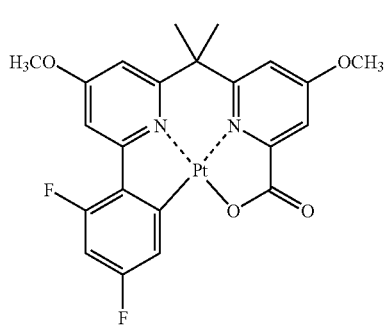
232 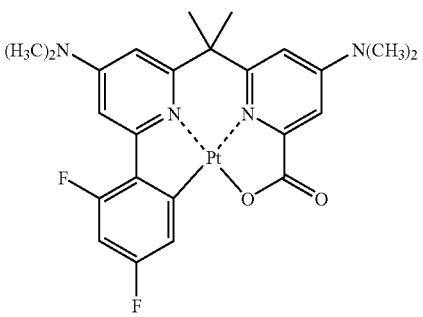
233 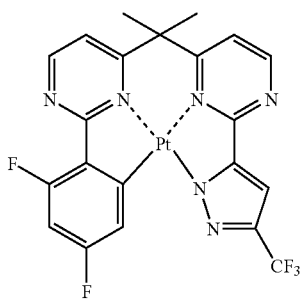
234 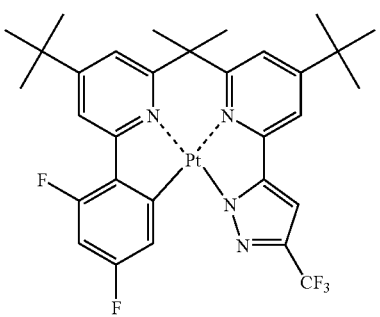
235 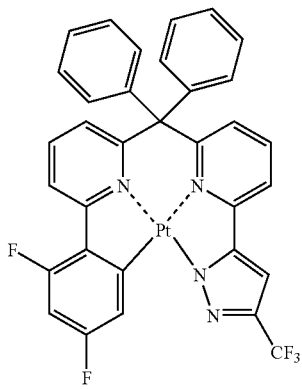
236 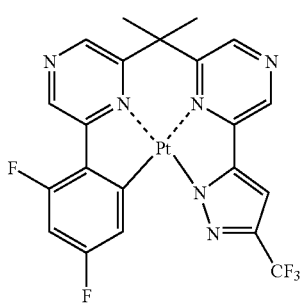

237
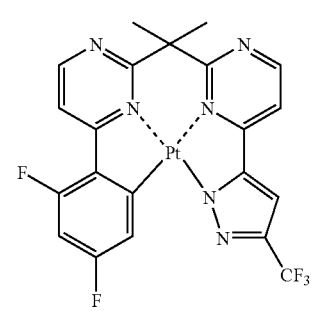
238
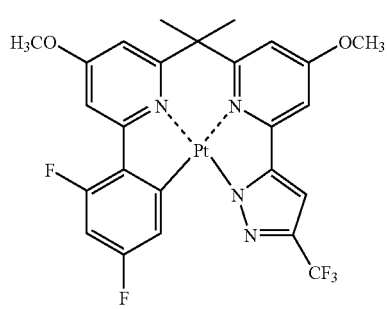
239
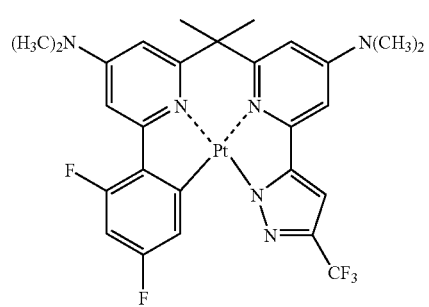
240
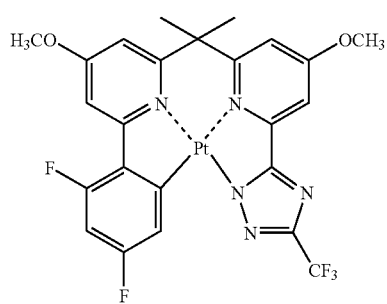
241
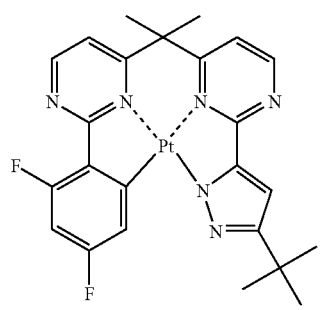
242
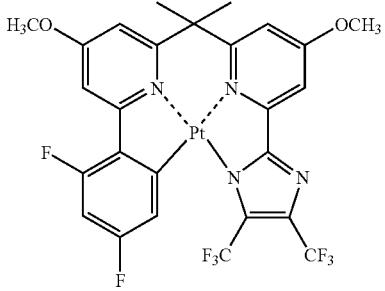
243
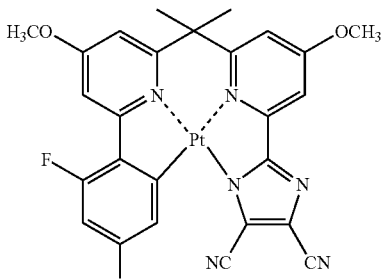
244
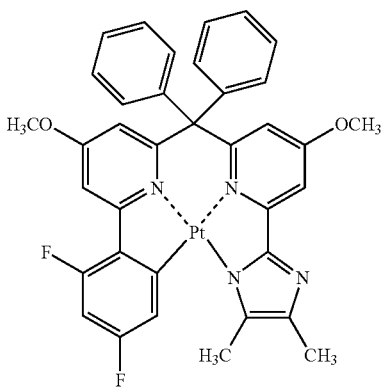
245
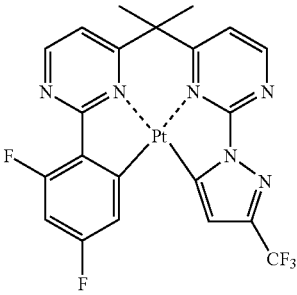
246
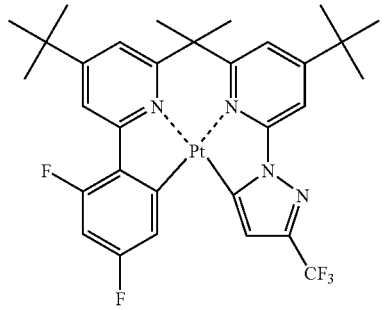

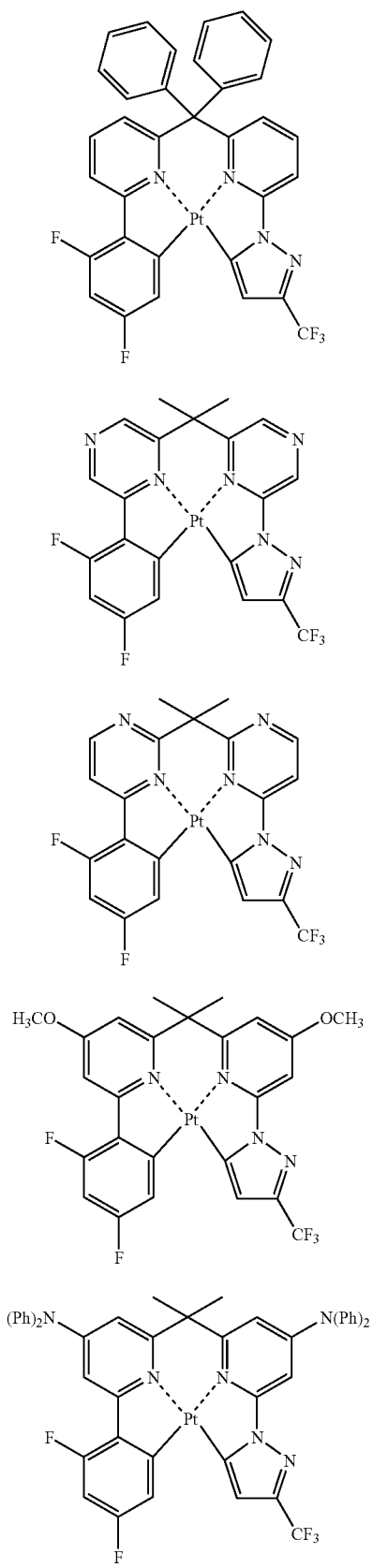
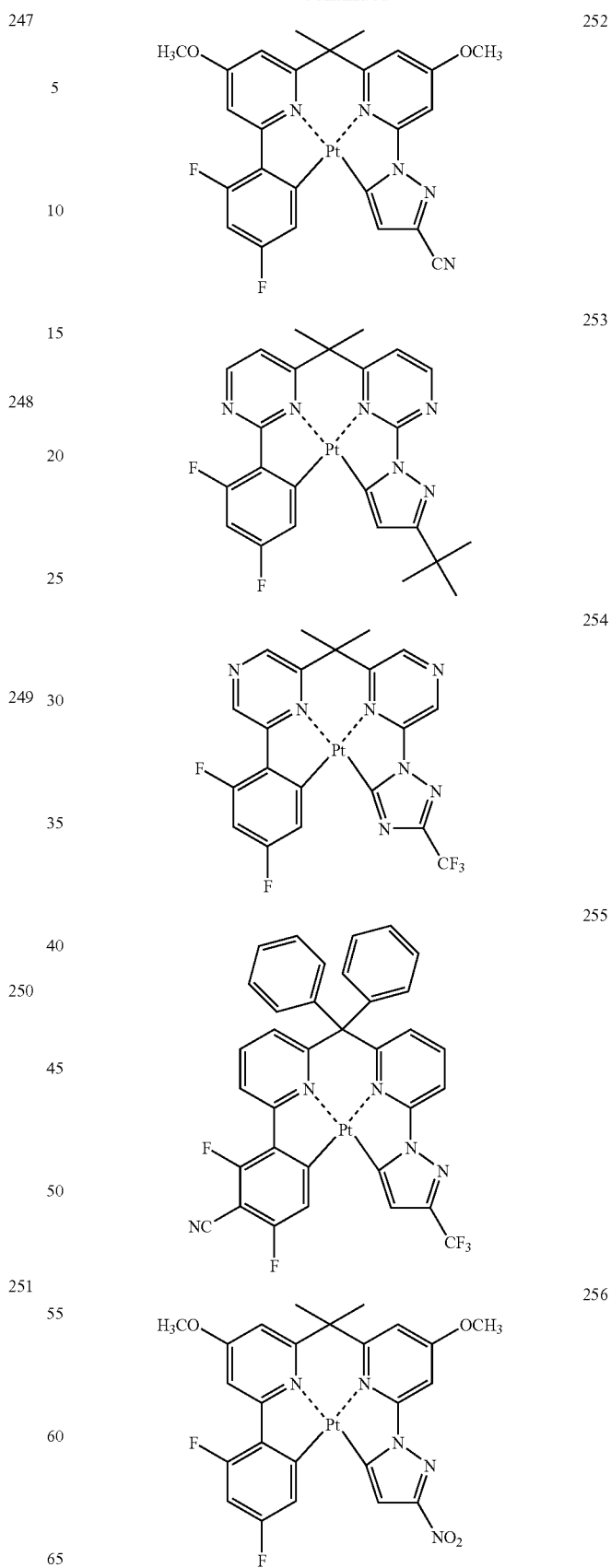

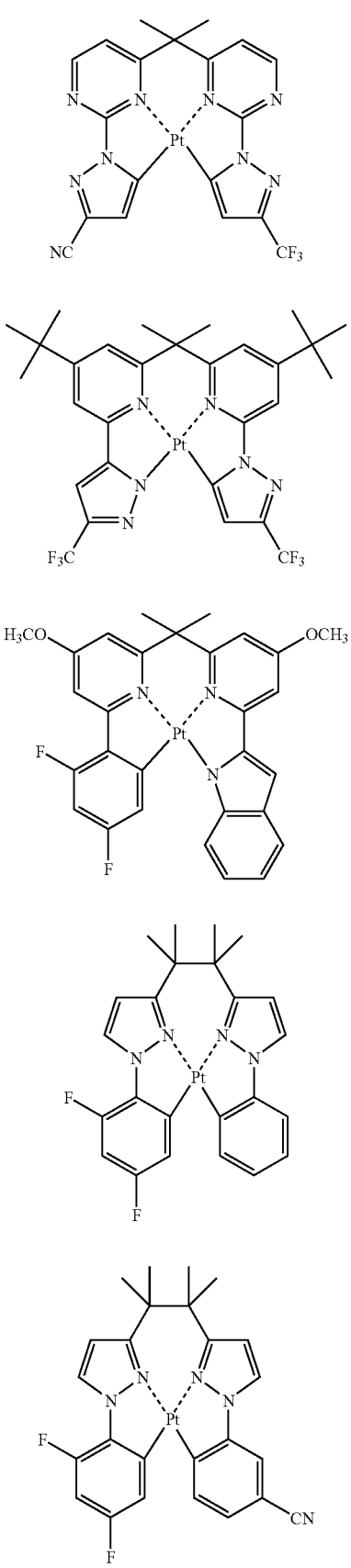
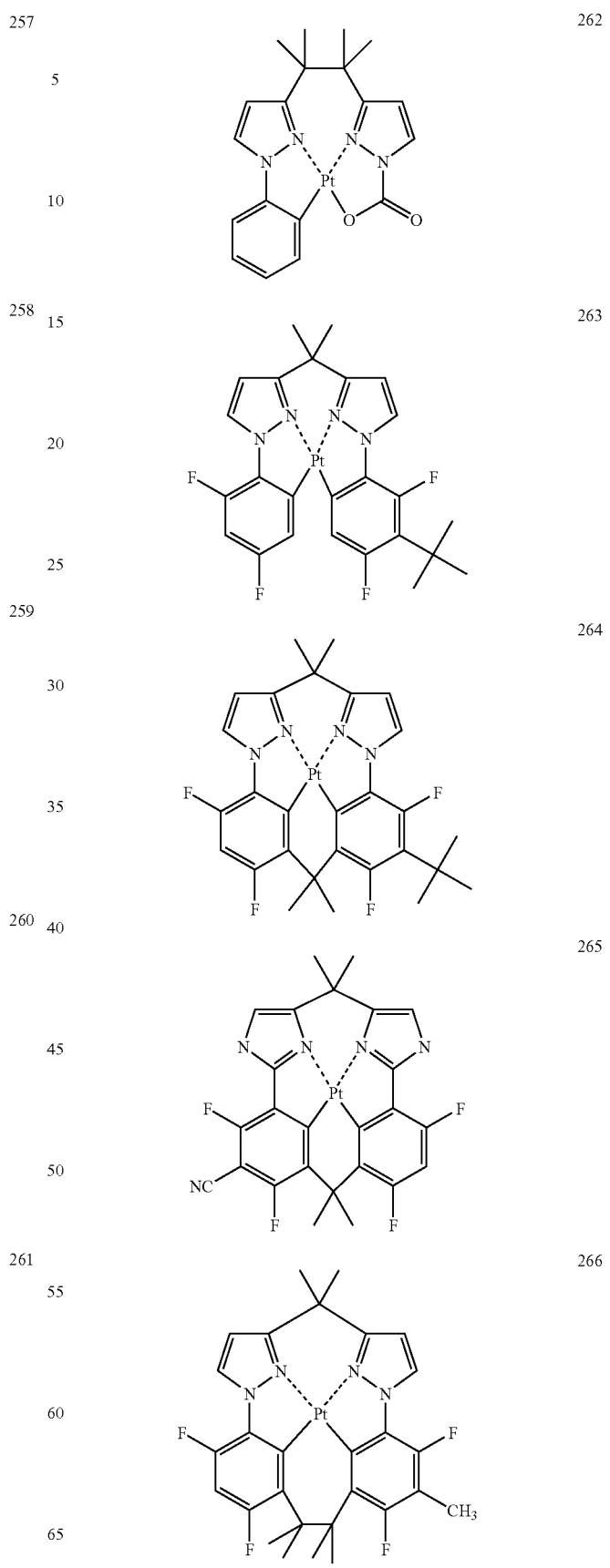

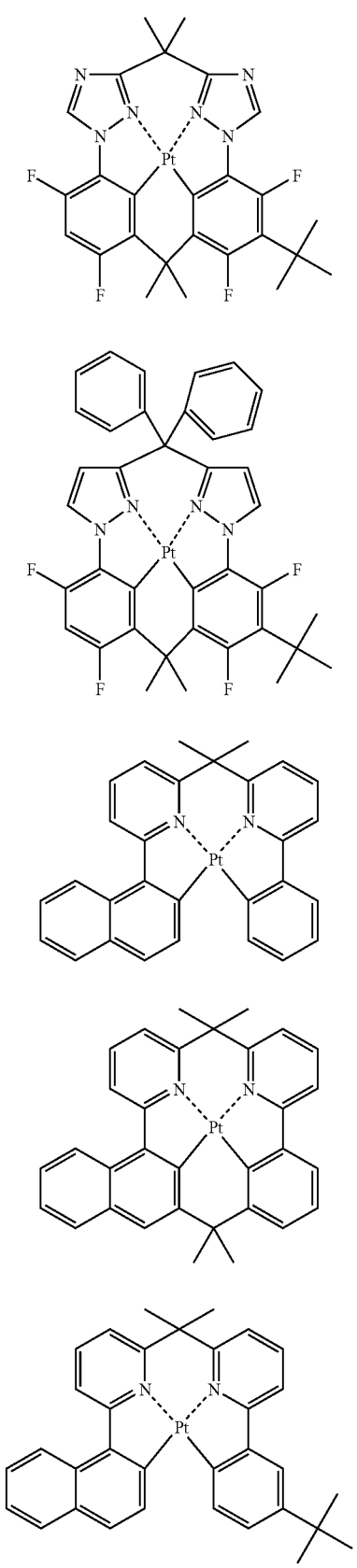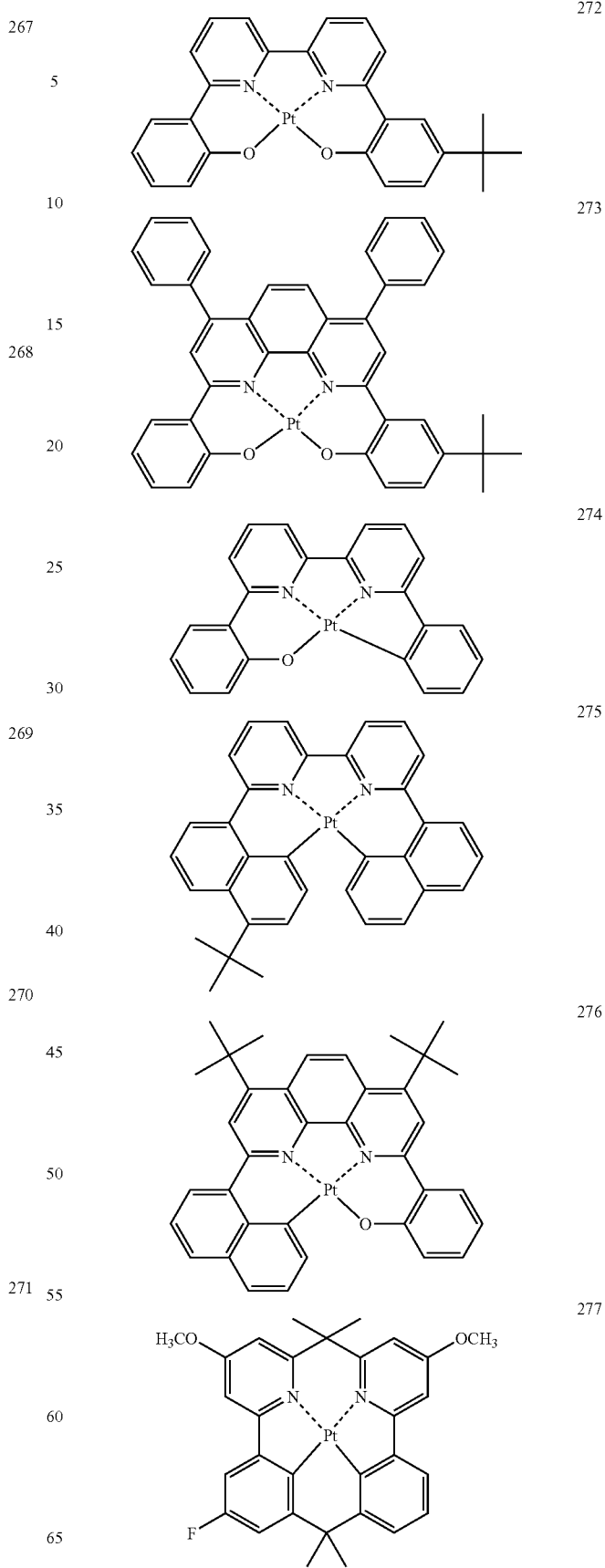

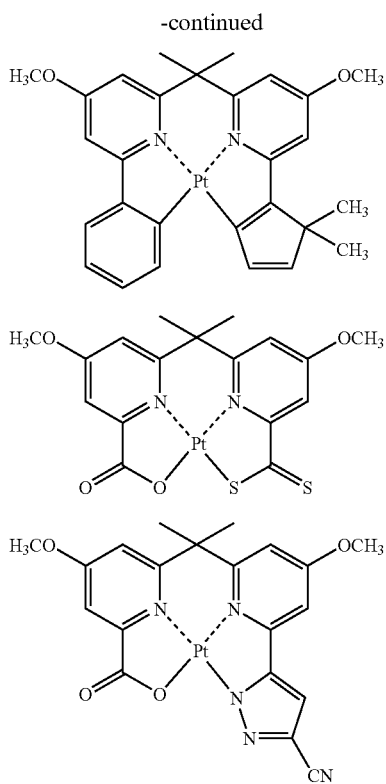

Next, the organic EL device containing the metal complex defined in the present invention will be explained.

The light-emitting device of the present invention may use a usual light-emitting system, driving method and utilization form, except for using the specific platinum complex defined in the present invention.

The specific platinum complex defined in the present invention can be used as any of a hole-injecting material, a hole-transporting material, a light-emitting material, an electron-injecting material, an electron-transporting material, a hole-blocking material, an electron-blocking material, and an exciton-blocking material. Among these, the platinum complex is preferably used as a light-emitting material. When this platinum complex is used as the light-emitting material, it may be used in the case of any of ultraviolet emission, visible light emission and infrared emission, or any of fluorescent light emission or phosphorescent emission. However, it is preferably used for visible light emission and phosphorescent emission.

The formation method of the organic compound layer that can be used in the present invention is not particularly limited, but includes resistance heating vapor deposition method, electrophotographic method, electron beam method, sputtering method, molecular lamination method, coating methods (such as spray coating method, dip coating method, impregnation method, roll coating method, gravure coating method, reverse coating method, roll brushing method, air knife coating method, curtain coating method, spin coating method, flow coating method, bar coating method, micro gravure coating method, air doctor coating method, blade coating method, squeeze coating method, transfer roll coating method, kiss coating method, cast coating method, extrusion coating method, wire bar coating method, and screen coating method), inkjet method, printing method, and transfer method. Among these, the resistance heating vapor deposition method, coating method, and transfer method are preferable from the standpoints of characteristics of devices, and production easiness and cost. When the light-emitting device has a laminating structure having two or more layers, the light-emitting device can be produced by combining the above methods.

In the coating method, the materials may be dissolved or dispersed together with a resin component. As the resin component, there are illustrated, for example, poly(vinyl chloride), polycarbonate, polystyrene, poly(methyl methacrylate), polyester, polysulfone, poly(phenylene oxide), polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, and silicone resin.

The light-emitting device of the present invention contains at least one light-emitting layer. The light-emitting device may contain, other than the light-emitting layer, an organic layer, such as a hole-injecting layer, a hole-transporting layer, an electron-injecting layer, an electron-transporting layer and a protective layer. Each of these layers may have other functions. The details of each layer will be explained hereinbelow.

As the materials for the hole-injecting layer and the hole-transporting layer, those materials may be used which have any one of the function of injecting holes from the anode side, the function of transporting holes, and the function of blocking electrons injected from the cathode. Specific examples thereof include, as well as the platinum complex defined in the present invention, carbazole, imidazole, triazole, oxazole, oxadiazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, stilylamine, aromatic dimethylidene-series compounds, porphyrin-series compounds, polysilane-series compounds poly(N-vinylcarbazole), aniline-series copolymers, thiophene oligomers, conductive high molecular oligomers such as polythiophene, organic metal complexes, transition metal complexes, and derivatives thereof.

Thickness of the hole-injecting layer and the hole-transporting layer is not particularly limited, but is preferably 1 nm to 5 μm, more preferably 5 nm to 1 μm, and still more preferably 10 nm to 500 nm. The hole-transporting layer may be of a single layer structure composed of one or more of the above-described materials, or may be of a multi-layer structure composed of a plurality of layers having the same composition or different compositions.

Materials for the electron-injecting layer and the electron-transporting layer may be any, as long as they have any of the function of injecting electrons from the cathode, the function of transferring electrons and the function of blocking holes injected from the anode. Specific examples thereof include triazole, triazine, oxazole, oxadiazole, fluorenone, anthraquinodimethane, anthrone, diphenylquinone, thiopyran dioxide, carbodiimide, fluorenylidenemethane, distyrylpyrazine, silole, aromatic tetracarboxylic anhydrides of naphthalene, perylene and the like, phthalocyanine, various metal complexes represented by metal complexes of 8-quinolinol derivatives, metallophthalocyanine, metal complexes each having benzoxazole or benzothiazole as a ligand, and derivatives of these compounds, as well as the platinum complex defined in the present invention.

Thickness of the electron-injecting layer and the electron-transporting layer is not particularly limited, but is preferably 1 nm to 5 μm, more preferably 5 nm to 1 μm, and still more preferably 10 nm to 500 nm. The electron-injecting layer and the electron-transporting layer may be of a single layer structure composed of one or more of the above-described materials, or may be of a multi-layer structure composed of a plurality of layers having the same composition or different compositions.

Materials of the light-emitting layer may be any, as long as they have the function of receiving holes from the anode, the hole-injecting layer, the hole-transporting layer or the like at the time of voltage application, and they have also any of the function of receiving electrons from the cathode, the electron-injecting layer, the electron-transporting layer or the like, the function of transporting injected charges, the function of providing the field of recombination of holes with electrons to form excitons, the function of transferring excited energy, and the function of emitting light from excitons. Examples of the materials used in the light-emitting layer include, as well as the platinum complex defined in the present invention, benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bis(styryl)anthracene, quinacridone, pyrrolopyridine, thiadiazolopyridine, styrylamine, aromatic dimethylidyne compounds, polymer compounds such as polythiophene, polyphenylene and polyphenylenevinylene, carbazole, imidazole, triazole, oxazole, oxadiazole, polyarylalkane, pyrazoline, pyrazolone, phenylenediamine, arylamine, amino-substituted chalcone, styrylanthracene, fluorenone, hydrazine, stilbene, silazane, aromatic tertiary amine compounds, styrylamine, aromatic dimethylidene compounds, porphyrin-type compounds, polysilane-type compounds, poly(N-vinylcarbazole), conductive high-molecular oligomers such as aniline-type copolymers, thiophene oligomer and polythiophene, organic metal complexes, transition metal complexes, metal complexes of triazole, triazine, oxazole, oxadiazole, fluorenone, anthraquinonedimethane, anthrone, diphenylquinone, thiopyran dioxide, carbodimide, fluorenylidenemethane, distyrylpyrazine, silol, aromatic cyclic tetracarboxylic acid anhydrides such as naphthalene and perylene, phthalocyanine and 8-quinolinol derivative, metal phthalocyanine, various metal complexes represented by metal complexes each having benzoxazole or benzothiazole as a ligand, and derivatives of the above compounds.

The light-emitting layer may be of a single layer or a multi-layer composed of a plurality of layers. When the light-emitting layer is made of a plurality of layers, each layer may emit light having a different color. Even when the light-emitting layer is constituted of a plurality of layers, each layer is preferably constituted only of a phosphorescent material and a metal complex. Although there is no particular limitation on the thickness of the light-emitting layer, it is usually preferably from 1 nm to 5 µm, more preferably from 5 nm to 1 µm, and most preferably from 10 nm to 500 nm.

As materials for the protective layer, any material may be used that can prevent substances capable of accelerating deterioration of the device, such as moisture or oxygen, from invading into the device. Specific examples thereof include metals, e.g. In, Sn, Pb, Au, Cu, Ag, Al, Ti, and Ni; metal oxides, e.g. MgO, SiO, $SiO_2$, $Al_2O_3$, GeO, NiO, CaO, BaO, $Fe_2O_3$, $Y_2O_3$, and $TiO_2$; metal fluorides, e.g. $MgF_2$, LiF, $AlF_3$, and $CaF_2$; polyethylene, polypropylene, poly(methyl methacrylate), polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing at least one comonomer and tetrafluoroethylene, a fluorine-containing copolymer having a cyclic structure in the main chain of the copolymer, a water-absorbing substance showing a water absorption of 1% or more, and a moisture barrier substance showing a water absorption of 0.1% or less.

A method for forming the protective layer is not particularly limited, and use may be made, for example, of a vacuum deposition method, a sputtering method, a reactive sputtering method, an MBE (molecular beam epitaxy) method, a cluster ion beam method, an ion plating method, a plasma polymerization method (high frequency-excited ion plating method), a plasma CVD (chemical vapor deposition) method, a laser CVD method, a heat CVD method, a gas source CVD method, a coating method, an inkjet method, a printing method, a transfer method, or an electrophotographic method.

The anode, supplying holes to the hole-injecting layer, the hole-transporting layer, the light-emitting layer and the like, may be formed of metals, alloys, metal oxides, electric conductive compounds, mixtures thereof, and the like, preferably materials having a work function of 4 eV or more. Specific examples thereof include conductive metal oxides such as tin oxide, zinc oxide, indium oxide, indium tin oxide (ITO), and the like; metals such as gold, silver, chromium, nickel, and the like; further mixtures or laminates of the metals with the conductive metal oxides; inorganic conductive materials such as copper iodide, copper sulfide, and the like; organic conductive materials such as polyaniline, polythiophene, polypyrrole, and the like; and mixtures or laminates thereof with ITO. Conductive metal oxides are preferred, and ITO is particularly preferred in terms of productivity, high conductivity, and transparency. The thickness of the anode may be appropriately selected depending on the kind of the material, preferably from 10 nm to 5 µm, more preferably from 50 nm to 1 µm, and further preferably from 100 nm to 500 nm.

As the anode, one in which layer formation is carried out on soda-lime glass, non-alkali glass, or a transparent resin substrate is usually used. When glass is used, non-alkali glass is preferably used for decreasing ions eluted from glass. When soda-lime glass is used, it is preferable to use one provided with a barrier coat of silica or the like. There is no particular limitation on the thickness of the substrate, as long as it is sufficient to keep its mechanical strength. When glass is used, the thickness is usually 0.2 mm or more, and preferably 0.7 mm or more. Various methods are used for the preparation of the anodes depending on the kind of the material. For example, in case of ITO, film formation may be carried out by a method such as electron beam method, sputtering method, resistance heating vapor deposition method, ion plating method, chemical reaction method (e.g., sol-gel method), spraying method, dipping method, heat CVD method, plasma CVD method, coating of a dispersion of ITO, and the like. According to treatments of the anode such as washing and others, the driving voltage for the device may be reduced and the luminous efficiency may be raised. For example, in a case of ITO, UV-ozone treatment, plasma treatment and the like are effective.

The cathode supplies electrons to the electron-injecting layer, the electron-transporting layer, the light-emitting layer and the like. The material for the cathode may be selected considering ionization potential, stability, and adhesion to layers adjacent to the cathode, such as the electron-injecting layer, the electron-transporting layer, and the light-emitting layer. As the material for the cathode, metals, alloys, metal oxides, electric conductive compounds, or mixtures thereof may be used. Specific examples thereof include alkali metals (for example, Li, Na, K and Cs) or fluorides thereof, alkali earth metals (for example, Mg and Ca) or fluorides thereof, gold, silver, lead, aluminum, sodium-potassium alloys or mixed metals thereof, lithium-aluminum alloys or mixed metals thereof, magnesium-silver alloys or mixed metals thereof, and rare earth metals such as indium and ytterbium. Materials having a work function of 4 eV or less are preferred, more preferably aluminum, lithium-aluminum alloys or mixed metals thereof, magnesium-silver alloys or mixed metals thereof, or the like.

The film thickness of the cathode can be appropriately selected depending on the material, and is preferably from 10 nm to 5 µm, more preferably from 50 nm to 1 µm, and further preferably from 100 nm to 1 µm.

For the preparation of the cathode, methods such as electron beam method, sputtering method, resistance heating vapor deposition method, and coating method may be used. The metals may be vapor deposited as simple substances, or two or more components may be vapor deposited at the same time. Further, it is also possible to vapor deposit a plurality of metals at the same time to form an alloy electrode, or an alloy previously prepared may also vapor deposited.

The anode and the cathode with low sheet resistance are preferable, and those with several-hundred Ω/□ or less are more preferable.

The light-extraction efficiency in the light-emitting device of the present invention can be improved by various known techniques. For example, surface structuring of the substrate (for example, formation of a fine concave-convex pattern), controlling the refractive index of the substrate, ITO layer, or organic layer(s), and controlling the thickness of the substrate, ITO layer, or organic layer(s), can be included. These improvements can lead to increase light-extraction efficiency and external quantum efficiency.

The external quantum efficiency of the light-emitting device of the present invention is preferably 5% or more, more preferably 10% or more, and still more preferably 15%, or more. As the value of the external quantum efficiency, the maximum value of the external quantum efficiency when the device is driven at 25° C. or the value of the external quantum efficiency at a luminance close to 300 to 2000 cd/m$^2$ when the device is driven at 25° C. can be used.

The light-emitting device of the present invention may be of a so-called top emission type, in which light is emitted from the anode side of the device.

Examples of the substrate material used for the light-emitting device of the present invention, is not particularly limited, include inorganic materials such as zirconia-stabilized yttrium, glass and the like; and macromolecular (high molecular) materials such as polyesters (for example, polyethylene terephthalate, polybutylene terephthalate, and polyethylene naphthalate), polyethylenes, polycarbonates, polyethersulfones, polyarylates, allyldiglycolcarbonates, polyimides, polycycloolefins, norbornene resins, poly(chlorotrifluoroethylene), Teflon (registered trade mark), and polytetrafluoroethylene-polyethylene copolymers.

The light-emitting layer of the organic electroluminescence device of the present invention may have at least one layered structure. The number of layers in this layered structure is preferably from 2 to 50, more preferably from 4 to 30, and further preferably from 6 to 20.

The thickness of each of the layers constituting the layered structure is not particularly limited, but it is preferably from 0.2 to 20 nm, more preferably from 0.4 to 15 nm, even more preferably from 0.5 to 10 nm, and particularly preferably from 1 to 5 nm.

The light-emitting layer of the organic electroluminescence device of the present invention may have plural domain structures. The light-emitting layer may contain therein some other domain structure. The diameter of each of the domain structures is preferably from 0.2 to 10 nm, more preferably from 0.3 to 5 nm, even more preferably from 0.5 to 3 nm, and particularly preferably from 0.7 to 2 nm.

The organic EL device of the present invention can be preferably used for display devices, displays, back light, electrophotography, light source for lighting equipment, recording, light-exposure or reading, indicator, signboard, interior and optical communication.

The present invention will be described in more detail based on the following examples, but the invention is not intended to be limited thereto.

EXAMPLES

Synthetic Examples

Synthesis of the Exemplified Compound 4

The ligand 4 could be synthesized using known methods described in documents, and was synthesized using SM as a starting material (see Journal of Organic Chemistry, 53, 786-790 (1988)) by known organic synthetic methods.

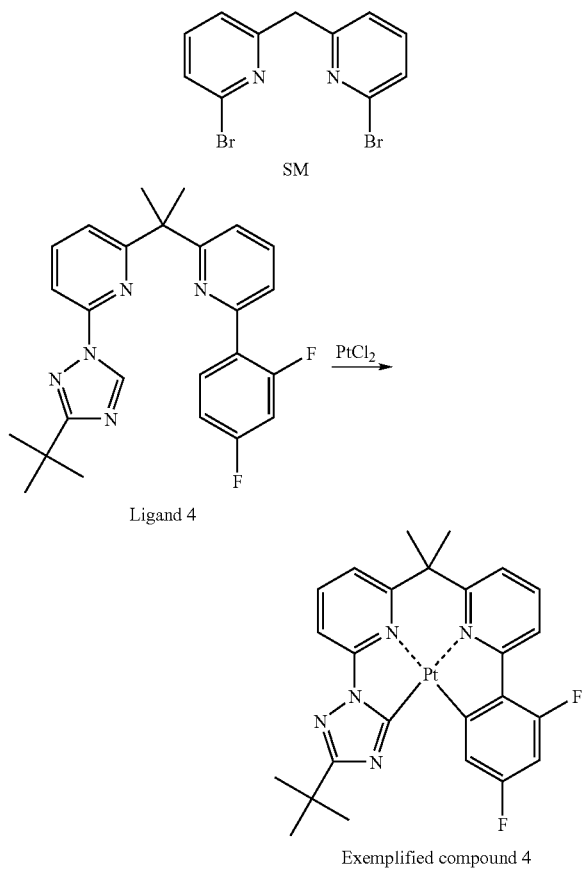

Exemplified compound 4

Under a nitrogen flow, 390 mg of the ligand 4 and 239 mg of platinous chloride were suspended in 5 mL of benzonitrile, and the mixture was raised up to 200° C. and heated for 3 hours. The reaction mixture was cooled to a room temperature, and hexane was then added to the mixture, to obtain precipitates. These precipitates were collected by filtration and then purified by using a silica gel column (eluent: chloroforin), to obtain 320 mg of the exemplified compound 4 (yield: 57%).

Synthesis of the Exemplified Compound 182

The ligand 182 was synthesized using SM as a starting material by a known organic synthetic method. Under a nitrogen atmosphere, 300 mg of the ligand 182 and 210 mg of platinous chloride were suspended in 6 mL of benzonitrile, and the mixture was heated to 150° C. and stirred at the temperature for 6 hours. After the reaction was finished, hexane was added to the reaction mixture, and the precipitated solid was heated in a mixed solvent of chloroform and methanol. The solid precipitated by cooling was collected by filtration, to obtain 200 mg of the exemplified compound 182 (yield: 44%).

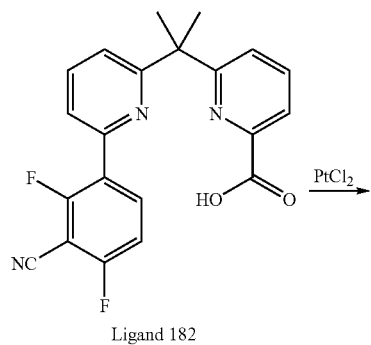

Ligand 182

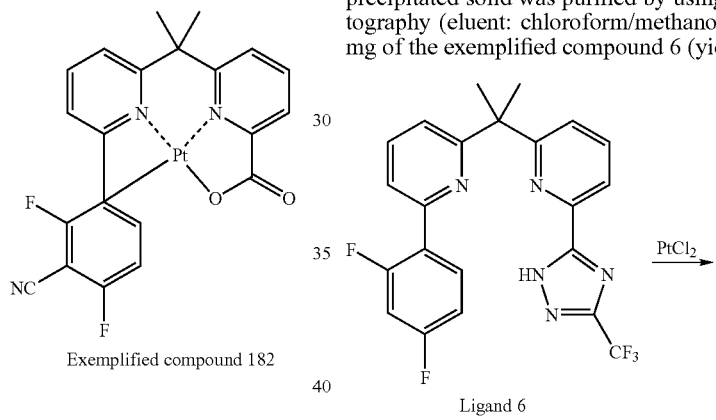

Exemplified compound 182

Synthesis of the Exemplified Compound 5

The ligand 5 was synthesized using SM as a starting material by a known organic synthetic method. Under a nitrogen atmosphere, 350 mg of the ligand 5 and 210 mg of platinous chloride were suspended in 4 mL of benzonitrile, and the mixture was heated to 120° C. and stirred at the temperature for 6.5 hours. After the reaction was finished, hexane was added to the reaction mixture, and the precipitated solid was heated in a mixed solvent of chloroform and methanol. The solid precipitated by cooling was collected by filtration, to obtain 430 mg of the exemplified compound 5 (yield: 86%).

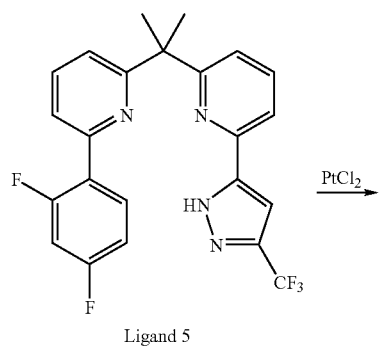

Ligand 5

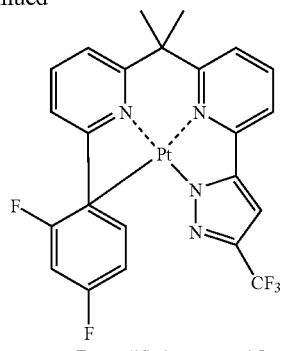

Exemplified compound 5

Synthesis of the Exemplified Compound 6

The ligand 6 was synthesized using SM as a starting material by a known organic synthetic method. Under a nitrogen atmosphere, 64 mg of the ligand 6 and 39 mg of platinous chloride were suspended in 3 mL of benzonitrile, and the mixture was stirred at 120° C. for 3 hours and then further stirred at 150° C. for 2.5 hours. After the reaction was finished, hexane was added to the reaction mixture, and the precipitated solid was purified by using a silica gel chromatography (eluent: chloroform/methanol=10/1), to obtain 48 mg of the exemplified compound 6 (yield: 52%).

Ligand 6

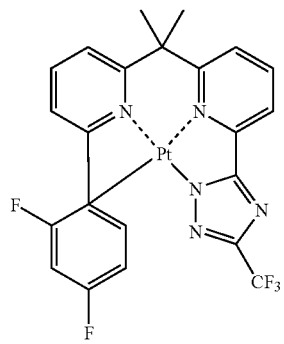

Exemplified compound 6

Synthesis of the Exemplified Compound 7

The ligand 7 was synthesized using SM as a starting material by a known organic synthetic method. Under a nitrogen flow, 390 mg of the ligand 7 and 293 mg of platinous chloride were suspended in 5 mL of benzonitrile, and the mixture was raised up to 200° C. and heated for 3 hours. The reaction mixture was cooled to a room temperature, and hexane was then added to the mixture, to obtain precipitates. These precipitates were collected by filtration and then purified by using a silica gel column (eluent: chloroform), to obtain 488 mg of the exemplified compound 7 (yield: 81%).

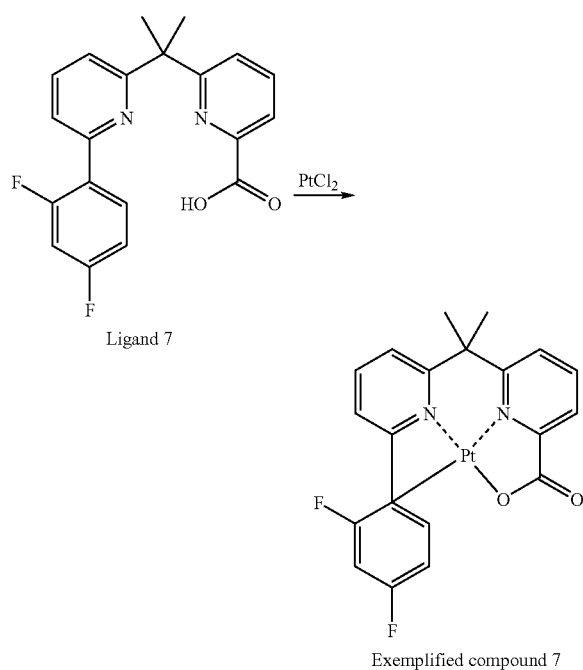

Synthesis of the Exemplified Compound 213

The ligand 213 was synthesized by a known organic synthetic method. Under a nitrogen flow, 45 mg of the ligand 213 and 66 mg of platinous chloride were suspended in 5 mL of benzonitrile, and the mixture was raised up to 200° C. and heated for 3 hours. The reaction mixture was cooled to a room temperature, and hexane was then added to the mixture, to obtain precipitates. These precipitates were collected by filtration and then purified by using a silica gel column (eluent: chloroform), to obtain 35 mg of the exemplified compound 213 (yield: 53%).

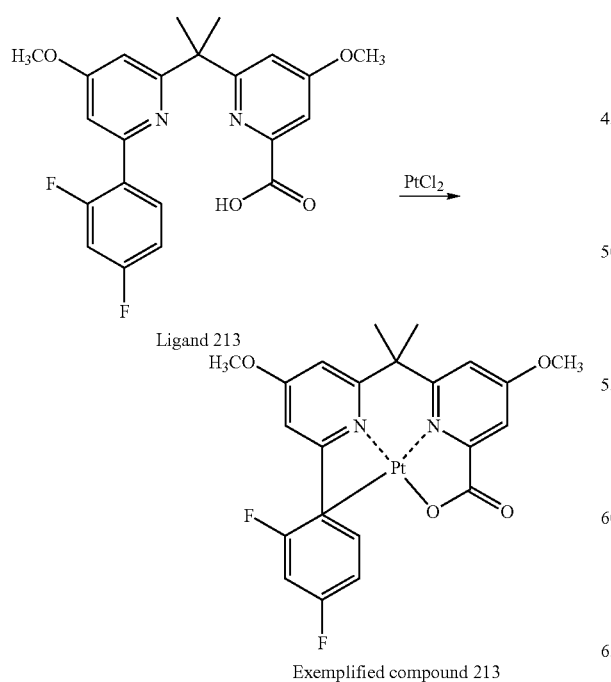

Organic EL Device

Comparative Example 1

A cleaned ITO substrate was placed in a vacuum deposition apparatus, and NPD was vacuum-deposited thereon in a thickness of 50 nm. Further, CBP and Ir(ppy)$_3$ were vacuum-deposited thereon in a thickness of 40 nm with a mass ratio of 10:1, and Balq was vacuum-deposited thereon in a thickness of 10 nm, and, further, Alq was vacuum-deposited thereon in a thickness of 30 nm. On the thus-obtained organic thin film, a patterned mask (light-emitting area: 4 mm×5 mm) was provided. After vacuum-depositing lithium fluoride in a thickness of 3 nm, aluminum was vacuum-deposited thereon in a thickness of 60 nm, to prepare an organic EL device of the comparative example 1. When a direct current constant voltage was applied to the thus-obtained organic EL device, green color emission having an emission maximum wavelength $\lambda_{max}$ of 514 nm was observed, and the external quantum efficiency of the organic EL device was 6.4%.

Comparative Example 2

An organic EL device of the comparative example 2 was prepared in the same manner as in the comparative example 1, except that PtOEP was used in place of Ir(ppy)$_3$. When a direct current constant voltage was applied to the thus-obtained organic EL device, red color emission having an emission maximum wavelength $\lambda_{max}$ of 650 nm was observed, and the external quantum efficiency of the organic EL device was 2.7%.

Comparative Example 3

An organic EL device of the comparative example 3 was prepared in the same manner as in the comparative example 1, except that the complex I (the compound described in U.S. Pat. No. 6,653,654) was used in place of Ir(ppy)$_3$. When a direct current constant voltage was applied to the thus-obtained organic EL device, red color emission having an emission maximum wavelength $\lambda_{max}$ of 600 nm was observed, and the external quantum efficiency of the organic EL device was 3.7%.

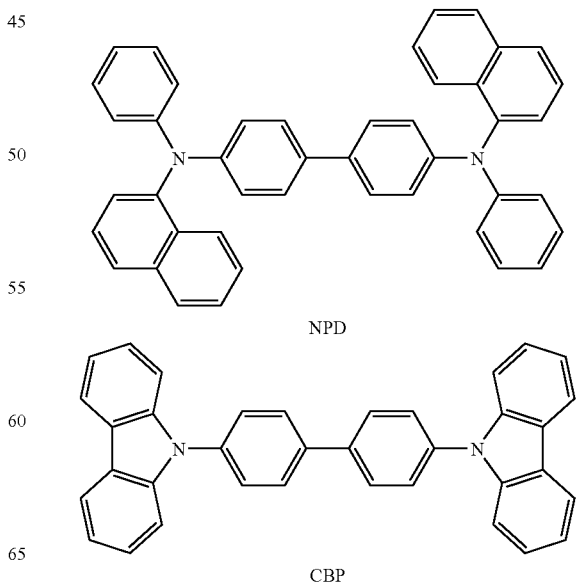

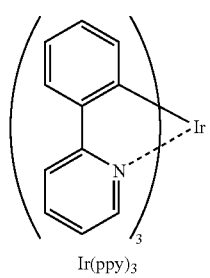

Ir(ppy)₃

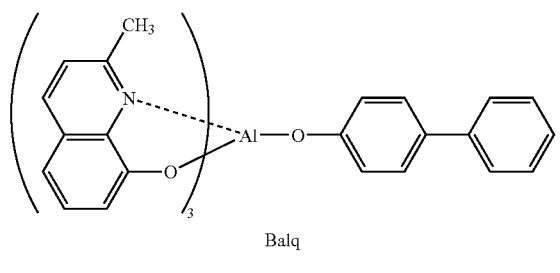

Balq

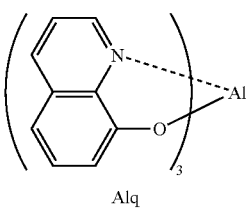

Alq

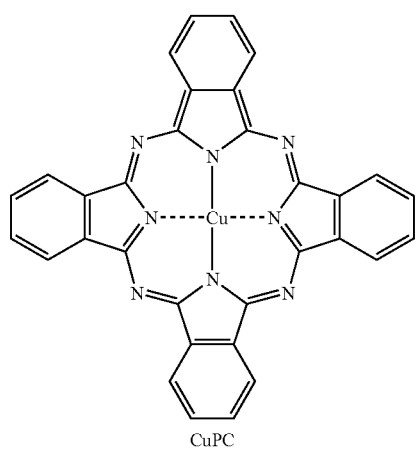

CuPC

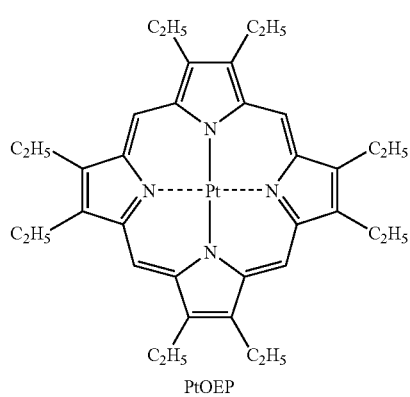

PtOEP

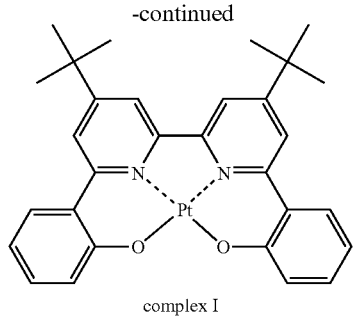

complex I

Example 1

An organic EL device of this invention 1 was prepared in the same manner as in the comparative example 1. except that the exemplified compound 4 was used in place of Ir(ppy)₃. When a direct current constant voltage was applied to the thus-obtained organic EL device. Bluish green emission having an emission maximum wavelength $\lambda_{max}$ of 484 nm was observed, and the external quantum efficiency of the EL device was 11.8%.

Example 2

An organic EL device of this invention 2 was prepared in the same manner as in the comparative example 1, except that the exemplified compound 5 was used in place of Ir(ppy)₃. When a direct current constant voltage was applied to the thus-obtained organic EL device, bluish green emission having an emission maximum wavelength $\lambda_{max}$ of 481 nm was observed, and the external quantum efficiency of the EL device was 8.7%.

Example 3

An organic EL device of this invention 3 was prepared in the same manner as in the comparative example 1, except that the exemplified compound 6 was used in place of Ir(ppy)₃. When a direct current constant voltage was applied to the thus-obtained organic EL device, bluish green emission having an emission maximum wavelength $\lambda_{max}$ of 482 nm was observed, and the external quantum efficiency of the EL device was 11.1%.

Example 4

An organic EL device of this invention 4 was prepared in the same manner as in the comparative example 1, except that the exemplified compound 7 was used in place of Ir(ppy)₃. When a direct current constant voltage was applied to the thus-obtained organic EL device, bluish green emission having an emission maximum wavelength $\lambda_{max}$ of 482 nm was observed, and the external quantum efficiency of the EL device was 10.5%.

Example 5

An organic EL device of this invention 5 was prepared in the same manner as in the comparative example 1, except that the exemplified compound 182 was used in place of Ir(ppy)₃. When a direct current constant voltage was applied to the thus-obtained organic EL device, bluish green emission having an emission maximum wavelength $\lambda_{max}$ of 476 nm was observed, and the external quantum efficiency of the EL device was 10.0%.

Example 6

An organic EL device of this invention 6 was prepared in the same manner as in the comparative example 1, except that the exemplified compound 213 was used in place of $Ir(ppy)_3$. When a direct current constant voltage was applied to the thus-obtained organic EL device, bluish green emission having an emission maximum wavelength $\lambda_{max}$ of 467 nm was observed, and the external quantum efficiency of the EL device was 11.0%.

Example 7

The devices prepared in Comparative example 1 and Examples 1 to 6 were continuously driven at an initial luminescence of 500 cd/m², to compare the luminance half time of the devices with each other. The results are shown in Table 1.

TABLE 1

| Light-emitting device | Luminance half time |
| --- | --- |
| Comparative example 1 | 85 hours |
| This invention 1 | 470 hours |
| This invention 2 | 510 hours |
| This invention 3 | 534 hours |
| This invention 4 | 463 hours |
| This invention 5 | 391 hours |
| This invention 6 | 580 hours |

It is apparent from the above results that an organic EL device having high luminous efficiency and highly durability can be obtained by using the compound defined in the present invention. Also, according to the present invention, it becomes possible to provide an organic EL device having an emission maximum wavelength of 490 nm or less.

INDUSTRIAL APPLICABILITY

The organic electroluminescent device of the present invention is preferable as an organic electroluminescent device excellent in emitting characteristics and durability.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2004-275915 filed in Japan on Sep. 22, 2004, Patent Application No. 2005-41939 filed in Japan on Feb. 18, 2005, and Patent Application No. 2005-162376 filed in Japan on Jun. 2, 2005, each of which is entirely herein incorporated by reference.

The invention claimed is:

1. An organic electroluminescent device having a pair of electrodes and at least one organic layer including a light-emitting layer interposed between the pair of electrodes, wherein the organic layer contains at least one compound represented by formula (VIII):

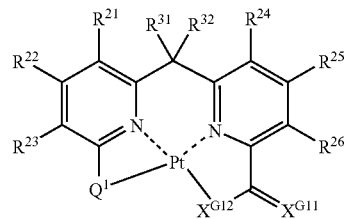

Formula (VIII)

wherein $R^{21}$, $R^{22}$, $R^{23}$, $R^{24}$, $R^{25}$, $R^{26}$, $R^{31}$, and $R^{32}$ each independently represent a hydrogen atom or a substituent; $X^{G11}$ represents an oxygen atom or a sulfur atom; $X^{G12}$ represents an oxygen atom or a sulfur atom; and $Q^1$ represents a group bonded with the platinum through a carbon atom, an oxygen atom, a sulfur atom, a nitrogen atom or a phosphorous atom.

2. An organic electroluminescent device having a pair of electrodes and at least one organic layer including a light-emitting layer interposed between the pair of electrodes, wherein the organic layer contains at least one compound represented by formula (II):

Formula (II)

wherein $Q^1$ represents an aromatic hydrocarbon group bonded with the platinum through a carbon atom or an aromatic heterocyclic group bonded with the platinum through a carbon atom; $Q^2$ represents an aromatic heterocyclic group bonded with the platinum through a carbon atom, an aryloxy group, or a carbonyloxy group; $Q^1$ and $Q^2$ each represent a structure different from each other; $R^{21}$, $R^{22}$, $R^{23}$, $R^{24}$, $R^{25}$ and $R^{26}$ each independently represent a hydrogen atom or a substituent; $L^1$ represents a linking group; and n represents 0 ($L^2$ is not present).

3. The organic electroluminescent device according to claim 2, wherein $Q^2$ represents an aryloxy group or a carbonyloxy group.

4. The organic electroluminescent device according to claim 3, wherein the aromatic heterocyclic group bonded with the platinum through a carbon atom, represented by $Q^1$, is pyridine, pyrazine, pyrimidine, pyridazine, triazine, triazole, imidazole, pyrazole, thiophene, or furan.

5. The organic electroluminescent device according to claim 2, wherein $L^1$ represents a linking group comprising a carbon atom, a nitrogen atom, an oxygen atom, a sulfur atom, or a silicon atom.

6. The organic electroluminescent device according to claim 2, wherein the compound represented by formula (II) is a compound represented by formula (III):

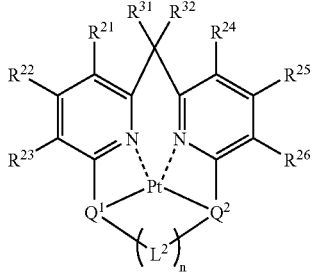

Formula (III)

wherein $Q^1$ represents an aromatic hydrocarbon group bonded with the platinum through a carbon atom or an aromatic heterocyclic group bonded with the platinum through a carbon atom; $Q^2$ represents an aromatic heterocyclic group bonded with the platinum through a carbon atom, an aryloxy group, or a carbonyloxy group; $Q^1$ and $Q^2$ each represent a structure different from each other; $R^{21}$, $R^{22}$, $R^{23}$, $R^{24}$, $R^{25}$, $R^{26}$, $R^{31}$ and $R^{32}$ each independently represent a hydrogen atom or a substituent; and n represents 0 ($L^2$ is not present).

7. The organic electroluminescent device according to claim 6, wherein $Q^2$ represents an aryloxy group or a carbonyloxy group.

8. The organic electroluminescent device according to claim 7, wherein the aromatic heterocyclic group bonded with the platinum through a carbon atom, represented by $Q^1$, is pyridine, pyrazine, pyrimidine, pyridazine, triazine, triazole, imidazole, pyrazole, thiophene, or furan.

9. An organic electroluminescent device having a pair of electrodes and at least one organic layer including a light-emitting layer interposed between the pair of electrodes, wherein the organic layer contains at least one compound represented by formula (IV):

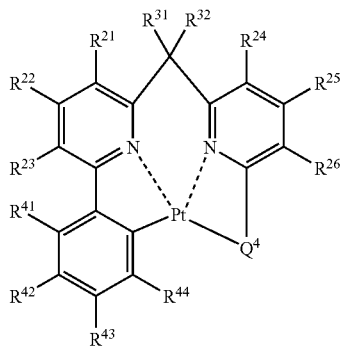

Formula (IV)

wherein $Q^4$ represents a group bonded with the platinum through a carbon atom, an oxygen atom, a sulfur atom, a nitrogen atom or a phosphorous atom, but does not represent a substituted or unsubstituted phenyl group; $R^{21}$, $R^{22}$, $R^{23}$, $R^{24}$, $R^{25}$, $R^{26}$, $R^{31}$, $R^{32}$, $R^{41}$, $R^{42}$, $R^{43}$ and $R^{44}$ each independently represent a hydrogen atom or a substituent; and $R^{44}$ may be linked with $Q^4$, if possible.

10. The organic electroluminescent device according to claim 2, wherein at least one of the compound represented by formula (II) is contained in the light-emitting layer.

11. The organic electroluminescent device according to claim 2, wherein at least one of the compound represented by formula (II) and at least one host material are contained in the light-emitting layer.

* * * * *